US007871713B2

(12) United States Patent
Kita et al.

(10) Patent No.: US 7,871,713 B2
(45) Date of Patent: Jan. 18, 2011

(54) ELECTROLUMINESCENT MATERIAL, ELECTROLUMINESCENT ELEMENT AND COLOR CONVERSION FILTER

(75) Inventors: Hiroshi Kita, Hachioji (JP); Yoshiyuki Suzuri, Hino (JP); Taketoshi Yamada, Saitama (JP); Kazuaki Nakamura, Kyoto (JP); Noriko Ueda, Hino (JP); Yasushi Okubo, Hino (JP)

(73) Assignee: Konica Corporation, Tokyo (JP)

( * ) Notice: Subject to any disclaimer, the term of this patent is extended or adjusted under 35 U.S.C. 154(b) by 970 days.

(21) Appl. No.: 11/493,108

(22) Filed: Jul. 26, 2006

(65) Prior Publication Data

US 2007/0020485 A1 Jan. 25, 2007

Related U.S. Application Data

(60) Continuation-in-part of application No. 10/653,842, filed on Sep. 2, 2003, now abandoned, which is a division of application No. 09/466,949, filed on Dec. 20, 1999, now Pat. No. 6,656,608.

(30) Foreign Application Priority Data

Dec. 25, 1998 (JP) ............................. 370452/1998
Aug. 31, 1999 (JP) ............................. 246404/1999

(51) Int. Cl.
H01L 51/54 (2006.01)
C09K 11/06 (2006.01)

(52) U.S. Cl. ....................... 428/690; 428/917; 313/503; 313/504; 313/506; 313/112; 252/301.16; 252/301.33

(58) Field of Classification Search .................. None
See application file for complete search history.

(56) References Cited

U.S. PATENT DOCUMENTS

| 5,128,587 | A | | 7/1992 | Skotheim et al. | |
|---|---|---|---|---|---|
| 5,597,925 | A | | 1/1997 | Ohta et al. | |
| 5,635,308 | A | | 6/1997 | Inoue et al. | |
| 5,645,948 | A | | 7/1997 | Shi et al. | |
| 5,656,401 | A | | 8/1997 | Ohta et al. | |
| 5,717,289 | A | | 2/1998 | Tanaka | |
| 6,048,631 | A | * | 4/2000 | Takahashi et al. | 428/690 |
| 6,057,048 | A | | 5/2000 | Hu et al. | |
| 6,132,641 | A | | 10/2000 | Rietz et al. | |
| 6,165,631 | A | | 12/2000 | Boerner et al. | |
| 6,352,791 | B1 | | 3/2002 | Fink et al. | |
| 6,376,106 | B1 | | 4/2002 | Uchida et al. | |
| 6,387,547 | B1 | | 5/2002 | Fujita et al. | |
| 6,406,804 | B1 | | 6/2002 | Higashi et al. | |
| 6,476,184 | B1 | | 11/2002 | Janietz et al. | |
| 6,656,608 | B1 | | 12/2003 | Kita et al. | |
| 6,660,408 | B1 | | 12/2003 | Toguchi et al. | |
| 2003/0068526 | A1 | * | 4/2003 | Kamatani et al. | 428/690 |
| 2003/0068536 | A1 | * | 4/2003 | Tsuboyama et al. | 428/704 |
| 2004/0058195 | A1 | | 3/2004 | Kita et al. | |
| 2004/0062951 | A1 | | 4/2004 | Kita et al. | |
| 2004/0072019 | A1 | | 4/2004 | Kita et al. | |
| 2004/0096696 | A1 | | 5/2004 | Kita et al. | |
| 2009/0072712 | A1 | * | 3/2009 | Stoessel et al. | 313/504 |

FOREIGN PATENT DOCUMENTS

| DE | 197 26 472 A1 | 12/1998 |
|---|---|---|
| EP | 0 648 737 A1 | 4/1995 |
| EP | 0 710 892 A1 | 5/1996 |
| EP | 0 936 844 A2 | 8/1999 |
| EP | 0 992 564 A1 | 4/2000 |
| JP | 04 363894 A | 12/1992 |
| JP | 08 050364 A | 2/1996 |
| JP | 08 183953 A | 7/1996 |
| JP | 08 286401 A | 11/1996 |
| JP | 9-188874 * | 7/1997 |
| JP | 10-25472 A | 1/1998 |
| WO | WO 97/20877 | 6/1997 |
| WO | WO 98/39807 | 9/1998 |
| WO | WO 99/57220 A1 | 11/1999 |
| WO | WO 00/14144 A | 3/2000 |
| WO | WO 2006/048268 A1 * | 5/2006 |

OTHER PUBLICATIONS

Machine-assisted translation of JP 9-188874 (Jul. 1997).*
Bettenhausen, J.; Greczmiel, M.; Jandke, M.; Strohriegl, P., Synthetic Metals, vol. 91, No. 1-3, Dec. 1997, pp. 223-228, XP002417443, Sections 1,3,4,6 *compound 20D*.
Jandke, M.; Strohriegl, P.; Berleb, S.; Werner, E.; Bruetting, W.: Macromolecules, vol. 31, No. 19, Sep. 22, 1998, pp. 6434-6443, XP002417444, Sections 3,4,6,8 *compounds 11C,D, 15D-F*.
Redecker, M.; Bradley, D.D.C.; Jandke, M.; Strohriegl, P.; Applied Physics Letters, vol. 75, No. 1, Jul. 5, 1999, p. 109-111, XP002417445 *the whole document*.
Adachi et al., "Electroluminescent Mechanism of Organic Multilayer Thin Film Devices", Optoelectronics-Devices and Technologies, (Jun. 1991), pp. 25-36, Mita Press, Tokyo, JP., vol. 6, No. 1, XP000245826.
Kido et al., "White-Light-Emitting Organic Electroluminescent Device Using Lanthanide Complexes", (Mar. 1996) Japanese Journal of Applied Physics, Publication Office Japanese Journal of Applied Physics, Tokyo JP, vol. 35, No. 3B, pp. L394-L396, XP002079654.

(Continued)

Primary Examiner—Marie R. Yamnitzky
(74) Attorney, Agent, or Firm—Holtz, Holtz, Goodman & Chick, P.C.

(57) ABSTRACT

An electroluminescent element is disclosed, comprising an electroluminescent material and a fluorescent substance emitting light having an emission maximum at the wavelength different from that of light emitted from the electroluminescent material upon absorption of the light emitted from the electroluminescent material. A color conversion filter is also disclosed, comprising a fluorescent substance emitting light having an emission maximum at the wavelengths of 400 to 700 nm upon absorption of the light emitted from the electroluminescent material.

13 Claims, 1 Drawing Sheet

OTHER PUBLICATIONS

Dirr et al., "Luminescence enhancement in microcavity organic multilayer structures", Synthetic Metals, Elsevier Sequoia, Lausanne, CH, vol. 91, No. 1/3, (1997), pp. 53-56, XP002079653.

Liu et al., "Europium complexes as emitters in organic electroluminescent devices", Synthetic Metals, Elsevier Sequoia, Lausanne, CH, vol. 91, No. 1/3 (1997), pp. 267-269, XP002079652.

Shuichi Oi et al., "Rhodium-catalysed direct ortho arylation of 2-arylpyridines with arylstannanes via C-H activation", Chem. Commun. vol. 22, pp. 2439-2440 (Nov. 1998).

Machine-assisted translation for JP 10 25472 A (Jan. 1998).

Francis H. Case,"The Synthesis of 2,2 and 5,5-Bi-(1,10-phenanthroline)", *Journal of Heterocyclic Chem.*, vol. 1, No. 2, p. 112, Apr. 1964.

* cited by examiner

ELECTROLUMINESCENT MATERIAL, ELECTROLUMINESCENT ELEMENT AND COLOR CONVERSION FILTER

This is a continuation in part of application Ser. No. 10/653,842 filed Sep. 2, 2003 now abandoned, which is a divisional of application Ser. No. 09/466,949 filed Dec. 20, 1999, now U.S. Pat. No. 6,656,608 issued Dec. 2, 2003.

FIELD OF THE INVENTION

This invention relates to an electro luminescent element, specifically relates to an electroluminescent element useful in a civil or industrial displaying device such as a light-emission type multi- or full-color display, or a displaying panel, and color image forming method and a color filter (color conversion filter).

BACKGROUND OF THE INVENTION

Electronic display device include a light-emission type and a light-receiving type. Examples of the light-emission type include a CRT (cathode ray tube), a PDP (plasma display), an ELD (electroluminescent display), a VFD (fluorescent display tube) and a LED (light-emitting diode).

Among them, the LED will be described below.

The LED is a light emission element comprising a light emission material emitting light in an electric field or combination of several number of such the element. The elements are classified into an organic element and an inorganic element according to the material and into a carrier injection type and an accelerated electron type according to the light emission mechanism. The recombination of an electron and a positive hole is utilized in the carrier injection type element and collision energy of an accelerated electron is utilized in the accelerated electron type element. Generally, the inorganic material is longer in the life time and more stable than the organic material. However, it is a shortcoming of the inorganic material that the choice of the material is narrow and there is a limitation on the molecular design thereof. The recombination type has advantage that the driving voltage is lower than that for the electron accelerate type. Recently, therefore, the carrier injection type LED is extensively developed.

The LED include the following three types.

(1) Inorganic LED comprising a inorganic compound such as GaN and GaInN: the light emission mechanism thereof is recombination type. It is simply called also as LED (light emission diode).

(2) Organic LED comprising an organic compound such as a triarylamine derivative and a stilbene derivative: the light emission mechanism thereof is recombination type. It is called as an organic EL (electroluminescent or OLED.

(3) Inorganic EL comprising an inorganic material such as ZnS:Mn and ZnS:Tb: the light emission mechanism is the accelerated electron type. It is called simply as an electroluminescent element since the element of such the type is historically old.

The "electroluminescent material" in the invention includes the above-mentioned (1) and (2). Therefore, (3) is not subject of the invention.

In the field of the carrier-injection type organic electroluminescent element which has been particularly noted in recent years, ones emitting high luminance light have been becoming to be obtained after a thin layer of organic compound has been used. For example, U.S. Pat. No. 3,530,325 discloses one using a single crystal of anthracene as the light-emission substance, Japanese Patent Publication Open for Public Inspection (JP O.P.I.) No. 59-194393 discloses one having a combination of a positive hole injection layer and an organic light emission layer, JP O.P.I. No. 63-295695 discloses one having a combination of a positive hole injection layer and an organic electron injection layer, and Jpn. Journal of Applied Physics, Vol. 127, No. 2, p.p. 269-271, discloses one having a combination of a positive hole transportation layer and an electron transportation layer. The luminance of emission light is improved by such the means.

Besides, a fluorescent substance has been known, which emits fluorescent light by absorbing light emitted from the electroluminescent material. The method using such the fluorescent substance to emit various colors light by means of an electroluminescent material is applied for the CRT, PDP, VFD, etc. However, in such the case, there is a problem that light emitted from the electroluminescent material must be a high energy ray (i.e., short wavelength emission) such as an electron ray or a far ultraviolet ray. The fluorescent substances described above are essentially inorganic fluorescent substances. There are known a number of the inorganic fluorescent substances which are superior in stability, exhibiting long shelf-life. However, there has not been found a long wavelength excitation type inorganic fluorescent substance exhibiting an excitation wavelength in the region of near ultraviolet to visible light, specifically, red light.

A near ultraviolet ray capable of being emitted from the electroluminescent material is contemplated to be a light having a peak of wavelength within the range of from approximately 350 nm to 400 nm, and the use of an organic fluorescent dye as the fluorescent substance capable of excited such the near ultraviolet ray is disclosed in JP O.P.I. Nos. 3-152897, 9-245511 and 5-258860.

However, it is known that the organic fluorescent dye is generally tends to be influenced by the circumstance condition, for example, change in the wavelength or quenching tends to be occurred depending on the kind of solvent or medium such as a resin.

In the methods disclosed in the foregoing publications, a fluorescent dye which absorbs light of blue or blue-green light region emitted from the electroluminescent material and converts the light to red light. A fluorescent conversion layer which emits light in green region has characteristics that the Stokes shift (the difference between the wavelength of the absorbed light and that of the emitted light) is small, and a part of light emitted from the electroluminescent material can be permeated therethrough, and the light from the light emission material can be converted with a relative high efficiency. However, the conversion to the fluorescent to light of red region caused problems that the conversion efficiency is considerably low since a large Stokes shift is needed and the light from the light emitting material almost cannot be utilized. Exemplarily, the combined use of a few fluorescent dyes different in excitation wavelength is needed and it is necessary to utilize light-to-light conversion (i.e., photoluminescence) of plural fluorescent dyes, such as a fluorescent dye emitting yellow light in response to blue light and a fluorescent dye emitting red light in response to yellow light.

Accordingly, there is a problem that the visual perceivability and the luminance of color displaying by such the element are lowered since the luminance balance between blue, green and red light emission is unsuitable and the above-mentioned quenching and decoloration are occurred.

The inventors can obtain an electroluminescent element capable of emitting a high luminance light and having a high storage ability, and can provide a color filter with a high luminance by the use of such the electroluminescent element.

SUMMARY OF THE INVENTION

The above-mentioned object of the invention can be attained by the following constitution:

(1) An electroluminescent material represented by the following Formula N1:

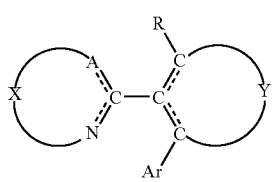

Formula N1 wherein Ar is an aryl group; A is a carbon atom, a nitrogen atom, a sulfur atom or an oxygen atom; X is a group of atoms necessary to form a 5- or 6-member nitrogen containing aromatic heterocyclic ring together with A and N; Y is a group of atoms necessary to form a 5- or 6-member aromatic hydrocarbon or aromatic heterocyclic ring; the bond of C—N, C-A or C—C in the formula is a single or double bond; and R is a hydrogen atom, a substituent or Ar; provided that the nitrogen-containing aromatic heterocyclic ring represented by

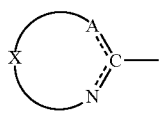

and the aromatic hydrocarbon ring or the aromatic heterocyclic ring represented by

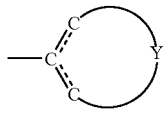

each may be condensed with a hydrocarbon ring or a heterocyclic ring.

(2) An electroluminescent material represented by the following Formula A1:

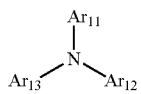

Formula A1 wherein $Ar_{11}$, $Ar_{12}$ and $Ar_{13}$ are each an aryl group or an aromatic heterocyclic group, and a biaryl group having a bond capable of giving at least two internal rotational isomerism is in the molecule of the compound represented by Formula A1.

(3) An electroluminescent material represented by the following Formula A2:

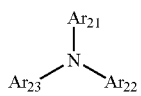

Formula A2 wherein $Ar_{21}$, $Ar_{22}$ and $Ar_{23}$ are each an aryl group or an aromatic heterocyclic group, each of which has a bond exhibiting $C_2$ rotation symmetry and capable of giving an internal rotational isomerism.

(4) An electroluminescent material represented by the following Formula A3:

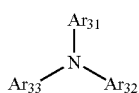

Formula A3 wherein $Ar_{31}$, $Ar_{32}$ and $Ar_{33}$ are each an aryl group or an aromatic heterocyclic group, provided that at least two of $Ar_{31}$, $Ar_{32}$ and $Ar_{33}$ are each an aryl group having a 1,1'-binaphthyl moiety.

(5) An electroluminescent material represented by the following Formula B1,

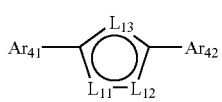

Formula B1 wherein $Ar_{41}$ and $Ar_{42}$ are each independently an aryl group or an aromatic heterocyclic group; $L_{11}$, $L_{12}$ and $L_{13}$ is each a group of atoms necessary to form an aromatic heterocyclic ring, provided that at least one of $L_{11}$, $L_{12}$ and $L_{13}$ is =N—, —N($R_{41}$)—, —S— or —O—; $R_{41}$ is a hydrogen atom or a substituent, provided that at least one of $Ar_{41}$, $Ar_{42}$ and $R_{41}$ is a biaryl group having a bonding axis capable of giving an internal rotational isomerism or a group having such a biaryl group, and the adjacent substituents may be condensed with each other to form a saturated or unsaturated ring.

(6) An electroluminescent material represented by the following Formula C1,

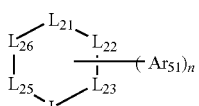

Formula C1 wherein $Ar_{51}$ is an aryl group or an aromatic heterocyclic group; n is an integer of from 0 to 6, the plural groups represented by $Ar_{51}$ may be the same or different when n is 2 or more; $L_{21}$, $L_{22}$, $L_{23}$, $L_{24}$, $L_{25}$ and $L_{26}$ are a group of atoms necessary to form a 6-member nitrogen-containing aromatic heterocyclic group, provided that at least one of $L_{21}$, $L_{22}$, $L_{23}$, $L_{24}$, $L_{25}$ and $L_{26}$ is =N—, or —N($R_{51}$)—; $R_{51}$ is a hydrogen atom or a substituent, provided that at least one of $Ar_{51}$ and $R_{51}$ is a biaryl group having a bonding axis capable of giving a internal rotation isomerism or a group having such a biaryl group, and the adjacent substituents may be condensed with each other to form a saturated or unsaturated ring.

(7) An electroluminescent material represented by the following Formula D1,

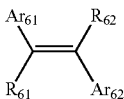

Formula D1 wherein $Ar_{61}$ and $Ar_{62}$ are each an aryl group or an aromatic heterocyclic group; $R_{61}$ and $R_{62}$ are each a hydrogen atom or a substituent, provided that at least one of $Ar_{61}$, $Ar_{62}$, $R_{61}$ and $R_{62}$ is a biaryl group having a bonding axis capable of giving a internal rotational isomerism or a group having such a biaryl group, and the adjacent substituents may be condensed with each other to form a saturated or unsaturated ring.

(8) An electroluminescent material represented by the following Formula E1,

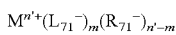

Formula E1 wherein M is a metal atom capable of taking an ionized state of from 1- to 4-valent (i.e., giving 1- to 4-valent ions); n' is a natural number of from 1 to 4; $L_{71}^-$ is a monovalent anion capable of forming an ionic bonding with M and having a portion capable of coordinating with M; m is a natural number of the same as n' or less; $R_{71}^-$ is a monovalent anion capable of forming an ionic bond with M, provided that at least one of $L_{71}^-$ and $R_{71}^-$ is a group having a moiety of biaryl group having a bonding axis capable of giving an internal rotational isomerism.

(9) An electroluminescent material represented by the following Formula F1 or F2,

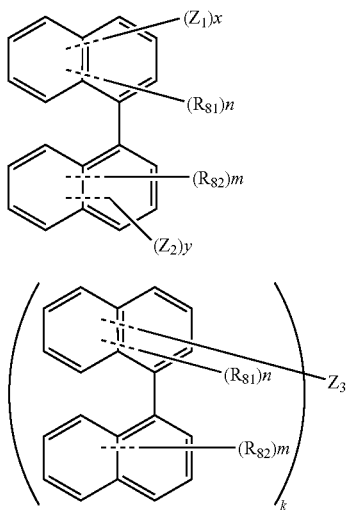

Formula F1

Formula F2 wherein $Z_1$ and $Z_2$ are each independently a monovalent residue of a light emitting compound; $Z_3$ is a k-valent residue of a light emitting compound; k is a natural number of from 1 to 8, x is a natural number of from 1 to 3; y is an integer of from 0 to 3, provided that plural groups represented by $Z_1$ may be the same or different when x is 2 or more, plural groups represented by $Z_2$ may be the same or different when y is 2 or more, and groups represented by $Z_1$ and $Z_2$ may be the same or different when both of x and y are each 1 or more; $R_{81}$ and $R_{82}$ are each independently a substituent, n is an integer of from 0 to 4, m is an integer of from 0 to 4, provided that plural groups represented by $R_{81}$ may be the same or different and may be condensed with each other to form a ring when n is 2 or more, plural groups represented by $R_{82}$ may be the same or different and may be condensed with each other to form a ring when m is 2 or more, and $R_{81}$ and $R_{82}$ may be the same or different when both of n and m are 1 or more. The substituent of each of $Z_1$, $Z_2$, $R_{81}$ and $R_{82}$ may form a condensed ring with the naphthalene ring.

(10) An electroluminescent material which is prepared using a 4-halo-1,1'-binaphthyl derivative represented by Formula G1 as raw material and has a monovalent biaryl group represented by Formula G2 in the molecule of the material:

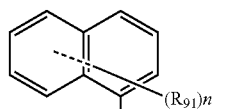

Formula G1

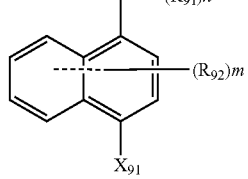

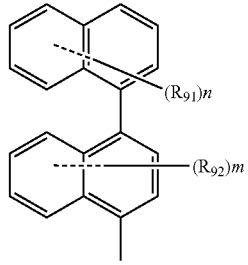

Formula G2 wherein $X_{91}$ is a halogen atom; $R_{91}$ and $R_{92}$ are each a substituent; n is an integer of 0 to 4; and m is an integer of 0 to 4, provided that when n is 2 or more, plural $R_{91}$s may be the same or different, or condensed with each other, when m is 2 or more, plural $R_{92}$s may be the same or different, or condensed with each other, and when n and m are both 1 or more, $R_{91}$ and $R_{92}$ may be the same or different.

(11) An electroluminescent element comprising an electroluminescent material and an inorganic fluorescent substance which absorbs light emitted from the electroluminescent material and fluoresces at the maximum emission wavelength different from that of light emitted from the electroluminescent material.

(12) The electroluminescent element described in (11), wherein the inorganic fluorescent substance is an inorganic fluorescent substance prepared by a Sol-Gel method.

(13) The electroluminescent element described in (11) or (12), in which the inorganic fluorescent substance emits light having the maximum emission wavelength of from 400 nm to 700 nm.

(14) The electroluminescent element described in any one of from (11) to (13), wherein at least one of the inorganic fluorescent substance emits light having the maximum fluorescence wavelength of from 600 nm to 700 nm.

(15) An electroluminescent element which comprises an electroluminescent material and a rare earth metal complex fluorescent substance which absorbs light emitted from the electroluminescent material and fluoresces at the maximum wavelength different from that of the light emitted from the electroluminescent material.

(16) The electroluminescent element described in (15), wherein the maximum emission wavelength of light emitted from the rare-earth metal complex fluorescent substance is within the range of from 400 nm to 700 nm.

(17) The electroluminescent element described in (15) or (16), wherein the maximum emission wavelength of light emitted from the rare-earth metal complex fluorescent substance is within the range of from 600 nm to 700 nm.

(18) The electroluminescent element described in any one of (11) to (17), wherein the maximum emission wavelength of light emitted from the electroluminescent material is not more than 430 nm.

(19) The electroluminescent element described in (18), wherein the maximum emission wavelength of light emitted from the electroluminescent material is within the range of from 400 nm to 430 nm.

(20) The electroluminescent element described in any one of (11) to (19), wherein the electroluminescent material is an organic LED material.

(21) The electroluminescent element described in any one of (11) to (19) wherein the electroluminescent material is an inorganic LED material.

(22) The electroluminescent element described in any one of (11) to (21), wherein the electroluminescent material is a compound selected from the group consisting of compounds represented by Formula N1, A1, A2, A3, B1, C1, D1, E1, F1 or F2, as described in (1) to (9) or a compound as described in (10).

(23) An electroluminescent element comprising a substrate, provided thereon, a layer containing at least an electroluminescent material and a color conversion layer, wherein the color conversion layer contains an inorganic fluorescent substance which absorbs light emitted from the electroluminescent material and emits light having the maximum emission wavelength of from 400 nm to 500 nm, an inorganic fluorescent substance emits light having the maximum emission wavelength of from 501 nm to 600 nm, and an inorganic fluorescent substance emits light having the maximum emission wavelength of from 601 nm to 700 nm.

(24) An electroluminescent element comprising a substrate, provided thereon, a layer containing an electroluminescent material and a color conversion layer, wherein the color conversion layer contains a rare earth metal complex fluorescent substance which absorbs light emitted from the electroluminescent material and emits light having the maximum emission wavelength of from 400 nm to 500 nm, a rare earth metal complex fluorescent substance emits light having the maximum emission wavelength of from 501 nm to 600 nm, and a rare earth metal complex fluorescent substance emits light having the maximum emission wavelength of from 601 nm to 700 nm.

(25) A color conversion filter which contains at least an inorganic fluorescent substance which absorbs light emitted from an electroluminescent material and emits light having the maximum emission wavelength of from 400 nm to 700 nm.

(26) A color conversion filter which contains an inorganic fluorescent substance which absorbs light emitted from an electroluminescent material and emits light having the maximum emission wavelength of from 400 nm to 500 nm, an inorganic fluorescent substance emitting light having the maximum emission wavelength of from 501 nm to 600 nm, and an inorganic fluorescent substance emitting light having the maximum emission wavelength of from 601 nm to 700 nm.

(27) The color conversion filter described in (24) or (25) wherein at least one of the inorganic fluorescent substance is one prepared by a Sol-Gel method.

(28) A color conversion filter which contains at least an rare earth metal complex fluorescent substance which absorbs light emitted from an electroluminescent material and emits light having the maximum emission wavelength of from 400 nm to 700 nm.

(29) A color conversion filter which contains a rare earth metal complex fluorescent substance which absorbs light emitted from an electroluminescent material and emits light having the maximum emission wavelength of from 400 nm to 500 nm, a rare earth metal complex fluorescent substance emitting light having the maximum emission wavelength of from 501 nm to 600 nm, and a rare earth metal complex fluorescent substance emitting light having the maximum emission wavelength of from 601 nm to 700 nm.

(30) A color conversion method, comprising conversion of a light in a wavelength region shorter than a red light to the red light using an inorganic fluorescent substance which has been prepared by a sol-gel method.

(31) A color conversion method, comprising conversion of a light in a wavelength region shorter than a red light to the red light using a rare earth metal fluorescent substance.

(32) The color conversion method described in (31), wherein the rare earth metal complex has the maximum absorption wavelength of not less than 340 nm.

(33) A rare earth metal complex fluorescent substance containing at least an anionic ligand represented by the following formula R2:

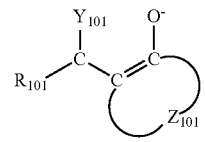

Formula R2 wherein $R_{101}$ is a hydrogen atom or a substituent; $Y_{101}$ is an oxygen atom, a sulfur atom or —N($R_{102}$), in which $R_{102}$ is a hydrogen atom or a substituent; $Z_{101}$ is a group of atoms necessary to form a 4- to 8-membered ring together with a carbon-carbon double bond.

DETAILED DESCRIPTION OF THE INVENTION

Figure 1:
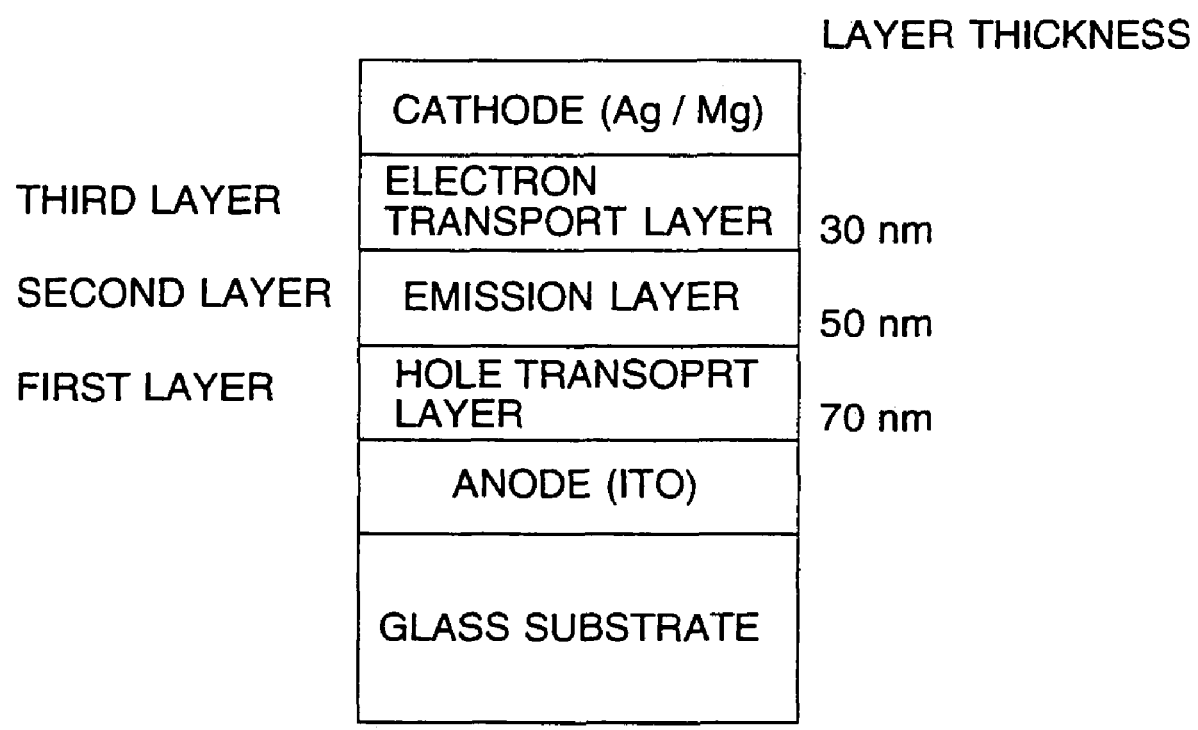
FIG. 1 illustrates a cross sectional view of the structure of an electroluminescent element.

In the invention, the electroluminescent material is a material which emits light by applying an electric field. In concrete, it is a material which emits light when a positive hole injected from a anode and an electron injected from a cathode are recombined, and is different from a material emitting light by collision energy of an accelerated electron (so-called inorganic electroluminescence). Thus, the electroluminescent material relating to the invention includes materials of the (1) and (2) afore-mentioned and does not include those of the afore-mentioned (3)

The light emission by the electric field is a light emission of an electroluminescent material when an electric current is applied to the electroluminescent material contained in a light emission layer through a pair of electrodes arranged on both sides of a light emission layer light emission layer so as to be faced to each other through the light emission layer. It is considered that such the light-emission is occurred by the following mechanism; the energy level of the electroluminescent material is excited by recombination of an electron injected from one of the electrodes and a positive hole injected from the other electrode in the light-emission layer, and the energy is emitted in a form of light when the energy level of the excited electroluminescent material is restored to the fundamental state.

Materials capable of emitting light by an electric field are usable in the invention without any limitation, for example, both of an inorganic electroluminescent material or inorganic LED such as gallium nitride GaN and an organic electroluminescent material or organic LED may be used. The organic LED is preferred from the view point of the light emission efficiency.

In the invention, the electroluminescent material is preferably one which emits light having the maximum emission wavelength of 340 nm or less, more preferably from 400 nm to 430 nm, by the electric field.

Specifically, in the CIE chromaticity coordinates are preferred the region corresponding to Purplish Blue, Bluish Purple and Purple, as shown in Fig. 4.16 "Relationship of Color Name of Color stimulus (color of light) and Chromaticity Coordinates" of "Shikisaikagaku Handbook" (Handbook of Color Science), Fourth edition (edited by Nihon Shikisai Gakkai), page 105.

The electroluminescent material preferably usable in the invention is described in concrete below.

The electroluminescent material preferably usable in the invention includes compounds represented by the foregoing Formula N1, A1, B1, C1, D1, E1, F1 or F2.

In Formulas N1, A1, B1, C1 and D1, the aryl group represented by Ar, $Ar_{11}$, $Ar_{12}$, $Ar_{13}$, $Ar_{41}$, $Ar_{42}$, $Ar_{51}$, $Ar_{61}$ or $Ar_{62}$ may be any one without any limitation as long as the number of π-electron thereof is 4n+2 in which n is a natural number, and it may be a single ring or condensed ring. The aryl group may be substituted with a substituent such as an alkyl group, a cycloalkyl group, an alkenyl group, an alkynyl group, an aryl group, a heterocyclic group, an amino group, a halogen atom, a hydroxyl group, a mercapto group, a carboxyl group, an acylamino group, a sulfonamido group, a phopsphonamido group, a carbamoyl group, an ester group, an alkoxyl group, an aryloxyl group, a nitro group, a cyano group and a silyl group. When plural substituents are substituted at adjacent positions of the aryl group, the substituents may be condensed with each other to form a carbon hydride ring or a heterocyclic ring, a moiety having a spiro structure may be further contained.

In Formulas N1, A1, B1, C1 and D1, the aromatic heterocyclic group represented by Ar, $Ar_{11}$, $Ar_{12}$, $Ar_{13}$, $Ar_{41}$, $Ar_{42}$, $Ar_{51}$, $Ar_{61}$ or $Ar_{62}$ is a residue formed by removing one hydrogen atoms from an optional position of a single or condensed ring heterocyclic compound having a number of π-electron of 4n+2 in which n is a natural number. Examples of such the heterocyclic compound include furan, thiophene, pyrrol, imidazole, pyrazole, 1,2,4-triazole, 1,2,3-triazole, oxazole, thiazole, isooxazole, isothiazole, furazane, pyridine, pyrazine, pyrimidine, pyridazine and 1,3,5-triazine, these heterocyclic ring each may further form a condensed ring.

In Formulas B1, C1, D1, E1, F1 and F2, the substituent represented by $R_{41}$, $R_{51}$, $R_{61}$, $R_{71}$, $R_{81}$, $R_{82}$, $R_{91}$, $R_{92}$, $R_{101}$ and $R_{102}$ may be a group capable of substituting without any limitation. Typical examples of the substituent include an alkyl group, a cycloalkyl group, an alkenyl group, an alkynyl group, a heterocyclic group, an amino group, a halogen atom, a hydroxyl group, a mercapto group, a carboxyl group, an acylamino group, a sulfonamido group, a phosphonamido group, a carbamoyl group, an ester group, an alkoxyl group, an aryloxyl group, a nitro group, a cyano group and a silyl group.

When plural substituents are substituted at adjacent positions of the aryl group, the substituents may be condensed with each other to form a carbon hydride ring or a heterocyclic ring, a moiety having a spiro structure may be further contained.

In Formula N1, the nitrogen-containing heterocyclic group represented by

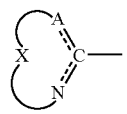

is preferably a 5- or 6-member 6π-type aromatic heterocyclic ring such as a 2-pyridyl group, a 2-pyrimidyl group, a 6-pyrimidyl group, a 2-pyradyl group, a 3-pyridazyl group, a 2-oxazolyl group, a 2-thiazolyl group, a 3-isooxazolyl group, a 3-isothiazolyl group, a 3-furazanyl group, a 3-pyrazolyl group, a 2-imidazolyl group, a 4-imidazolyl group, a 2-pyrrolo group, a 2-oxadiazolyl group, a 2-thiadiazolyl group, a 2-(1,2,4-triazyl) group, a 2-(1,3,5-triazyl) group and a 3-(1, 2,4-triazyl) group. The nitrogen-containing heterocyclic group may be substituted with a substituent such as those described regarding $R_{41}$. The nitrogen-containing heterocyclic group may form a condensed ring, such as a 6-(1H-pyrazolo[5,1-c][1,2,4]triazolyl) group which is formed by condensing 2-quinolyl or 3-pyrazolyl ring, which are the condensing product of a 2-pyridyl group and a carbon hydride ring, with a heterocyclic ring.

In Formula N1, the aromatic hydrocarbon ring represented by

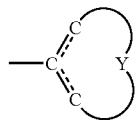

is a group formed by removing one hydrogen atom from an optional position of a 4n–2π type aromatic carbon hydride compound. Concrete examples of the aromatic carbon hydride group include a phenyl group, a 1-naphthyl phenyl group, a 2-naphthyl phenyl group, a 9-antholyl group, a 1-antholyl group, a 9-phenantholyl group, a 2-triphenylenyl group and a 3-peryrenyl group. The carbon hydride group may be substituted with a substituent such as those described regarding $R_{41}$. The carbon hydride group may form a condensed ring such as a 9-pyrenyl group and a 8-quinolyl group each formed by condensation of the carbon hydride ring with 9-phenantholyl group and condensation of a phenyl group with a heterocyclic group, respectively.

In Formula N1, the aromatic heterocyclic group represented by

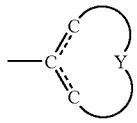

may be a aromatic heterocyclic group without any limitation as long as the group is a 4n+2π type group and the atoms adjacent to the carbon atoms bonded with the nitrogen-containing aromatic heterocyclic group are carbon atoms. Exemplary examples of the aromatic heterocyclic group include a 3-pyridyl group, a 5-pyrimidyl group, a, 4-pyridazyl group, a 5-pyridazyl group, a 4-isooxazolyl group, a 4-isothiazolyl group, a 4-pyrazolyl group, a 3-pyrrolo group, a 3-furyl group and a 3-ethinyl group. The aromatic heterocyclic group may be substituted with a substituent such as those described regarding $R_{41}$, and may form a condensed ring.

In Formulas A1, B1, C1, D1, E1, F1 and F2, "a bonding axis capable of giving the internal rotation isomerism" is a bonding axis which cannot freely rotate for 360° by the steric hindrance under an ordinary temperature and pressure, such as the axis bonding the naphthalene nuclei in the following 1,1'-binaphthyl. Practically, a bonding axis cannot be rotated in a CPK-model is the "bonding axis capable of giving the internal rotation isomerism".

There is an isomer in the compound having the bonding axis capable of giving the internal rotation isomerism. Such the isomer is termed an atrop isomer or an internal rotation optical isomer, c.f. Kagaku Daijiten vol. 6, p. 588. In another word, the compound or substituent having the axis capable of giving the internal rotation isomerism can be defined as a compound or substituent having an atrop isomer or internal rotation optical isomer.

The inventors found that when a biaryl group having a bond giving an internal rotation isomerism (i.e., atropisomerism) is introduced into an usual light emission material (or a material having a bi-aryl moiety is synthesized), shifting the wavelength of emitted light to longer wavelength side caused by introduction of a freely rotatable biaryl group, for example, a biphenyl group or a simple phenyl group, is not observed. The shift of the wavelength of emitted light to shorter wavelength side occurs in some molecules. It was also found that aging stability was excellent, due to steric hindrance effects of the bi-aryl group having a bond giving internal rotation isomerism.

Furthermore it was found that in almost all cases where the compound had two or more biaryl groups having a bond giving an internal rotation isomerism, crystallization in the layer of element was considerably inhibited and the compound was usable as a suitable organic electroluminescence material. The reason thereof is believed to be that at least two diastereomers can exist when the compound has two or more bi-aryl groups each having a bond giving an internal rotation isomerism, and crystallization of the individual isomers are inhibited since the isomers are close to each other in characteristics, resulting in hindrance of recrystallization of the molecules.

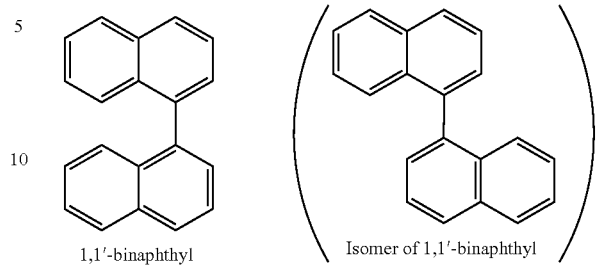

1,1'-binaphthyl    Isomer of 1,1'-binaphthyl

Although an example of the basic skeleton structure of the substituent having a biaryl group which has the axis capable of giving the internal rotation isomerism is shown in the followings, the invention is not limited to this example. The substituent is formed by removing one hydrogen atom from the compound shown below, The basic skeleton structure may be substituted with a substituent those described regarding $R_{41}$, and may form a condensed ring.

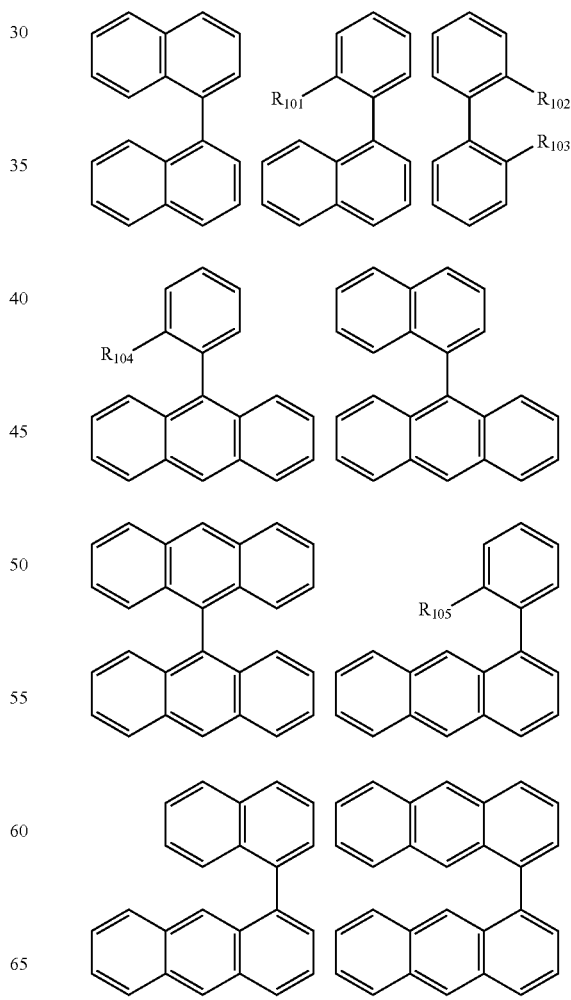

-continued

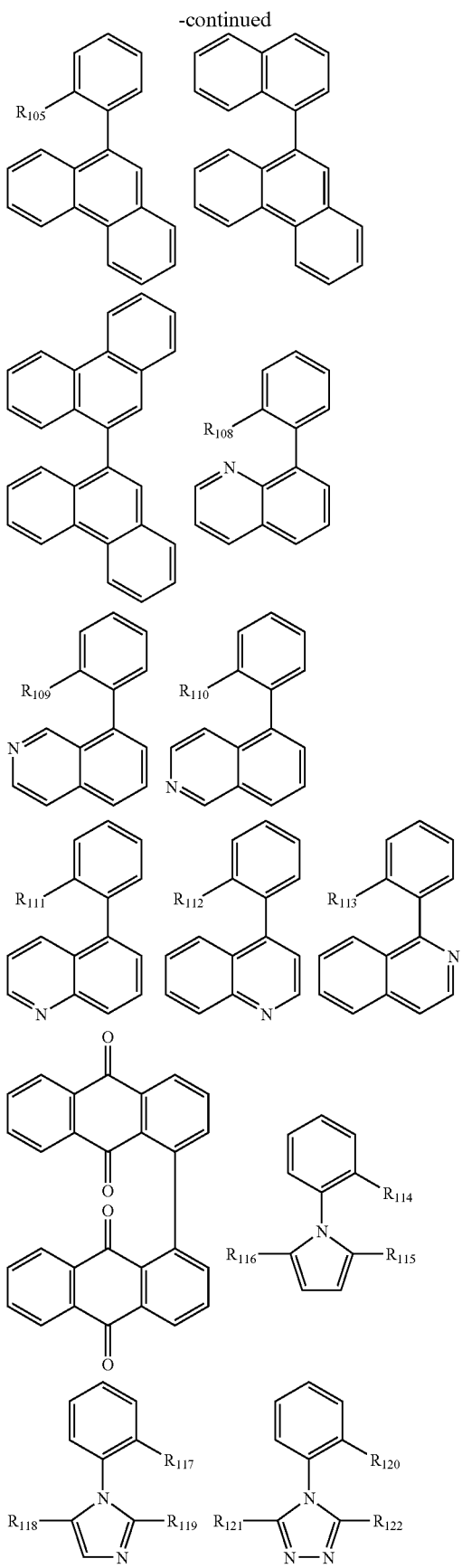
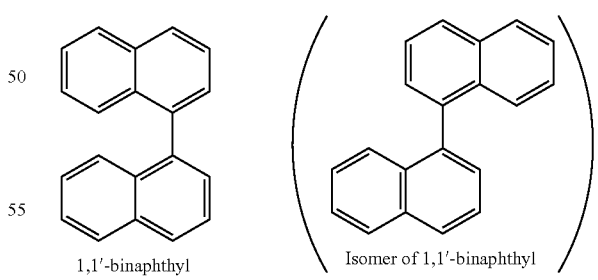

In the formulas, substituents represented by $R_{101}$ to $R_{137}$ are those which have a Taft's stereo-parameter of not more than −1.00, including a bromone atom, iodine atom, straight-chained alkyl group such as methyl, ethyl, or propyl, a branched alkyl group such as isopropyl or t-butyl, cyclic alkyl such as cyclopentyl or cyclobutyl, an aromatic hydrocarbon group such as phenyl or naphthyl, heterocyclic group such as pydidyl, imidazolyl or furyl, nitro and mercapto group. The Taft's stereo-parameter is referred to S. H. Unger, Phys. Org. Chem. 12, 91 (1976) and "Yakubutsu no Kozokassei-sokan" (Kagaku no Ryoiki Zokan No. 122, published by Nankodo), pages 124-126.

In Formula A3, the aryl group having a 1,1'-binaphthyl moiety, which is represented by $Ar_{21}$, $Ar_{22}$ or $Ar_{23}$ is:

(1) a binaphthyl group, i.e., one in which hydrogen is removed from an arbitrary position of the 11'-binaphthyl,
(2) a substituted-1,1'-binaphthyl group, in which one hydrogen atom is removed and substituent(s) are substituted for arbitrary m hydrogen atoms are removed, and
(3) an aryl group substituted by the above described 1,1'-binaphthyl group.

Examples thereof include:

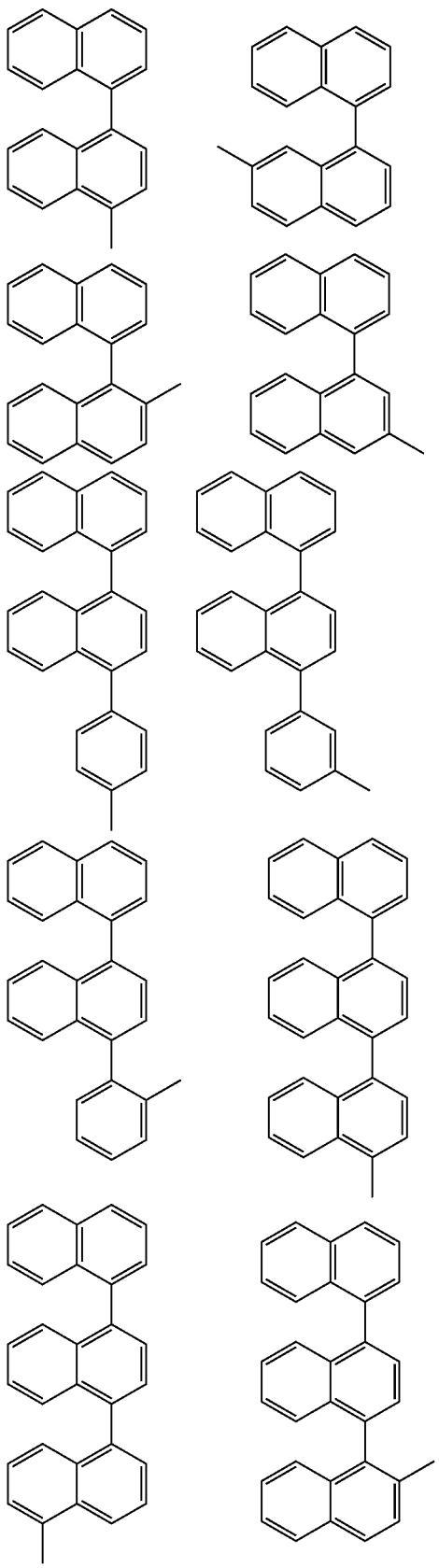

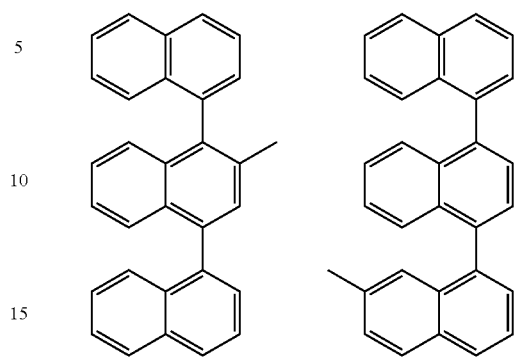

In Formula E1, the metal element represented by M may be ones capable of taking an ion structure of from 1- to 4-valent without any limitation. The metal element is preferably Be, Mg, Ca, Sr, Ba, Zn, Cd, Hg, Pd, Cu, B, Al, Ga, In, Tl, Si and Ga, more preferably Be, Mg, Ca, Sr, Ba, Zn, Cu, B, Al, Ga and In, and most preferably Be, Al, Zn and Ga.

In Formula E1, the monovalent anion represented by $L_{71}^-$, which forms an ion bonding with M and has a portion capable of coordinating with M, is one capable of taking a state under an acidic condition in which a proton is added to an oxygen atom, a sulfur atom or a nitrogen atom, in another word, one capable of taking a state formed by removing a proton from a compound having a dissociable group such as —OH, —NH or —SH, and the anion also has an atom capable of coordinating with a metal such as a nitrogen atom and a chalcogen atom (O, S, Se, Te) at a position away 2 or 3 atoms from the oxygen atom, the sulfur atom or the nitrogen atom. Examples of such the anion include an oxygen anion formed by removing a proton from the hydroxyl group of 8-hydroxyquinoline and a nitrogen anion formed by removing a proton from the NH at position-1 of 1H-2-(1-pyrazolyl)-imidazole.

In Formula E1, the monovalent anion capable of forming an ionic bond with M represented by $R_{71}^-$ may be one capable of forming an anion under a basic condition of pH of 8 or less, such as an anion formed by removing a proton from 4-hydroxy-1,1'-biphenyl, 2-mercaptonaphthalene or 1H-pyrazolo[5,1-c][1,2,4]triazole.

In Formula F1, the monovalent light emitting compound residue represented by $Z_1$ or $Z_2$ is one formed by removing a hydrogen atom or a substituent from an optional portion of a compound which emits light at an ordinary temperature. In Formula F2, the k-valent light emitting compound residue represented by $Z_3$ is one formed by removing k atoms of hydrogen or k substituents from an optional portion of a compound which emits light at an ordinary temperature. The light emission of the light emitting compound under an ordinary temperature may be fluorescence or phosphorescence.

The light emitting compound capable of forming the light-emitting compound residue includes a fluorescent dye having a absorption band in the visible region such as a laser dye, a fluorescent compound having a absorption band in the ultraviolet region such as a fluorescent whitening agent, and a phosphorescent substance such as a platinum complex of porphyrin and biacetyl. In concrete, the organic fluorescent substances described in Kunio Yagi, Zenichi Yoshida, Riichi Oota, "Keikou-Riron•Sokutei•Ouyou" (Fluorescence-Theory•Determination•Application-), p.p. 99-122, Nankodo, the fluorescent whitening agent described in ibid., p.p. 251-

270, and the fluorescent dyes described in ibid., p.p. 274-287. The followings are particularly preferable; a condensed aromatic carbon hydride cyclic compound such as triphenylene and perylene, a linear conjugate multi-ring carbon hydride compound such as p-terphenyl and quaterphenyl, a condensed aromatic heterocyclic compound such as acrydine, quinoline, carbazole, carbazone, fluorene, xanthione, aroxazine, acrydone, furabone, coumarin, naphthoimidazole, benzoxazole and dibenzophenazine, an aromatic heterocyclic compound such as thiazole, oxazole, oxadiazole, thiadiazole and triazole, a conjugate aliphatic compound such as aminochloromaleic amide, methylaminocitraconic methylimide, decapentaene carboxylic acid and decapentaene dicarboxylic acid, A fluorescent dye such as Acrydine Orange NO, Methylene Blue, Fluorescein, Eosine, Rhodamine and Benzoflabine, a light sensitive dye compound such as oxacarbocyanine, carbocyanine, thiacarbocyanine and 2-(anilinopolyethynyl)-benzothiazole, a natural dye compound such as porphiline, chlorophile and liboflabine, and a fluorescent whitening agent such as diaminostilbene type, distyrylbenzene type, benzidine type, diaminocarbazole type, triazole type, imidazole type, oxazole type, imidazolone type, dihydropyridine type, coumarine type, carbostyryl type, diaminodibenzothiophene oxide type, diaminofluorene type, oxacyanine type, aminonaphthalimide type, pyrazoline type and oxazole type. These compounds each may have a substituent and may form a condensed ring.

Although concrete examples of electroluminescent material of the invention are shown below, the electroluminescent material usable in the invention is not limited thereto.

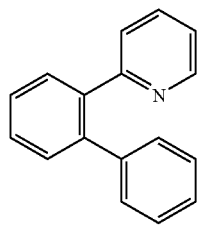

N-1

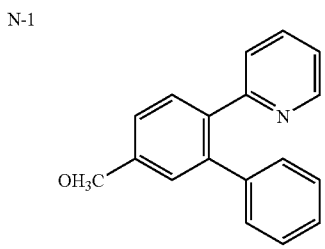

N-2

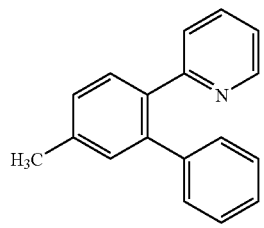

N-3

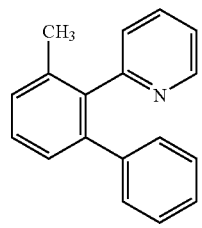

N-4

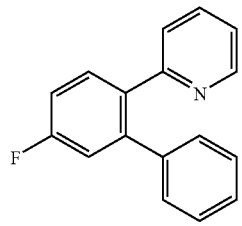

N-5

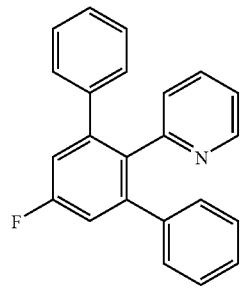

N-6

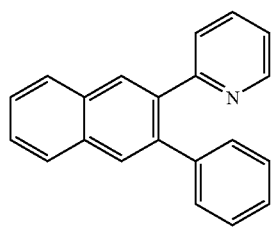

N-7

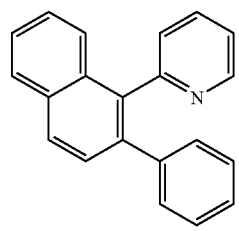

N-8

-continued
N-9
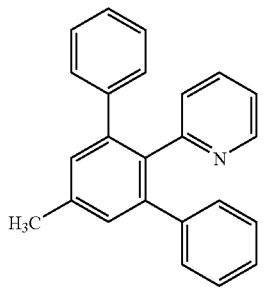
N-10
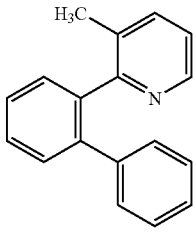
N-11
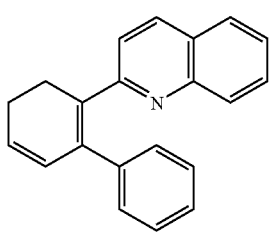
N-12
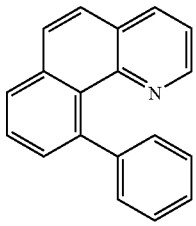
N-13
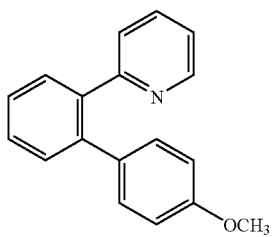
N-14
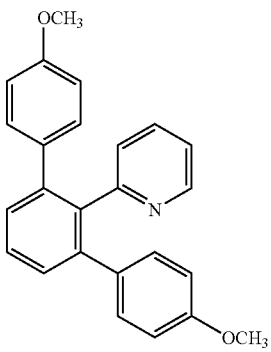
N-15
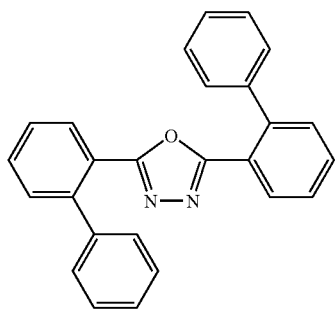
N-16
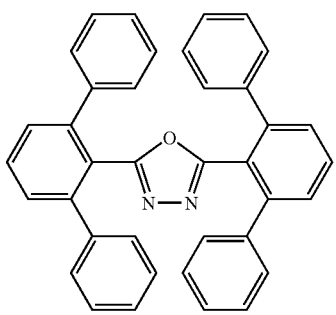
N-17
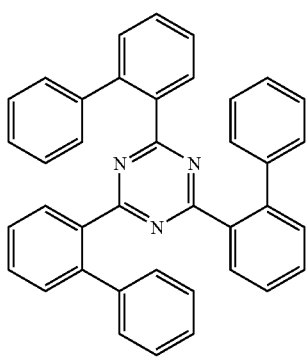
N-18
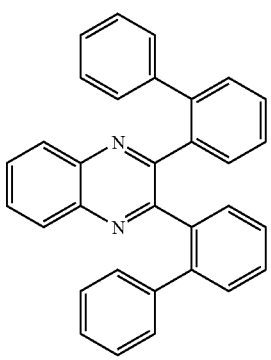

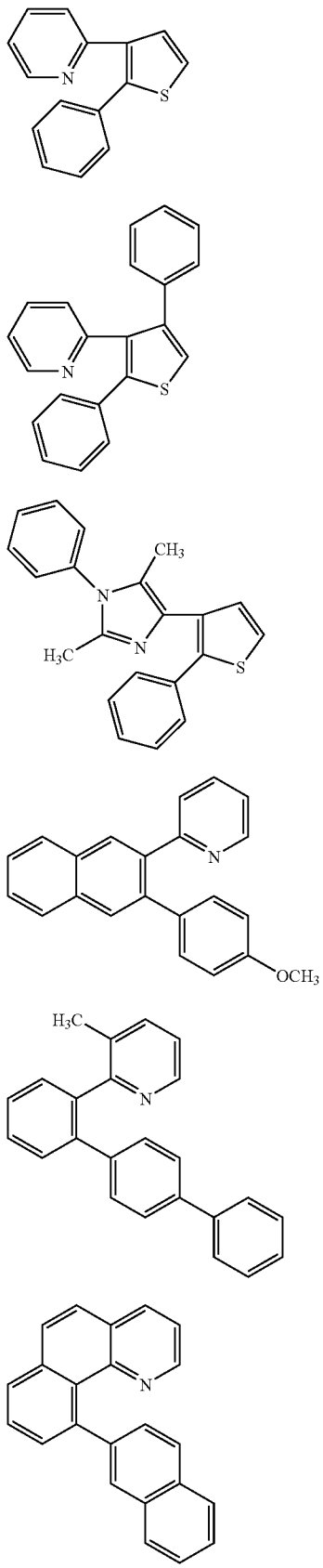

-continued
N-31
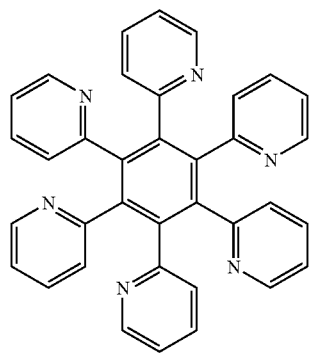
A-1
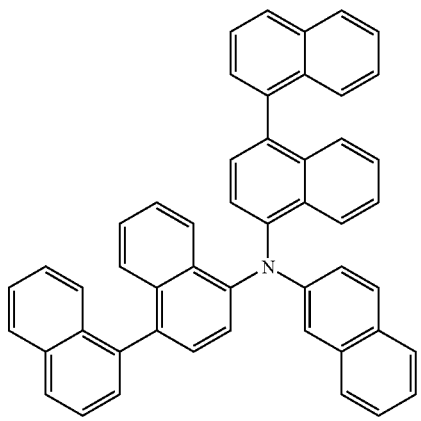
A-2
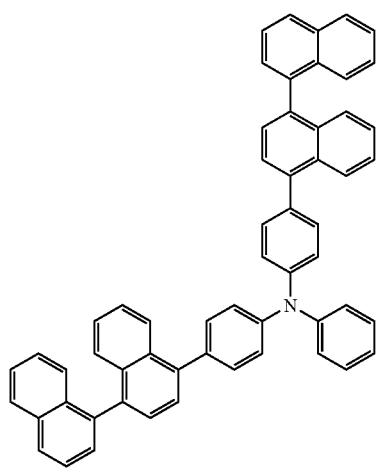
A-3
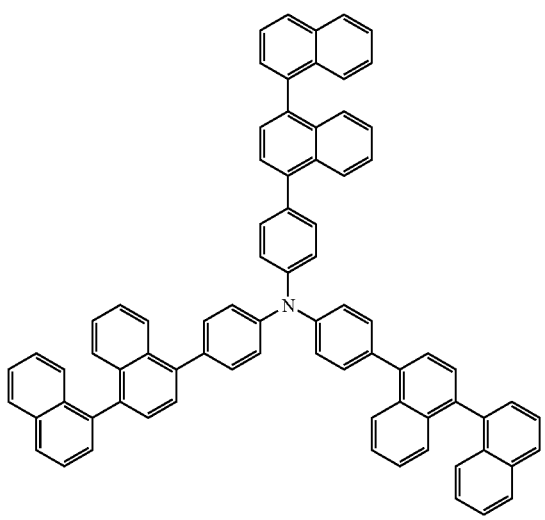
A-4
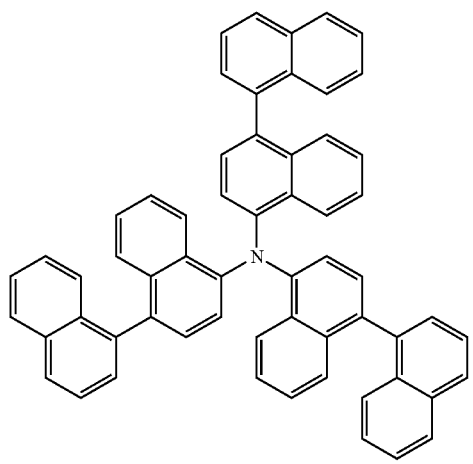
A-5
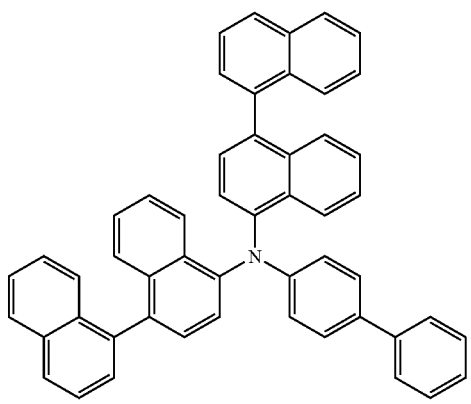

-continued
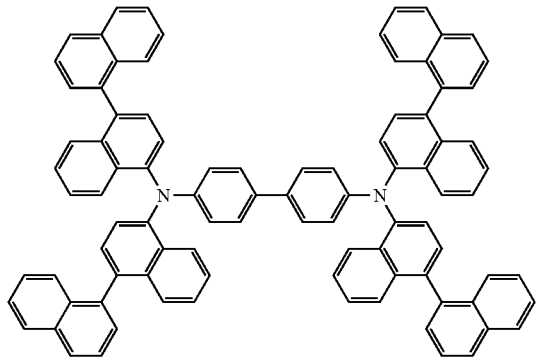
A-6
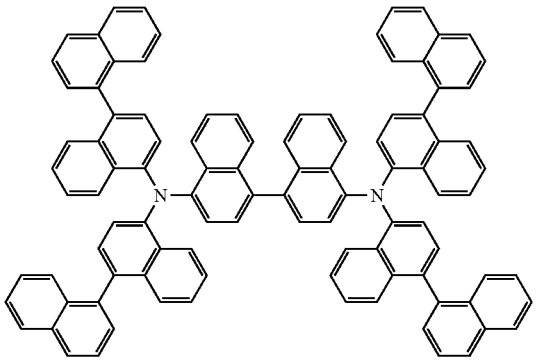
A-7
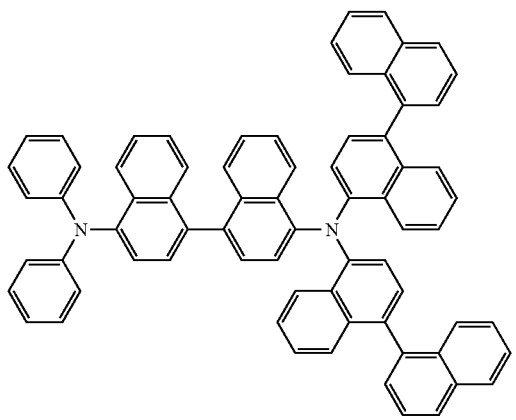
A-8
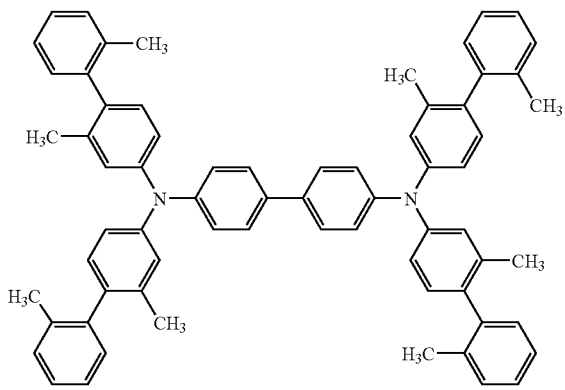
A-10
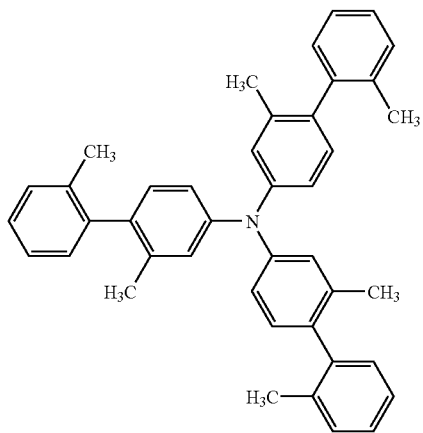
A-11
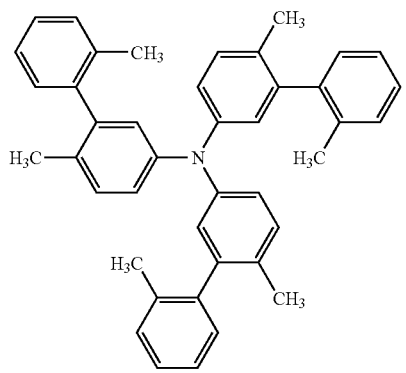
A-12

-continued
A-13
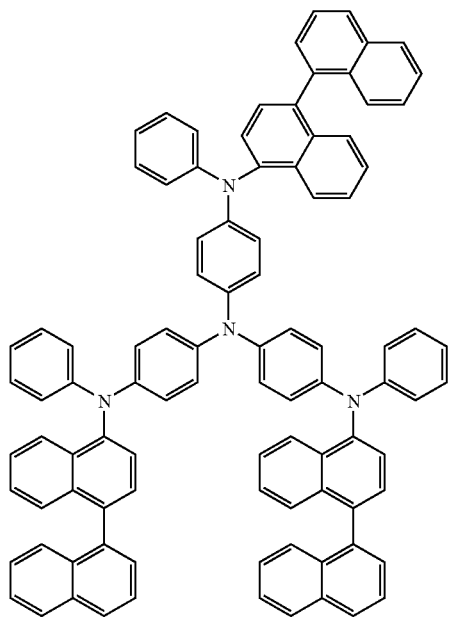
A-14
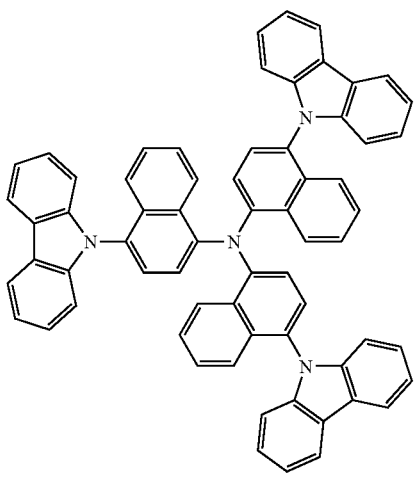
A-15
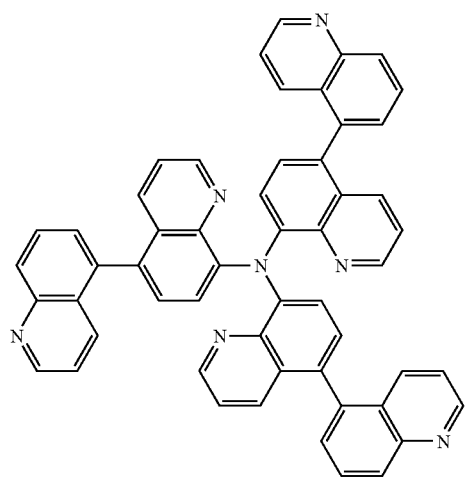
A-16
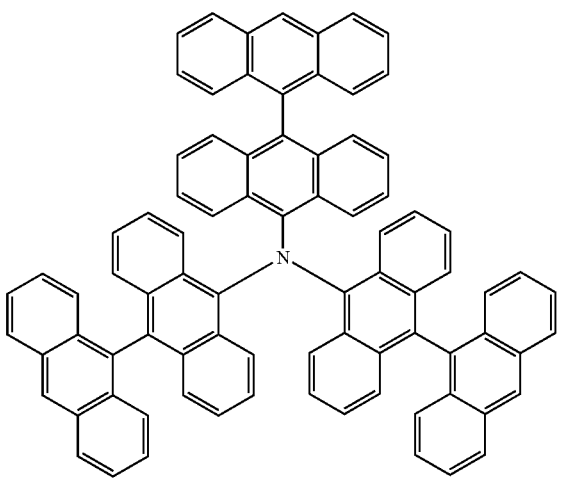
A-17
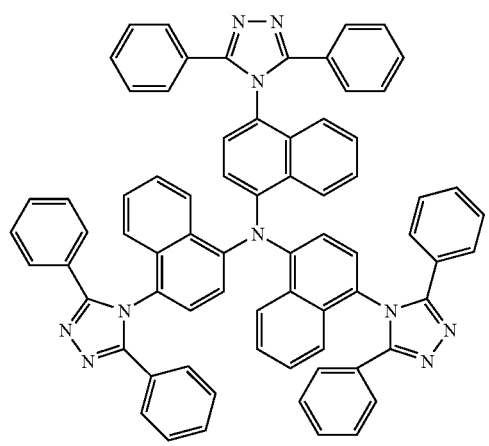
A-18
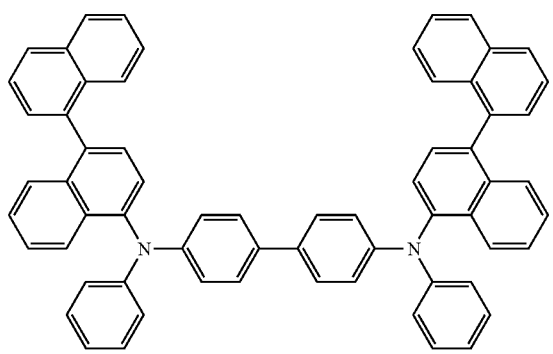

-continued
A-19
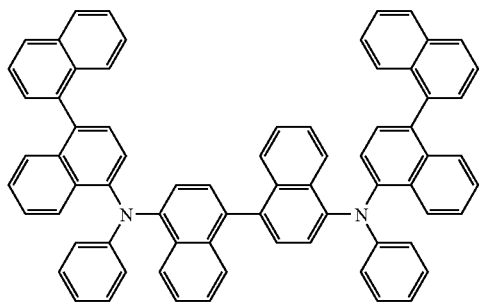
A-20
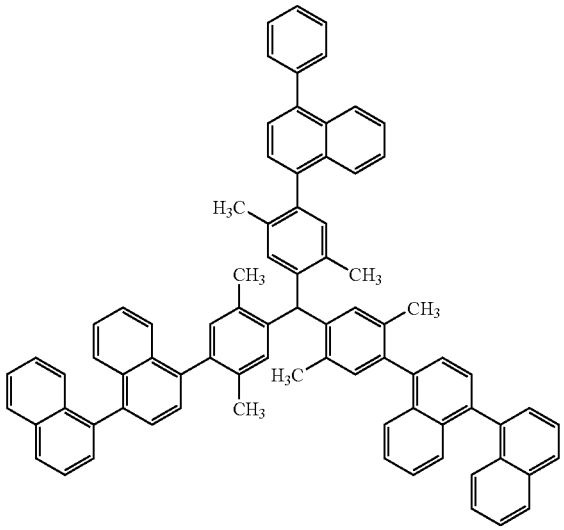
A-21
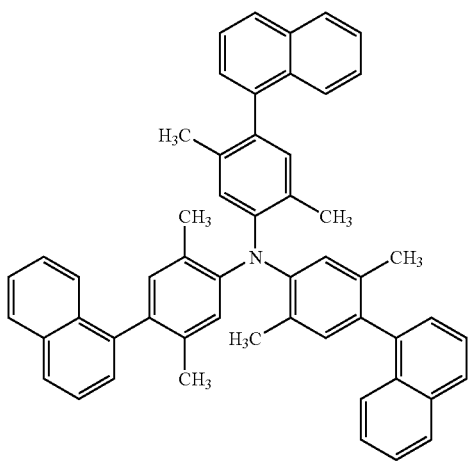
A-22
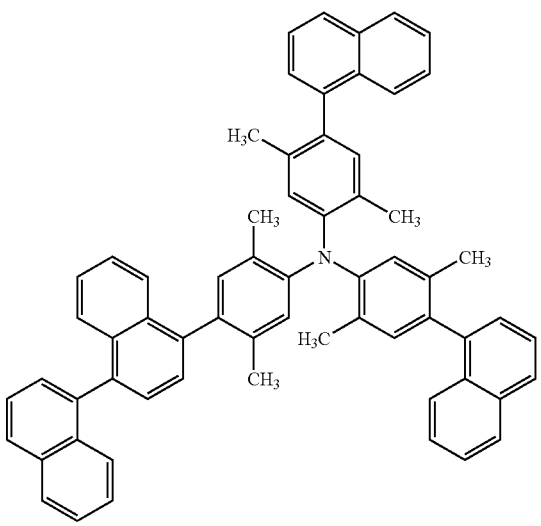
A-23
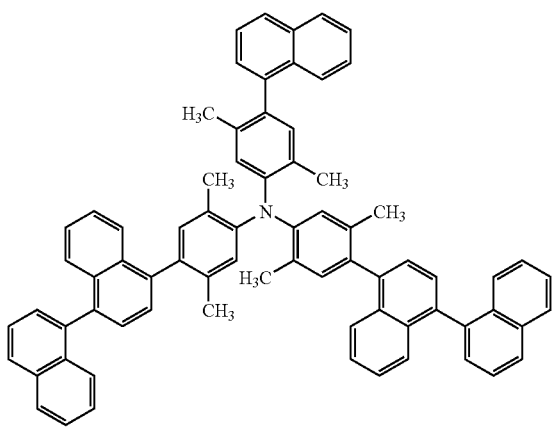
A-24
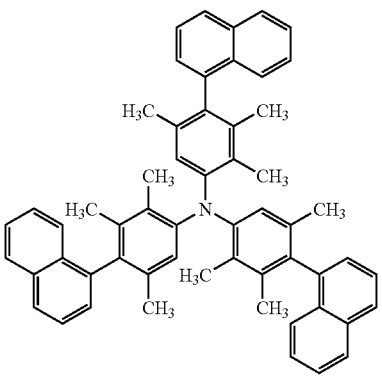

-continued
A-25
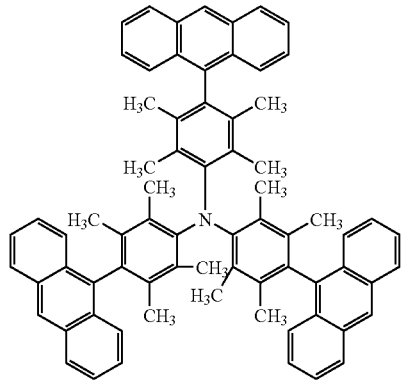
A-26
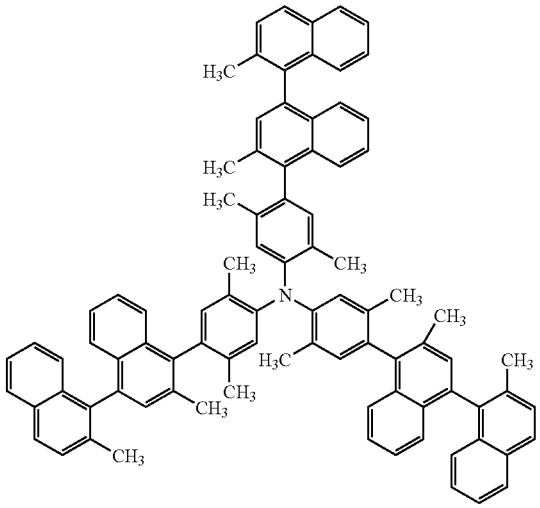
A-27
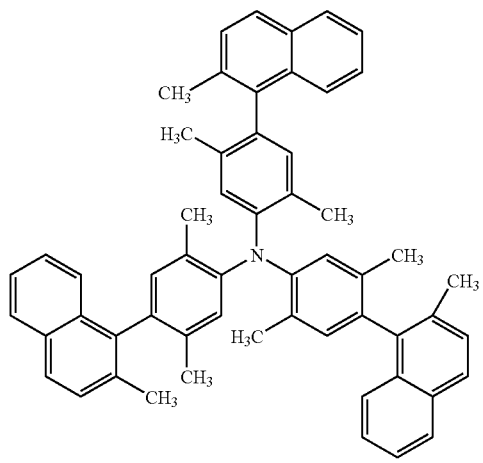
A-28
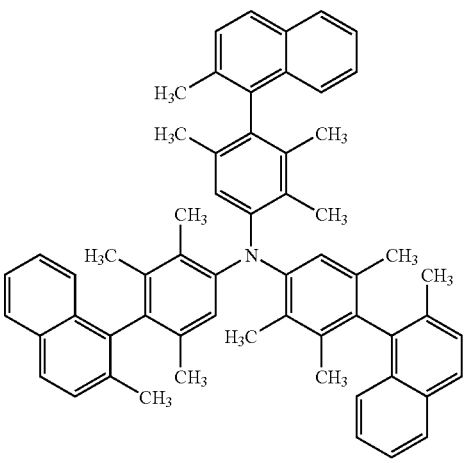
A-29
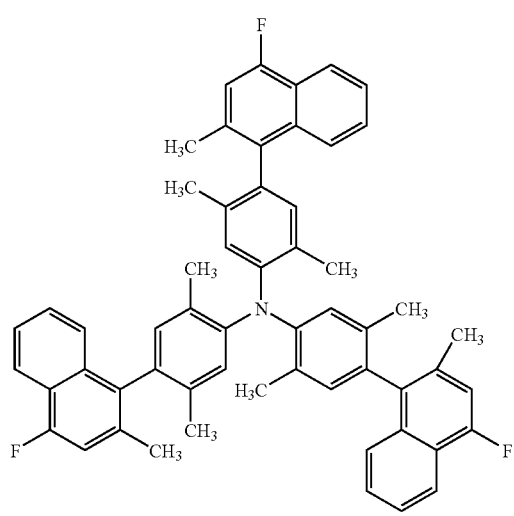
A-30
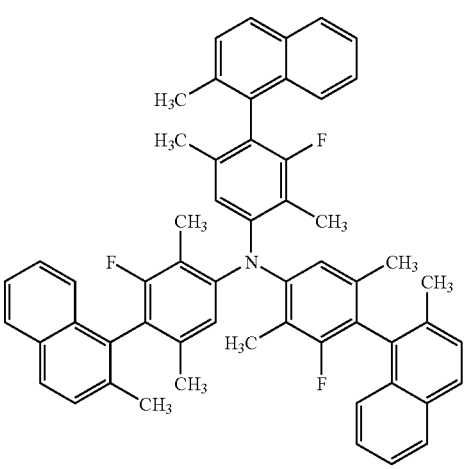

-continued
B-1
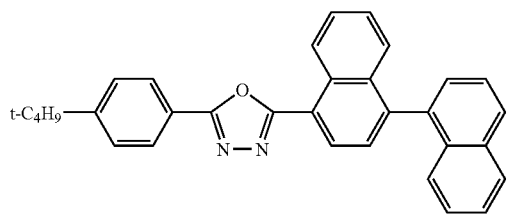
B-2
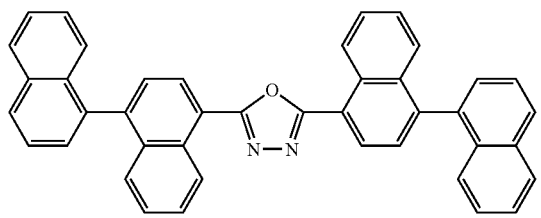
B-3
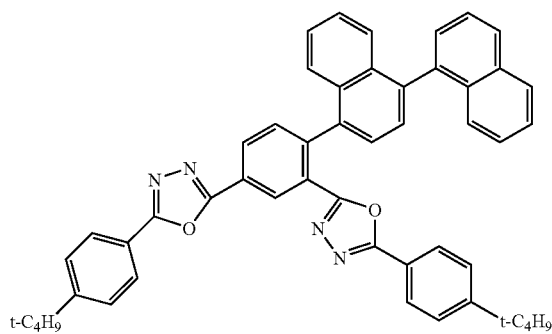
B-4
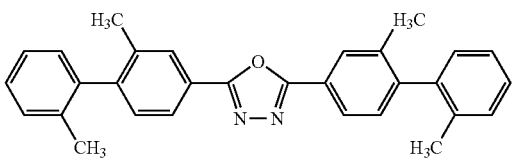
B-5
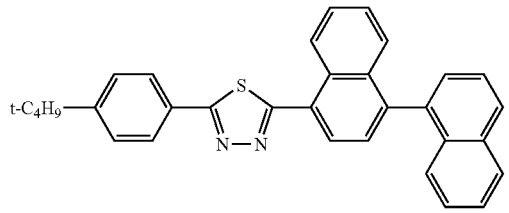
B-6
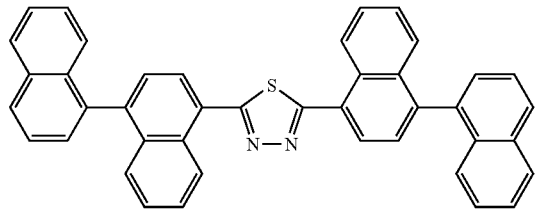
B-7
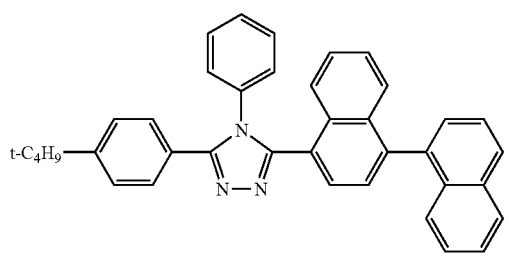
B-8
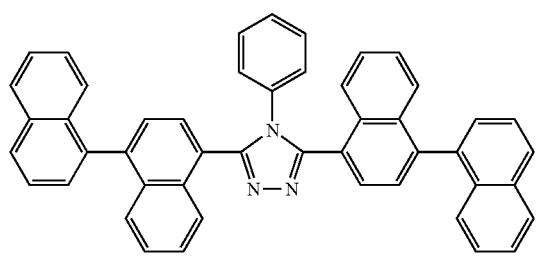
B-9
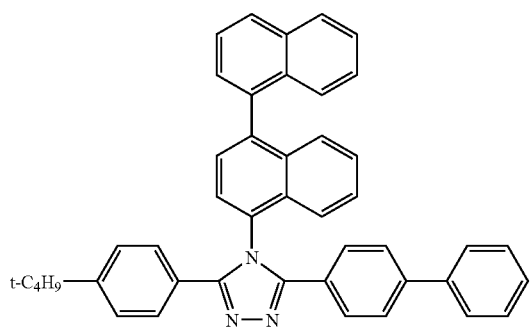
B-10
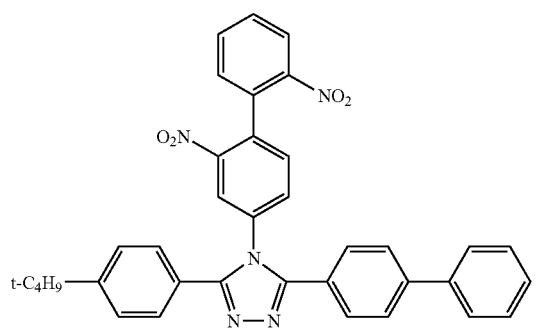

-continued
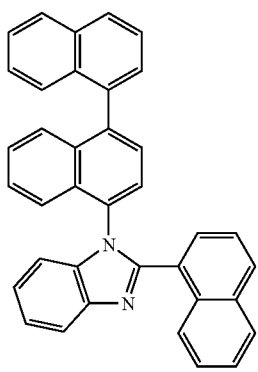
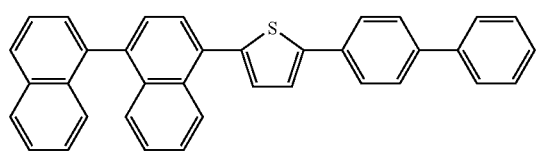
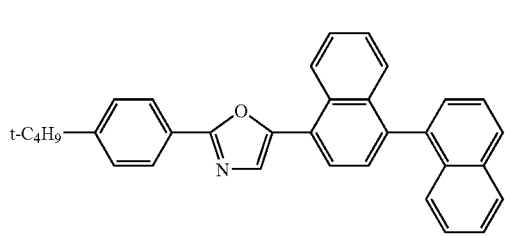
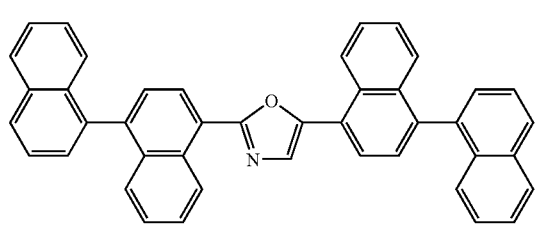
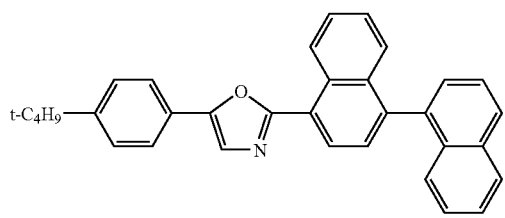
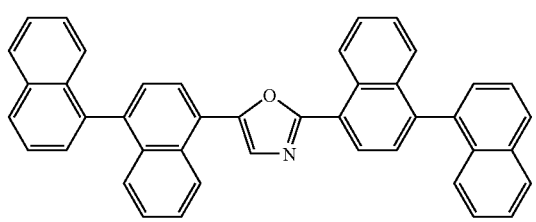
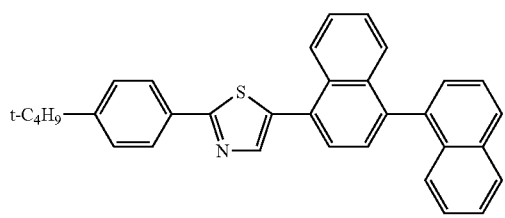
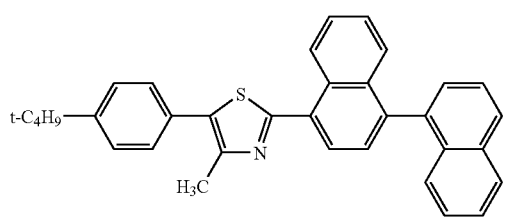
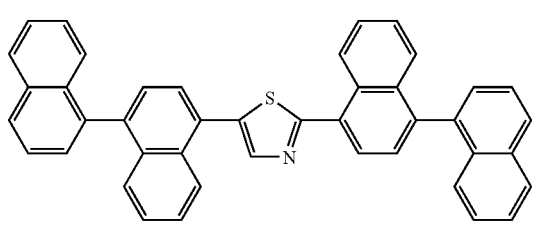

-continued
B-21
B-22
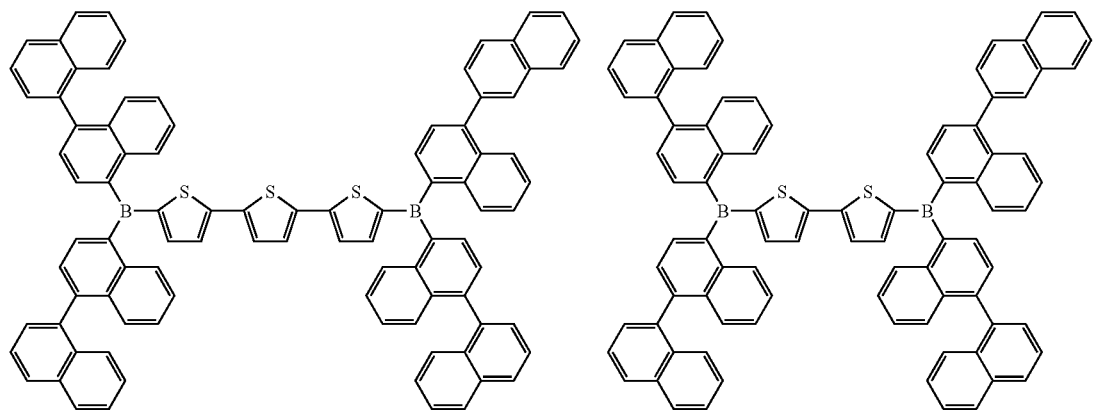
B-23
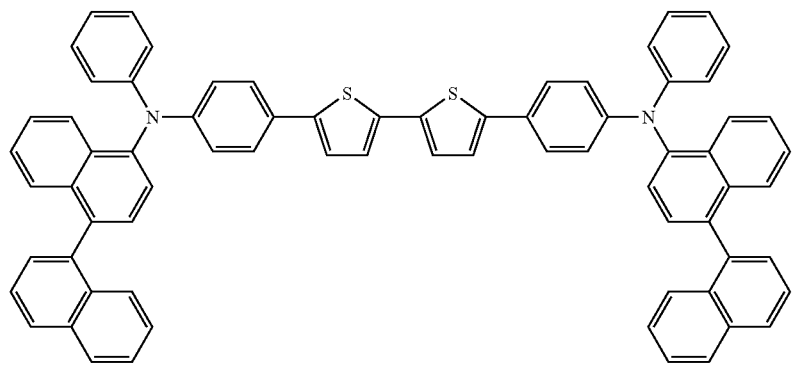
B-24
C-1
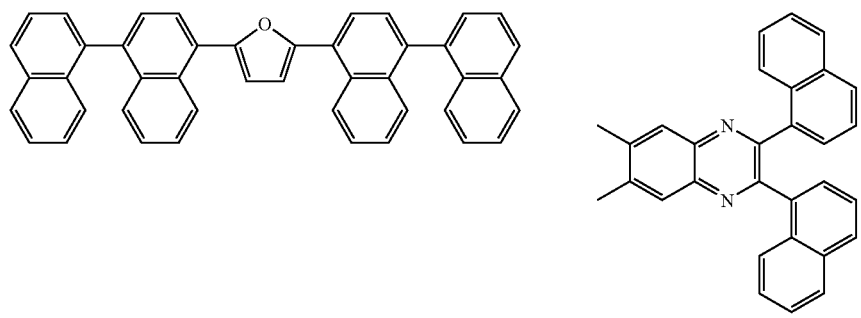
C-2
C-3
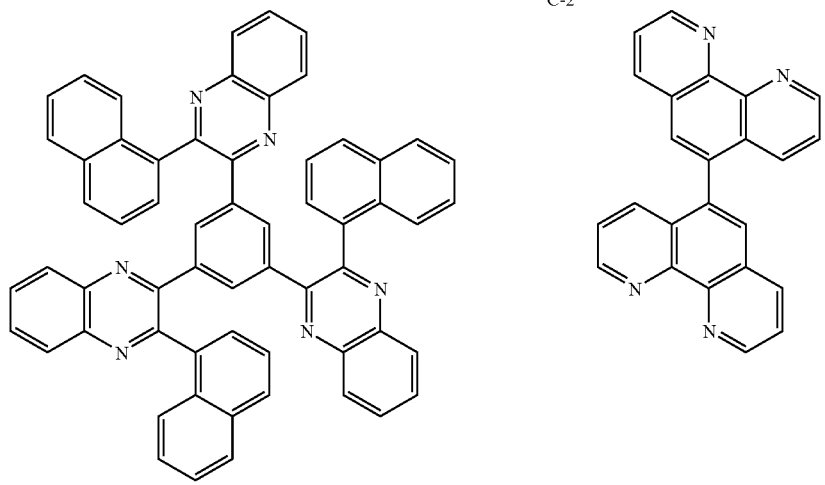

-continued
C-4
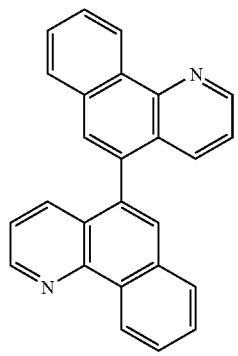
C-5
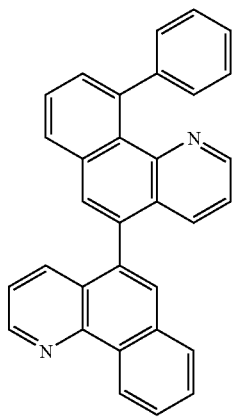
C-6
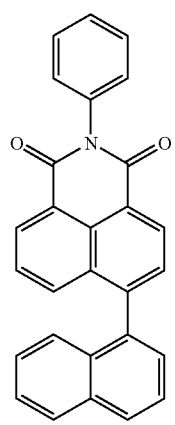
C-7
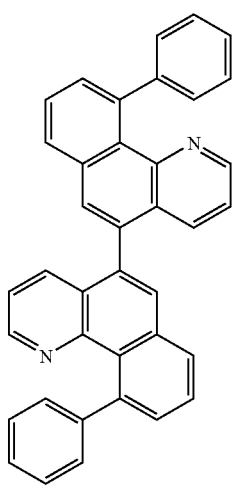
C-8
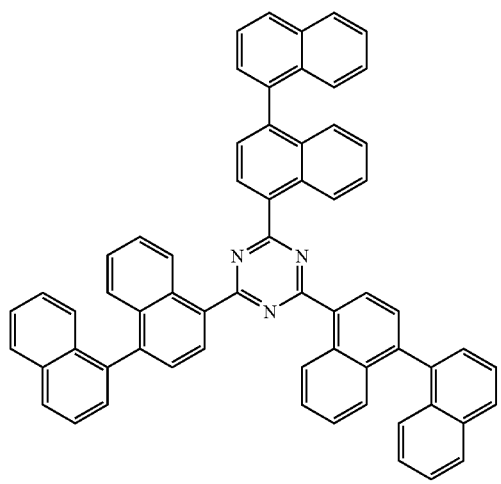
C-9
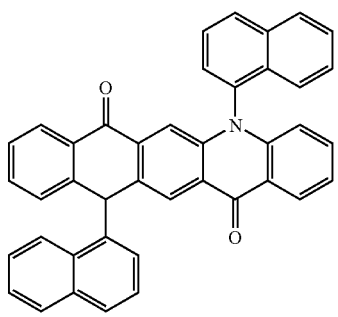

-continued
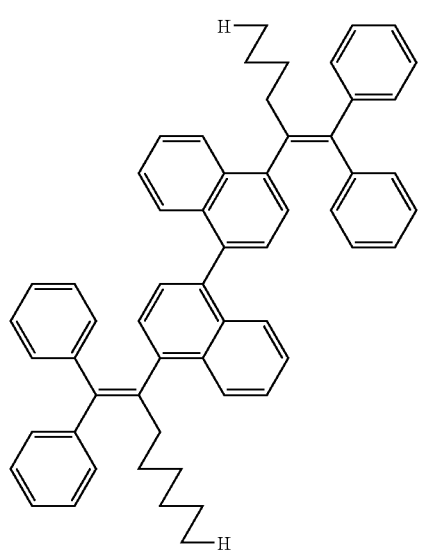 D-1
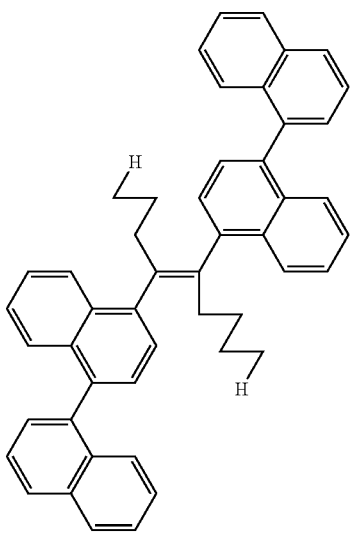 D-2
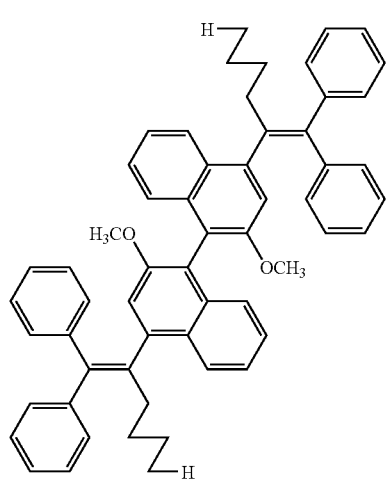 D-3
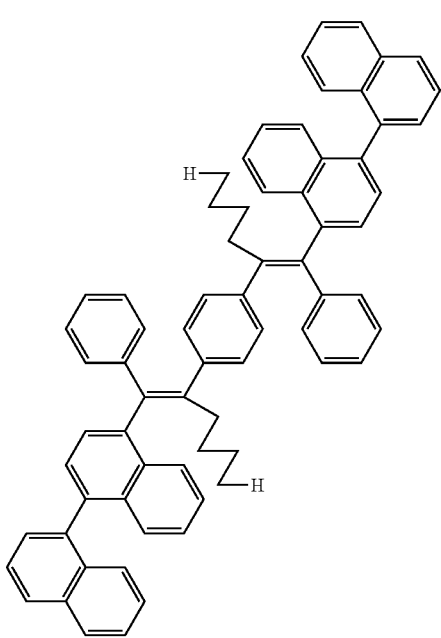 D-4

-continued
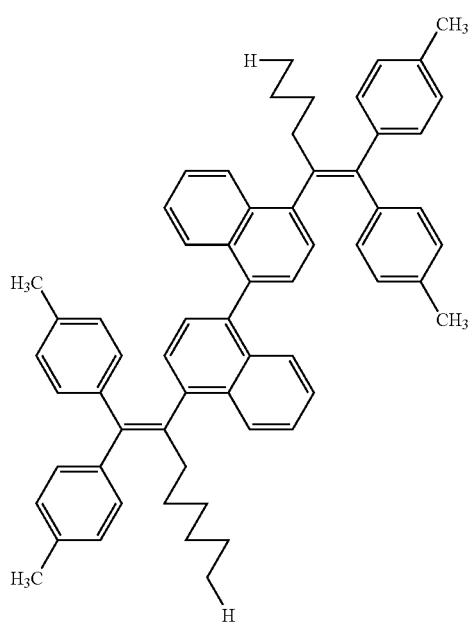
D-5
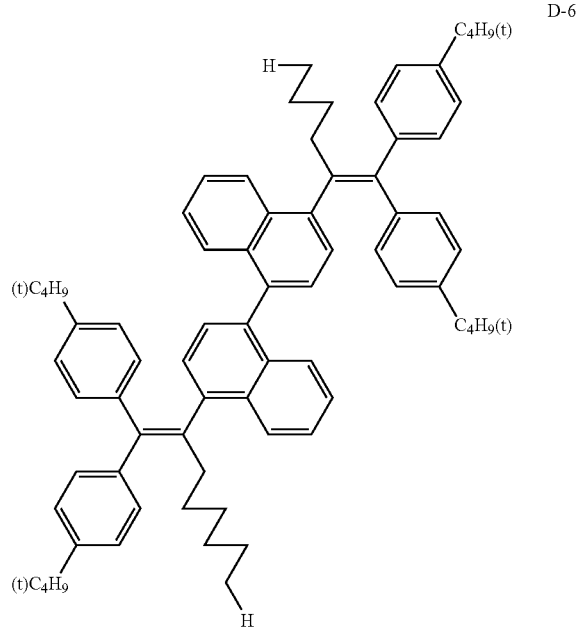
D-6
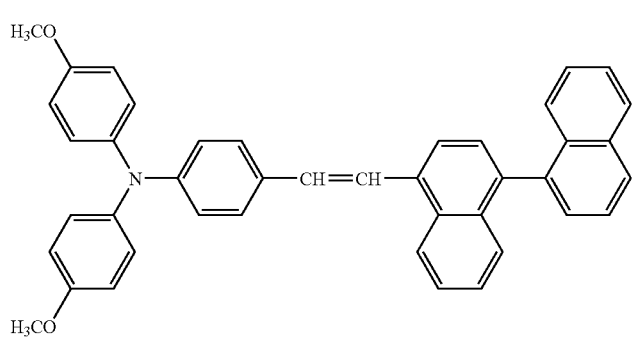
D-7
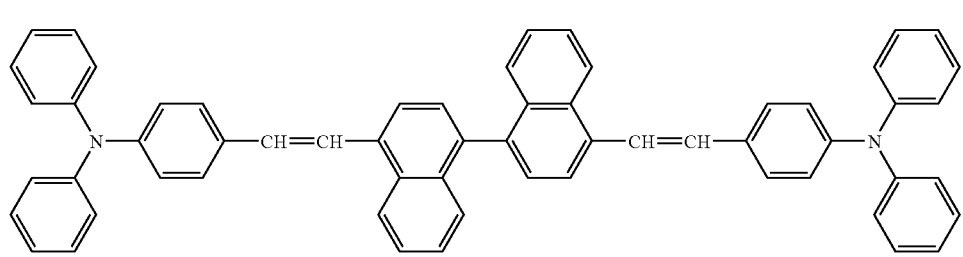
D-8
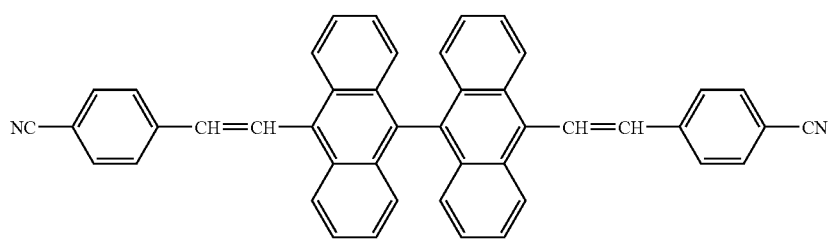
D-9

-continued
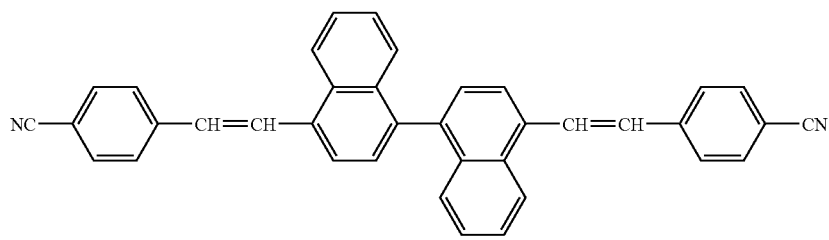
D-10
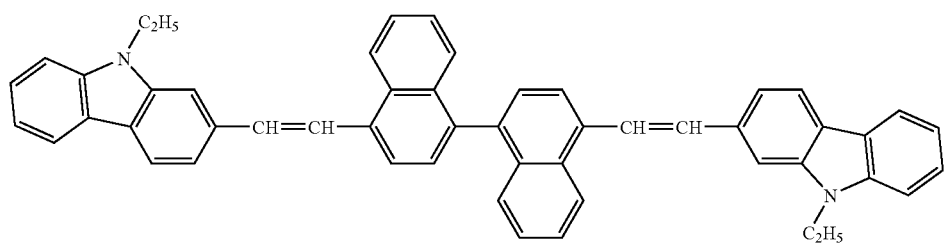
D-11
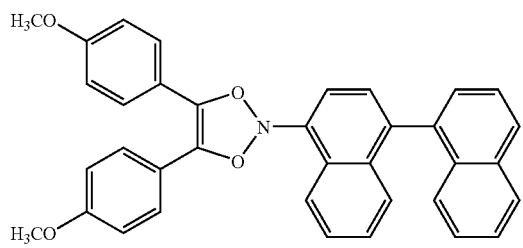
D-12
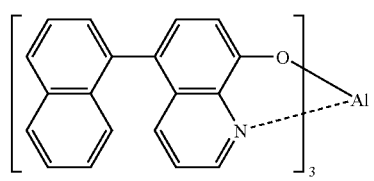
E-1
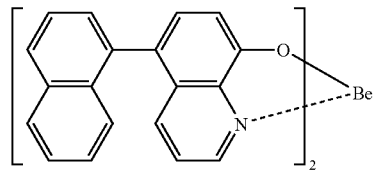
E-2
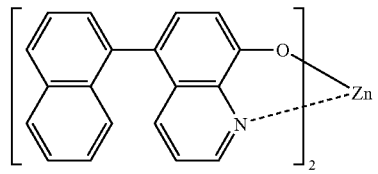
E-3
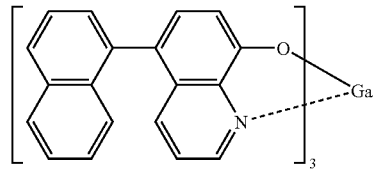
E-4
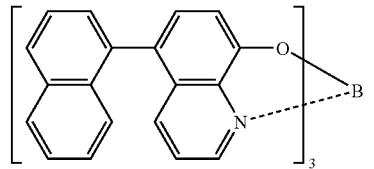
E-5
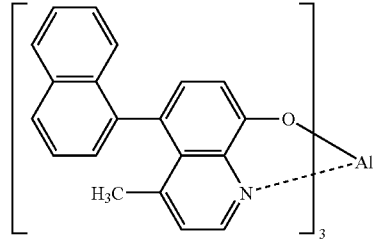
E-6
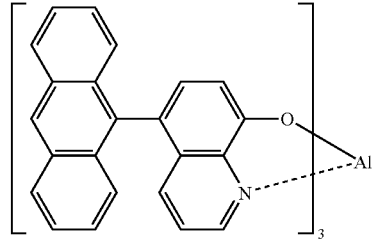
E-7
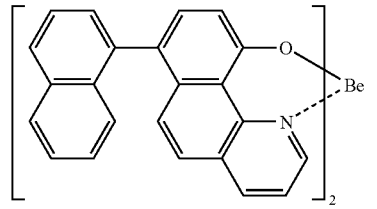
E-8
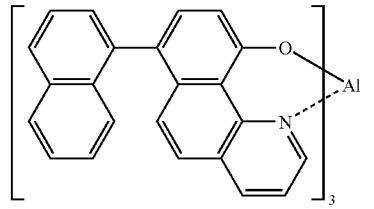
E-9

-continued
E-10
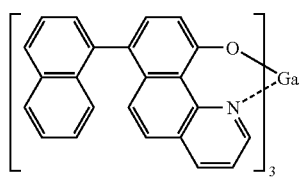
E-11
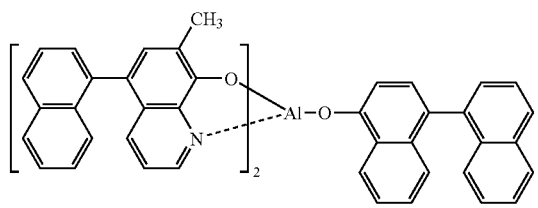
E-12
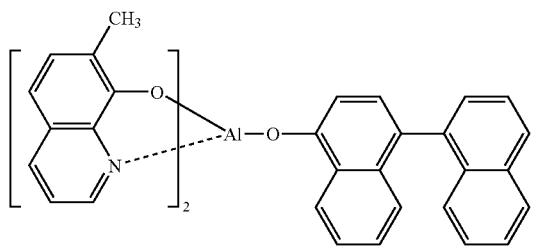
E-13
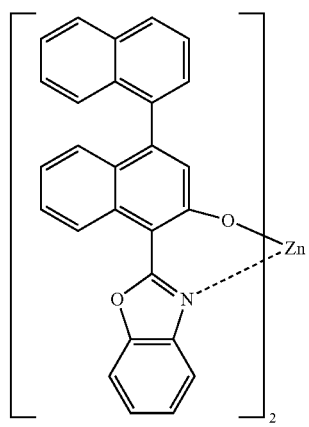
E-14
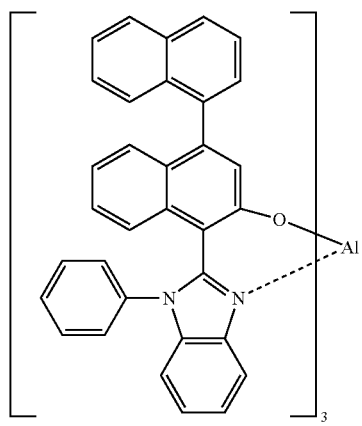
E-15
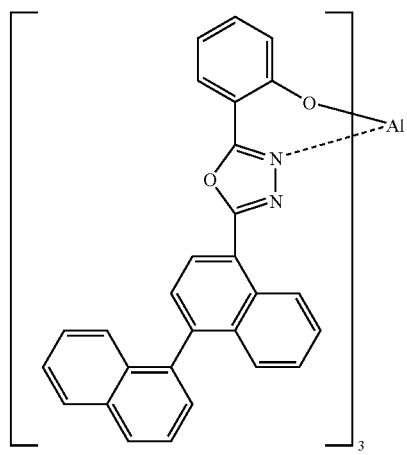
E-16
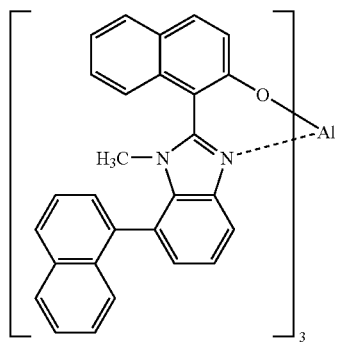
E-17
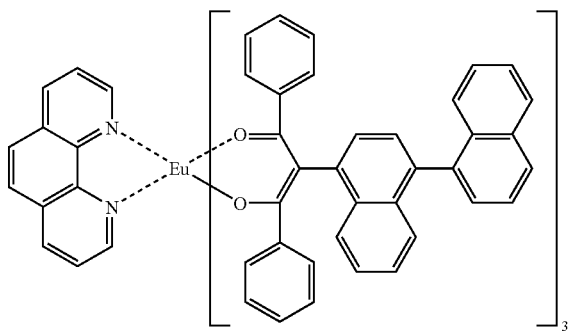

-continued
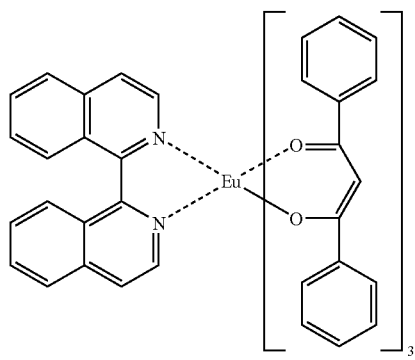
E-18
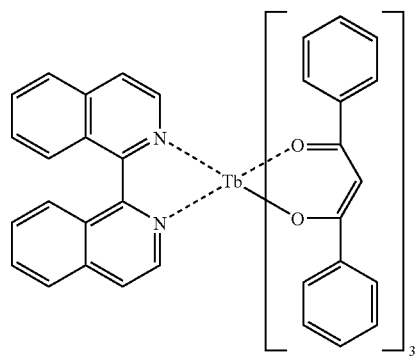
E-19
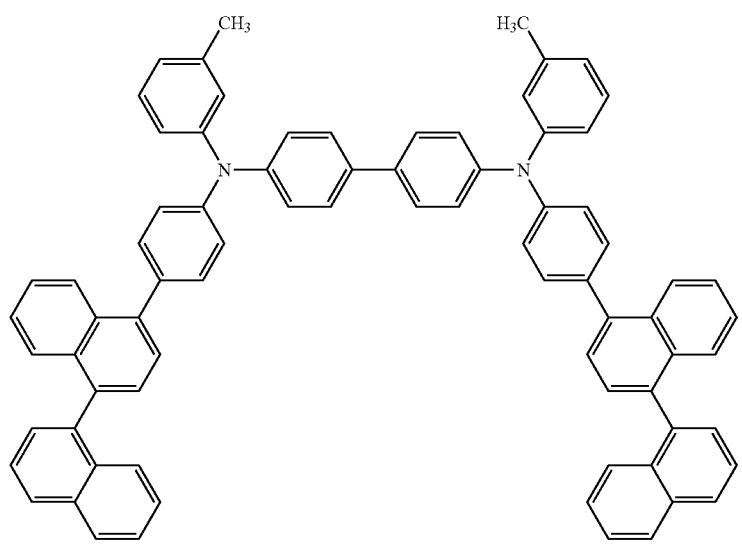
F-1
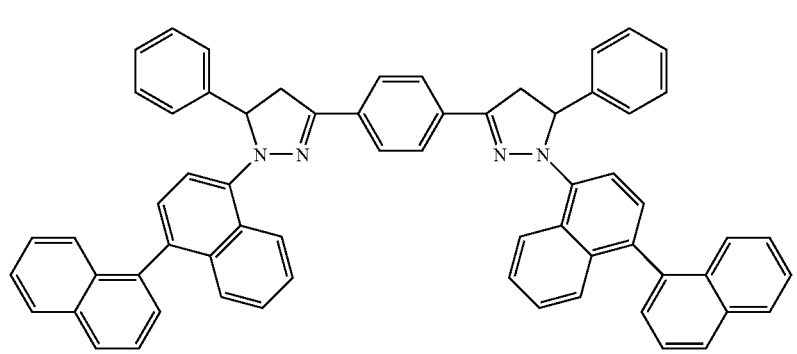
F-2
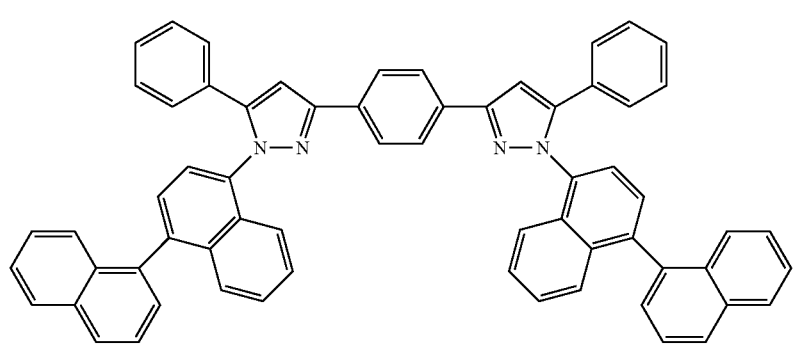
F-3

-continued
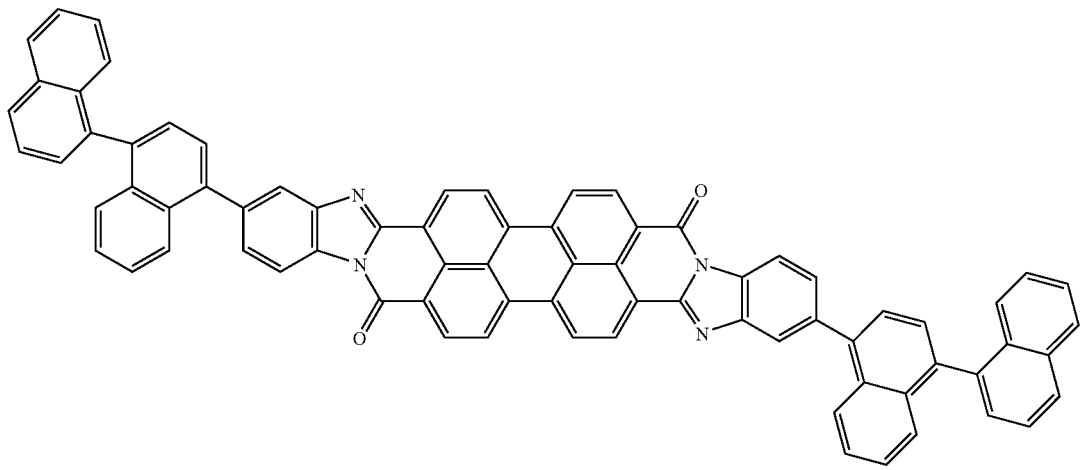
F-4
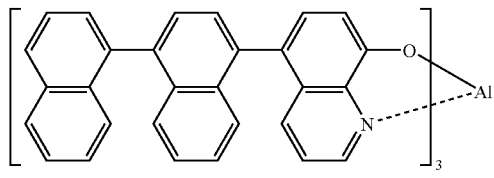
F-5
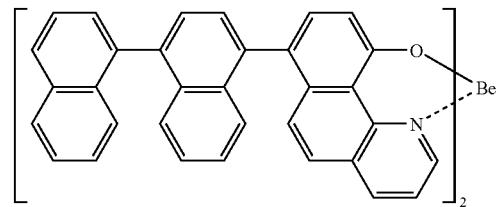
F-6
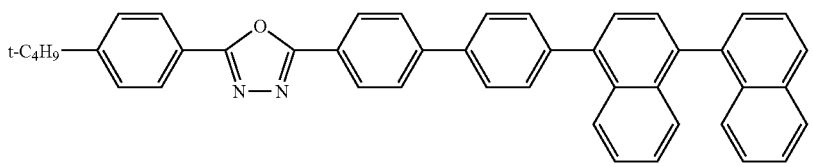
F-7
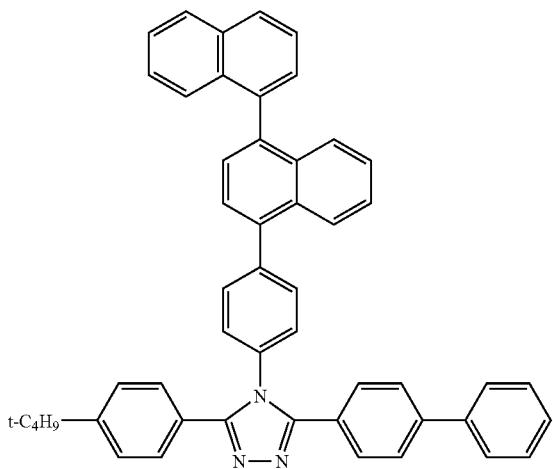
F-8
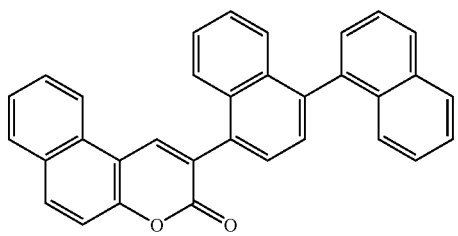
F-9

-continued
F-10
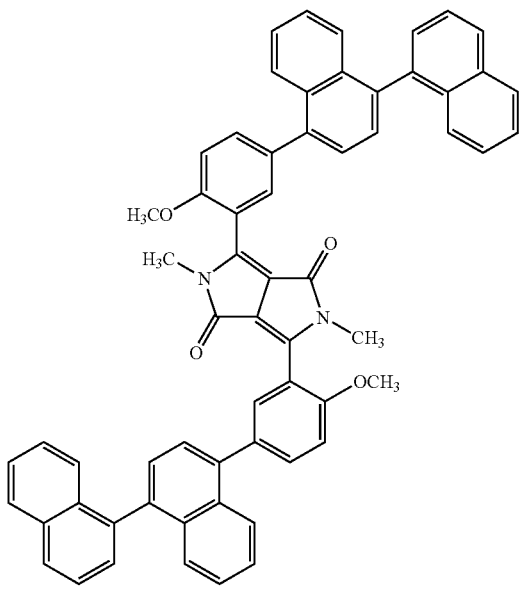
F-11
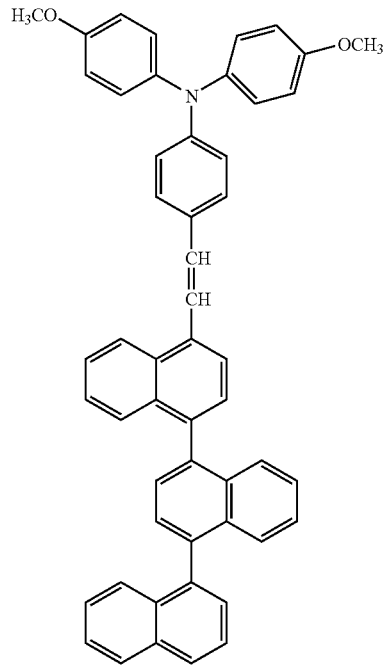
F-12
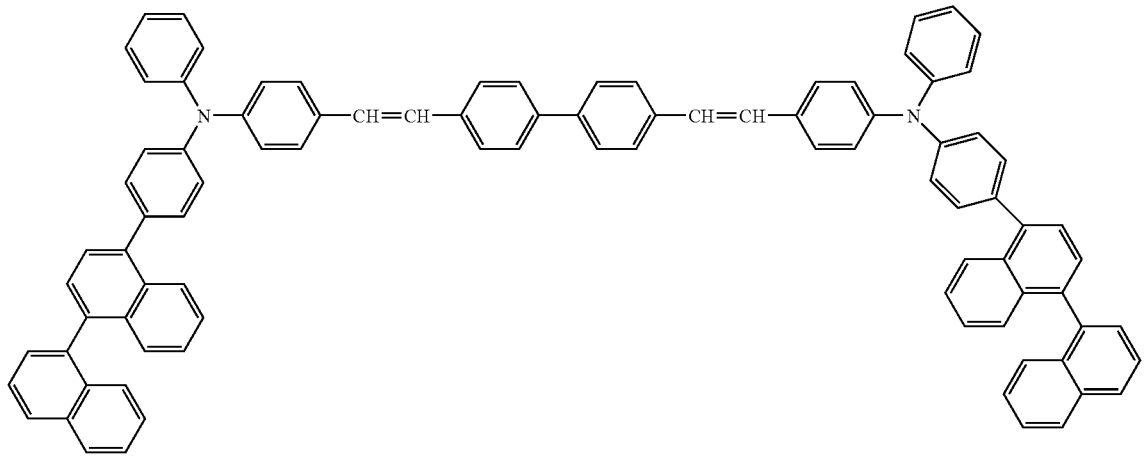
F-13
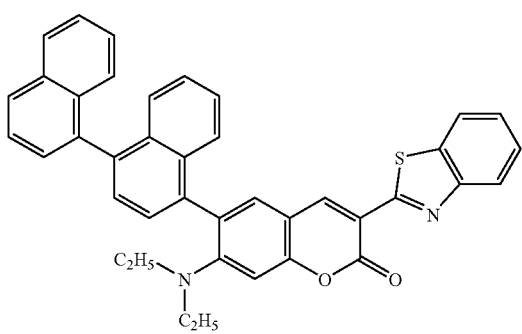

-continued
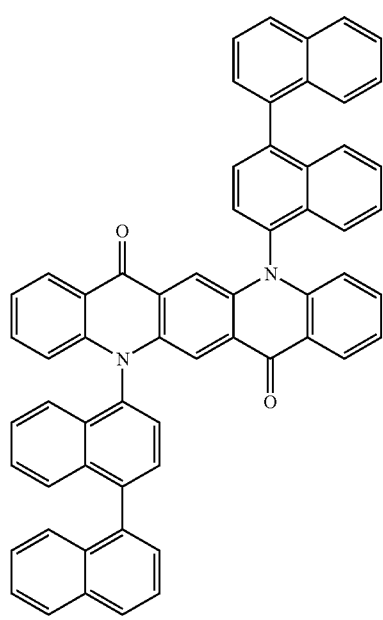
F-14
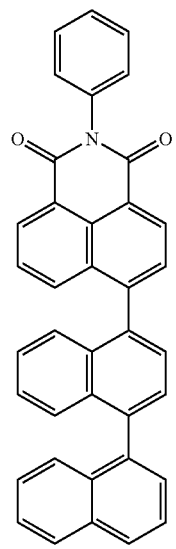
F-15
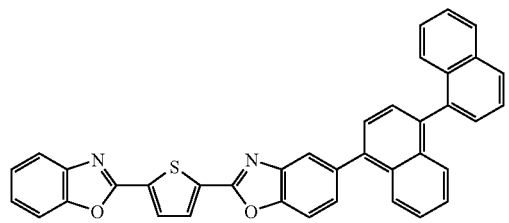
F-16
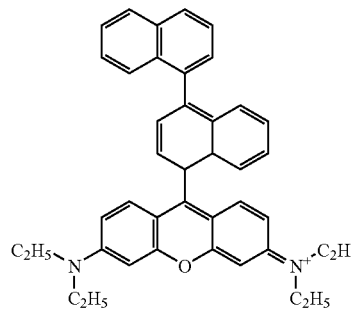
F-17
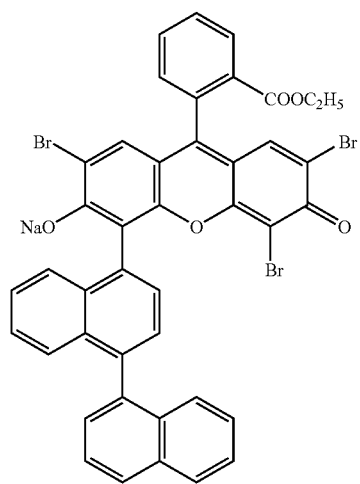
F-18

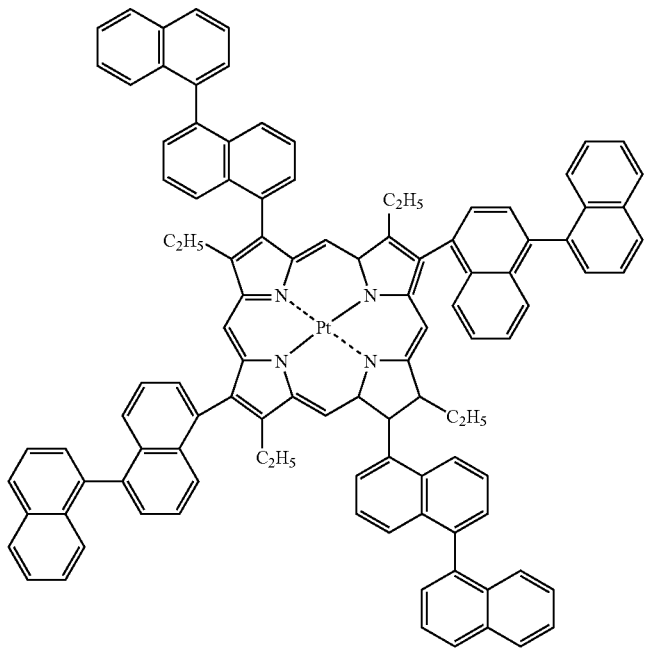

F-19

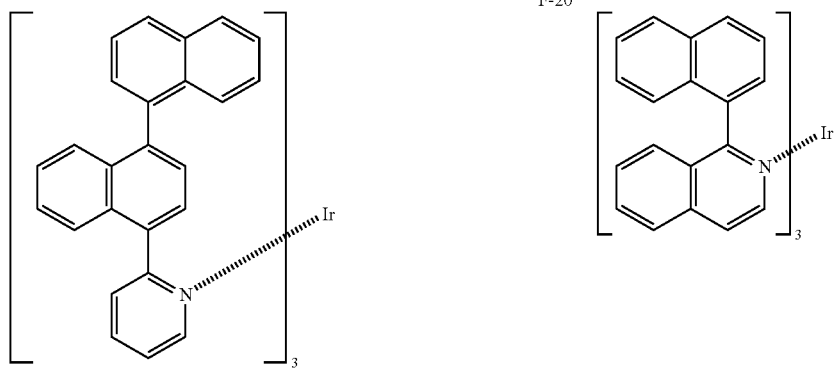

F-20  F-21

The electroluminescent element in the invention is an element comprises a substrate, provided thereon, the foregoing electroluminescent material and an inorganic fluorescent substance or a rare-earth metal complex fluorescent substance which absorbs light emitted from the electroluminescent material and fluoresces light, and a pare of electrodes arranged so as to be faced to each other through the layer containing the electroluminescent material. The electroluminescent material and the inorganic fluorescent substance or the rare-earth metal complex fluorescent substance are separately contained in different layers, and are not contained in the same layer. The electroluminescent material used in the invention may be an emission material, a hole-injection material or an electron-injection material, and the emission material is preferred. The emission material may have capabilities of hole-injection and electron-injection in combination. In cases where the electroluminescent material used in the invention is employed as an emission material, a doping material (also called a dopant or guest) may be optionally employed for the electroluminescent material used as a host. In the followings, the electroluminescent material is present in any one of the emission layer, hole-injection layer and electron-injection layer; and the inorganic and/or rare-earth metal complex fluorescent substance are present in the color conversion layer. An electron injection layer or a positive hole injection layer may be provided in the electroluminescent element of the invention according to necessity.

Substrates used in the electroluminescent element used in the invention are not specifically limited so far as they are transparent, such as glass and plastic resins. Typical examples of the material usable as the substrate of the electroluminescent element according to the invention include glass, quartz, and an optically transparent plastic film even though any material can be used without any limitation as long as the material is transparent. Examples of the transparent plastic film include a film of polyethylene terephthalate (PET), polyethylene naphthalate (PEN), polyethersulfon (PES), polyetherimide, polyetheretherketone, polyphenylene sulfide, polyarylate, polyimide, polycarbonate (PC), cellulose triacetate (TAC), and cellulose acetate-propionate.

In the electroluminescent element, the electroluminescent material according to the invention is preferably contained in the emission layer. Commonly known emission material may be used. Examples thereof include low molecular type emission material described in "Yuki-EL-Soshi to Kogyoka-saizensen" (published N.T.S. Co. Ltd, 1998, hereinafter, denoted Reference A), Sect. 1, Chapter 3, page 35-51; dye doping materials described in the reference A, Sect. 1, Chapter 4, pages 55-79; and high molecular type materials described in the reference A, Sect. 1, Chapter 5, pages 81-100.

The electroluminescent element is usually constituted by a single or plural layers which are sandwiched between two electrodes. The constituting layers include, additionally to the light emission layer, a positive hole injection layer which is also referred to a charge injection layer, a hole injection layer, a charge transportation layer or a hole transportation layer, and an electron injection layer which is also referred to an electron transportation layer.

The positive hole injection layer and the electron injection layer each may have a multi-layered structure, for example the following layer structure may be taken: Anode/1st positive hole injection layer/2nd positive hole injection layer (positive hole transportation layer)/Light emission layer/2nd electron injection layer (electron transportation layer) 1st electron injection layer/Cathode Examples of layer structure of the electroluminescent element of the invention are shown below. In the followings, the positive hole injection layer and the electron injection layer each may be a layer composed of laminated layers of plural compound as above-mentioned even though description regarding the plural laminated positive hole injection layers and/or the plural laminated electron injection layers are omitted.

(i) Substrate/Color conversion layer/Substrate/Anode/Light emission layer/Cathode
(ii) Substrate/Color conversion layer/Substrate/Anode/Positive hole injection layer/Light emission layer/Cathode
(iii) Substrate/Color conversion layer/Substrate/Anode/Light emission layer/Electron injection layer/Cathode
(iv) Substrate/Color conversion layer/Substrate/Anode/Positive hole injection layer/Light emission layer/Electron injection layer/Cathode
(v) Substrate/Anode/light emission layer/Cathode/Color conversion layer/Substrate
(vi) Substrate/Anode/Positive hole injection layer/Light emission layer/Cathode/Cover conversion layer/Substrate
(vii) Substrate/Anode/Light emission layer/Electron injection layer/Cathode/Color conversion layer/Substrate
(viii) Substrate/Anode/Positive hole injection layer/Light emission Layer/Electron injection layer/Cathode/Color conversion layer/Substrate In the above-mentioned, the substrate contacting with the color conversion layer and that contacting with the anode may be the same or different. Outside of the element may be covered with the substrate.

A buffer layer (electrode interface layer) may be arranged between the anode and the light emission layer or the positive hole injection layer, and between the cathode and the light emission layer or the electron injection layer.

The buffer layer is a layer provided between the electrode and the organic compound layer for lowering the driving voltage or raising the light emission efficiency, which are described in Vol. 2, Section 2, p.p. 123-166 of Publication A. The buffer layer includes an anode buffer layer and a cathode buffer layer.

Examples of the anode buffer layer include a phthalocyanine buffer layer typically comprising copper phthalocyanine, an oxide buffer layer typically comprising vanadium oxide, an amorphous carbon buffer layer and a polymer buffer layer comprising an electroconductive polymer such as polyaniline (Emeraldine) and polythiophene.

Examples of the cathode layer buffer include a metal cathode buffer typically comprising a metal strontium and aluminum, an alkali metal compound buffer layer typically comprising lithium fluoride, an alkali-earth metal compound buffer layer typically comprising magnesium fluoride and an oxide buffer layer typically comprising aluminum oxide.

The buffer layer is desirably a extremely thin layer and the thickness thereof is preferably from 0.1 to 100 nm depending on the material.

The emission layer, hole-injection layer, electron-injection layer and buffer layer can be prepared as a thin layer by a known method such as a evaporation method, a spin-coat method, a casting method and a LB method. The layer is preferably a sedimented molecule layer. The sedimented molecule layer is a thin layer formed by sedimentation of the compound from a gas phase or a layer formed by solidifying from the molten or liquid phase of the compound. The sedimented molecule layer can be distinguished from a thin layer formed by the LB method (cumulative molecule layer) based on the difference in the coagulation structure and the high dimensional structure, and in the functional difference thereof caused by the structural difference.

Moreover, the light emission layer can be formed by the method such as that described in JP O.P.I. No. 57-51781, by which the light emission material is dissolved in a solvent together with a binder such as a resin, and thus obtained solution is formed into a thin layer by a method such as spin-coat method. It is preferred that the thickness is within the range of from 5 nm to 5 μm, although the thickness of the layer thus formed may be optionally selected according to necessity without any limitation.

For the anode of the electroluminescent element, a metal, an alloy and an electroconductive compound each having a high working function of not less than 4 eV, and mixture thereof are preferably used as the electrode material. Concrete examples of such the electrode material include a metal such as Au, and a transparent electroconductive material such as CuI, indium oxide (ITO), $SnO_2$, ZnO and Zn-doped indium oxide (IZO). The anode may be prepared by evaporating or spattering such the electrode material to form a thin layer, and forming the layer into a desired form by a photolithographic method. When required precision of the pattern is not so high (not less than 100 mm), the pattern may be formed by evaporating or spattering through a mask having a desired form.

When light is output through the anode, it is desired that the transparence of the anode is 10% or more, and the sheet resistivity of the anode is preferably not more than $10^3$ Ω/□. It is preferably within the range of from approximately 10 nm to 1 μm, more preferably from 10 to 200 nm, although the thickness of the anode may be optionally selected.

On the other hand, for the cathode, a metal (also referred to an electron injection metal), an alloy, and an electroconductive compound each having a low working function (not more than 4 eV), and a mixture thereof are used as the material of electrode. Concrete examples of such the electrode material include sodium, potassium, sodium-potassium alloy, magnesium, lithium, a magnesium/copper mixture, a magnesium/silver mixture, a magnesium/aluminum mixture, magnesium/indium mixture, a aluminum/aluminum oxide ($Al_2O_3$) mixture, indium, a lithium/aluminum mixture and a rare-earth metal.

Among then, a mixture of an electron injection metal and a metal higher in the working function than that of the electron injection metal, such as the magnesium/silver mixture, magnesium/aluminum mixture, magnesium/indium mixture, aluminum/aluminum oxide ($Al_2O_3$) and lithium/aluminum mixture, is suitable from the view point of the electron injection ability and the resistivity to oxidation.

However, the limitation of the working function is released when the cathode buffer layer is coated on the surface of the cathode. For example, such described as in JP O.P.I. No. 11-224783, a material having a high working function such as ITO, $SnO_2$, $In_2O_3$ and ZnO:Al can be used as the cathode which are usually used a the cathode when a fluoride of an alkali metal or an alkali-earth metal is used as the cathode buffer layer (in the publication described as an electron injection layer). Moreover, it has been known that aluminum can be used as the cathode material when lithium fluoride is used as the cathode buffer layer (thickness: 0.5 to 1 μm) as described in Publication (A), page 145, lines 15-28. When such the cathode material is used, an element defined as "metal" in the Periodical Table such as silver, copper, platinum and gold is usable additionally to the above-mentioned metal oxides and aluminum.

The cathode can be prepared by making such the material to a thin layer by a method such as an evaporation or spattering mehtod.

Moreover, it may be formed by a plating method such as described in JP O.P.I. No. 11-8074.

The sheet resistivity of the cathode is preferably not more than $10^3$ Ω/γ, and the thickness of the cathode is preferably from 10 nm to 1 μm, more preferably from 50 to 2,000 nm.

It is preferable for raising the light emission efficiency that the electrode arranged between the light emission layer and the color conversion layer is transparent or semi-transparent so as to permeate light therethrough. Herein, the expression, the electrode being transparent or semi-transparent means that the transmittance of the total visible region of 400 to 700 nm is 20% or more, and preferably 50% or more.

In the invention, a positive hole injection layer may be provided according to necessity. The positive hole injection layer has a function of transporting the positive hole injected from the anode to the light emission layer. Many positive holes can be injected in a lowered electric field by the presence of the positive hole injection layer between the anode and the light emission layer. Moreover, the light emission ability of the element is made excellent by raising the light emission efficiency since the electrons injected into the light emission layer from the cathode or the electron injection layer are accumulated at the interface in the light emission layer by a barrier to electron existing at the interface between the light emission layer and the positive hole injection layer The material to be used for the positive hole injection layer (hereinafter referred to a positive hole injection material) can be optionally selected from known materials without any limitation.

The positive hole injection material may be either an organic substance or an inorganic substance as long as it has a positive hole injection ability or an ability to form a barrier to electron.

Various kinds of organic compounds, for example, those described in JP O.P.I. Nos. 63-295695, 2-191694, 3-792, 5-234681, 5-239455, 5-299174, 7-126225, 7-126226, 8-100172 and EP No. 0650955 A1, can be used as the positive injection hole material. Examples of them include a phthalocyanine derivative, a tetraarylbenzidine compound, an aromatic tertiary amine, a hydrazone derivative, a carbazole derivative, a triazole derivative, an imidazole derivative an oxadiazole derivative having an amino group and polythiophene. These compounds may be used in combination of two or more. When the compounds are used in combination, they may be formed in a separated layers or mixed with together.

When the positive hole injection layer is formed by lamination (in the case of the functions of positive hole injection and positive hole transportation are separately allocated), a preferable combination can be selected from these materials. In such the case, it is preferable to laminate the compounds in the order of small ionized potential from the anode such as ITO. The compound having a high thin film forming ability is preferably used such as the starburst type compounds described in JP O.P.I. No. 4-308688.

Typical examples of the aromatic tertiary amine compound include N,N,N',N'-tetraphenyl-4,4'-diaminophenyl, N,N'-diphenyl-N,N'-bis (3-methylphenyl)-[1,1'-biphenyl]-4,4'-diamine (TPD), 2,2'-bis(4-di-p-tolylaminophenyl)propane, 1,1'-bis(4-di-p-tolylaminophenyl)cyclohexane, N,N,N',N'-tetra-p-tolyl-4,4'-diaminobiphenyl, 1,1'-bis(4-di-p-tolylaminophenyl)-4-phenylcyclohexane, bis (4-dimethylamino-2-methylphenyl)-phenylmethane, bis(4-di-p-tolylaminophenyl)-phenylmethane, N,N'-diphenyl-N,N1-di (4-methoxyphenyl)-4,4'-diaminobiphenyl, N,N,N',N'-tetraphenyl-4,4'-diaminodiphenylether, 4,4'-bis (diphenylamino)quaterphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in JP O.P.I. No. 4-308688 such as 4,4',4"-tris [N-(3-methylphenyl)-N-phenylamino]-triphenylamine (MTDATA) in which three triphenylamine units are bonded in a starburst form.

As the inorganic positive hole injection material, p-Si and p-SiC are usable.

The positive hole injection layer can be formed by making the positive hole injection material to a thin layer by a known method such as a vacuum evaporation method, a spin coat method a casting method and a LB method. The thickness of the positive hole injection layer is preferably approximately from 5 nm to 5 μm even though there is no specific limitation thereon.

The electron injection layer which is provided according to necessity is a layer having a function of transporting electrons injected to the cathode to the light emission layer. The material of the electron injection layer may be optionally selected from known compounds.

The electron injection layer has a function of to easily inject electron from the cathode, a function of to transport electron and to inhibit positive hole, and is provided when a compound having a relatively low electron transportation is used in the light emission layer.

The electron injection layer may be separated into a layer having the electron injection ability and a layer having a electron transportation ability.

Examples of the material of the electron injection layer (hereinafter referred to electron injection material) include a nitro-substituted fluorene derivative, a diphenylquinone derivative, a thiopyrane dioxide derivative, a heterocyclic tetracroxylic acid anhydride such as naphthaleneperylene, a carbodiimide, a fluolenylidenemethane derivative, an anthraquinodimethane and anthorone derivative, and a oxadiazole derivative. It is found by the inventors that a series of electron transmission compounds described in JP O.P.I. No. 59-194393 can be used as the electron injection material even though the compounds are described in the publication as the material for making the light emission layer. Moreover, a thiadiazole derivative which is formed by substituting the oxygen atom in the oxadiazole ring of the foregoing oxadiazole derivative by a sulfur atom, arylamino- or alkylamino-substituted triazole derivatives and a quinoxaline derivative having a quinoxaline ring known as an electron withdrawing group are usable as the electron injection material.

A metal complex of 8-quinolynol derivative such as aluminum tris-(8-quinolynol) (Alq), aluminum tris-(5,7-dichloro-8-quinolynol), aluminum tris-(5,7-dibromo-8-quinolynol), aluminum tris-(2-methyl-8-quinolynol), aluminum tris-(5-methyl-8-quinolynol), zinc bis-(8-quinolynol) (Znq), and a metal complex formed by replacing the central metal of the foregoing complexes with another metal atom such as In, Mg, Cu, Ca, Sn, Ga or Pb, can be used as the electron injection material. Furthermore, metal complex type materials described in the reference A at pages 38-48, a metal free and metal-containing phthalocyanine, and a derivative thereof in which the terminal of each of the compounds is replaced by a substituent such as an alkyl group or a sulfonic acid group are also preferably used as the electron injection material. An inorganic semiconductor such as n-Si and n-SiC may also be used as the electron injection material.

The electron injection layer can be formed by making the electron injection material to a thin layer by a known method such as a vacuum evaporation method, a spin coat method a casting method and a LB method. The thickness of the positive hole injection layer is preferably approximately from 5 nm to 5 μm even though there is no specific limitation thereon.

The electron injection layer may have a single layer structure containing one or more kinds of the electron injection material or a multi-layered structure composed of plural layers having the same or different composition.

Next, the inorganic fluorescent substance and the rare-metal complex fluorescent substance relating to the invention are described below.

In the invention, a substance capable of absorbing light emitted from the electroluminescent material and emitting light different from the light emitted from the electroluminescent material in the maximum emission wavelength thereof may be used as the inorganic fluorescent substance and the rare-metal complex fluorescent substance.

In the above-mentioned, the difference between the maximum emission wavelength of the light emitted from the fluorescent substance and that of the light emitted from the electroluminescent material is 10 nm or more.

The inorganic fluorescent substance or the rare-earth metal fluorescent substance to be contained in the electroluminescent element according to the invention is preferably one emitting fluorescent light having the maximum emission wavelength within the range of from 400 nm to 700 nm.

It is preferable that the inorganic fluorescent substance or the rare-earth metal fluorescent substance to be contained in the electroluminescent element according to the invention preferably contains at least one capable of emitting light having the maximum emission wavelength larger by 180 nm or more than the maximum emission wavelength of light emitted from the electroluminescent material.

It is preferable for full color displaying that the electroluminescent element of the invention has a color conversion layer containing at least one kind of the inorganic fluorescent substance or the rare-earth metal fluorescent substance emitting light having the maximum emission wavelength of from 400 nm to 500 nm, at least one kind of those emitting light having the maximum emission wavelength of from 501 nm to 600 nm and at least one kind of those emitting light having the maximum emission wavelength of from 601 nm to 700 nm when absorbs the light emitted from the electroluminescent material.

The color conversion layer may be take various forms according to the use.

For example, when a flat white light emission display is prepared, a mixture of a blue light emission fluorescent substance and a yellow light emission fluorescent substance or a mixture of a blue, green and red light emission fluorescent substances. In such the case, the fluorescent substances may be uniformly coated without any pattern.

When a multi-color conversion filter such as a color filter for a liquid display is required, a fluorescent substance emitting light having required color is patterned in a form of stripe, dot or mosaic. The patterning can be carried out by the method usually applied for producing usual color filter of liquid display. In concrete, the method such as a pigment dispersion method, printing method and an ink-jet method may be applied.

Although there is no limitation on the inorganic fluorescent substance or the rare-earth metal fluorescent substance to be used in the invention, ones comprised of a combination of metal oxide such as $YO_2S$, $Zn_2SiO_4$ and $Ca_5(PO_4)_3Cl$, or a sulfide such as ZnS, SrS and CaS as the mother crystal and an ion of rare-earth metal such as Ce, Pr, Nd, Pm, Sm, Eu, Gd, Tb, Dy, Ho, Er, Tm and Yb or an ion of metal such as Ag, Al, Mn and Sb as an activator or a coactivator is preferred.

The metal oxide is preferable as the mother crystal, for example, aluminum oxide, silicon oxide, phosphate and halophosphate each substituted with an alkali-earth metal such as $(X)_3Al_{16}O_{27}$, $(X)_4Al_{14}O_{25}$, $(X)_3Al_2Si_2O_8$, $(X)_4Si_2O_8$, $(X)_2Si_2O_4$, $(X)_2P_2O_7$, $(X)_2P_2O_5$, $(X)_5(PO_4)Cl$ and $(X)_2Si_3O_8\text{-}2(X)Cl_2$ are cited as the typical mother crystal, wherein X is an alkali-earth metal and the alkali-earth metal may be single metal composition or a mixture of 2 or more kinds of the metal.

Preferable mother crystal other than those includes an oxide or sulfide of zinc, an oxide of a rare-earth metal such as yttrium, gadolinium and lanthanum, or one in which a part of the oxide atoms is replaced by a sulfur atom, a sulfide of rare-earth metal and the oxide or the sulfide of such the rare-earth metal in which an optional metal element is combined.

Preferable examples of the mother crystal are shown below; ZnS, $Y_2O_2S$, $Y_3Al_5O_{12}$, $Y_3SiO_3$, $Zn_2SiO_4$, $Y_2O_3$, $BaMgAl_{10}O_{17}$, $BaAl_{12}O_{19}$, $(Ba,Sr,Mg)O.aAl_2O_3$, $(Y,Gd)BO_3$, $YO_3$, $(Zn,Cd)S$, $SrGa_2S_4$, SrS, GaS, $SnO_2$, $Ca_{10}(PO_4)_6(F,Cl)_2$, $(Ba,Sr)(Mg,Mn)Al_{10}O_{17}$, $(Sr,Ca,Ba,Mg)_{10}(PO_4)Cl_2$, $(La,Ce)PO_4$, $CeMgAl_{11}O_{19}$, $GdMgB_5O_{10}$, $Sr_2P_2O_7$, $Sr_4Al_{14}O_{25}$, $Y_2SO_4$, $Gd_2O_2S$, $Gd_2O_3$, $YVO_4$ and $Y(P,V)O_4$.

A part of the element of the above-listed mother crystal, the activator and the coactivator each may be replaced by an element of the same tribe in the periodic table, and there is no limitation on the element composition thereof as long as one capable of emitting visible light by absorbing ultraviolet or violet region of light.

In the invention, an ion of lanthanoid element such as La, Eu, Tb, Ce, Yb and Pr, and an ion of metal such as Ag, Mn, Cu, In and Al is preferred as the activator or coactivator of the inorganic fluorescent substance. The doping amount of the activator or the coactivator is preferably from 0.001 to 100 mole-%, more preferably 0.01 to 50 mole-% of the mother crystal.

The activator and the coactivator are doped in the crystal by replacing a part of the ion constituting the mother crystal by the ion such as the lanthanoid ion. The exact composition of the crystal of the fluorescent substance can be described as follows. However, the value of x and y in the following formulas are not described except in the case a specific note is attached since the amount of the activator tends to no influence on the fluorescent property of the substance. For example, $Sr_{4-x}Al_{14}O_{25}:Eu^{2+}_x$ is described in $Sr_4Al_{14}O_{25}:Eu^{2+}$.

Although examples of typical inorganic fluorescent substance composed of the mother crystal and the activator are described below, the fluorescent substance usable in the invention is not limited to them: $(Ba_zMg_{1-z})_{3-x-z}Al_{16}O_{27}:Eu^{2+}_x,Mn^{2+}_y$, $Sr_{4-x}Al_{14}O_{25}:Eu^{2+}_x$, $(Sr_{1-z}Ba_z)_{1-x}Al_2Si_2O_8:Eu^{2+}_x$, $Ba_{2-x}SiO_4:Eu^{2+}_x$, $Sr_{2-x}SiO_4:Eu^{2+}_x$, $Mg_{2-x}SiO_4:Eu^{2+}_x$, $(BaSr)_{1-x}SiO_4:Eu^{2+}_x$, $Y_{2-x-y}SiO_5:Ce^{3+}_x,Tb^{3+}_y$, $Sr_{2-x}P_2O_5:Eu^{2+}_x$, $Sr_{2-x}P_2O_7:Eu^{2+}_x$, $(Ba_yCa_zMg_{1-y-z})_{5-x}(PO_4)_3ClEu^{2+}_x$ and $Sr_{2-x}Si_3O_8\cdot 2SrI_2:Eu^{2+}_x$, in which x, y and z are each an optional number.

Inorganic fluorescent substances preferably usable in the invention are shown below. However, the inorganic fluorescent substance usable in the invention is not limited to these compound.

Blue light-emissive inorganic fluorescent compound
   (BL-1) $Sr_2P_2O_7:Sn^{4+}$
   (BL-2) $Sr_4Al_{14}O_{25}:Eu^{2+}$
   (BL-3) $BaMgAl_{10}O_{17}:Eu^{2+}$
   (BL-4) $SrGa_2S_4:Ce^{3+}$
   (BL-5) $CaGa_2S_4:Ce^{3+}$
   (BL-6) $(Ba, Sr)(Mg,Mn)Al_{10}O_{17}:Eu^{2+}$
   (BL-7) $(Sr,Ca,Ba,Mg)_{10}(PO_4)_6Cl_2:Eu^{2+}$
   (BL-8) $BaAl_2SiO_8:Eu^{2+}$

[Green Light-Emissive Inorganic Fluorescent Compound]
   (GL-1) $(BaMg)Al_{16}O_{27}:Eu^{2+},Mn^{2+}$
   (GL-2) $Sr_4Al_{14}O_{25}:Eu^{2+}$
   (GL-3) $(SrBa)Al_2Si_2O_8:Eu^{2+}$
   (GL-4) $(BaMg)_2SiO_4:Eu^{2+}$
   (GL-5) $Y_2SiO_5:Ce^{3+},Tb^{3+}$
   (GL-6) $Sr_2P_2O_7-Sr_2B_2O_5:Eu^{2+}$
   (GL-7) $(BaCaMg)_5(PO_4)_3Cl:Eu^{2+}$
   (GL-8) $Sr_2Si_3O_8\cdot 2SrCl_2:Eu^{2+}$
   (GL-9) $Zr_2SiO_4,MgAl_{11}O_{19}:Ce^{3+},Tb^{3+}$
   (GL-10) $Ba_2SiO_4:Eu^{2+}$
   (GL-11) $Sr_2SiO_4:Eu^+$
   (GL-12) $(BaSR)SiO_4:Eu^{2+}$

[Red Light-Emissive Inoroganic Fluorescent Compound]
   (RL-1) $Y_2O_2S: Eu^{3+}$
   (RL-2) $YAlO_3:Eu^{3+}$
   (RL-3) $Ca_2Y_2(SiO_4)_6:Eu^{3+}$
   (RL-4) $LiY_9(SiO_4)_6O_2:Eu^{3+}$
   (RL-5) $YVO_4:Eu^{3+}$
   (RL-6) $CaS:Eu^{3+}$ In the invention, an inorganic fluorescent substance prepared by a buildup method without mechanical crushing process in the production course is preferably used for emitting high luminance light. Ones produced by a liquid phase methods such as a Sol-Gel method are particularly preferred. As to the composition thereof, ones having an inorganic oxide as the mother crystal are preferred.

The Sol-Gel synthesis method is a method in which the synthesis basically started from a solution and the material is synthesized at a temperature lower than the melting point thereof through a sol and gel states as described in detail in Sumio Sakka "Application of Sol-Gel Method" 1997, Agnes Shofuusha. The Sol-Gel method in the invention is a method in which a reaction in a liquid phase is carried out in at least one step thereof. Such method can be established from the method carried out by a reaction in a molten state applied for producing an usual inorganic fluorescent substance. The production procedure by Sol-Gel method is a method in which necessary amounts of elements to be used as the mother crystal, activator or coactivator in a form of metal alkoxide such as tetramethoxysilane $Si(OCH_3)_4$ and europium-2,4-pentanedionate $Eu^{3+}$ $(CH_3COCH=C(OCH_3))_3$ metal complex, double alkoxide prepared by addition of an elemental metal to an organic solvent solution of the above metal alkoxide or metal complex such as $Mg[Al(OBu)_3]_2$ which is prepared by addition of metallic magnesium to a 2-butanol solution of $Al(OBu)_3$, metal halide, organic acid salt of metal or elemental metal are mixed and thermally or chemically polymerized or condensed. The product may be subjected to a baking or reducing treatment according to necessity.

The Metal in the metal alkoxide, metal halide, metal salt and metal to be used in the invention includes "metals" defined in the Periodical Table, all element of "transition metals", all elements of actinoid and boron, carbon and silicon which are usually defined as "non metals".

The inorganic fluorescent substance may be subjected to a surface property improving treatment. The method for such the treatment includes a chemical treatment by silane coupling agent, a physical treatment by an addition of fine particle having a size of submicron, and a combination thereof.

All compounds described in "Catalogue of NUC silicone silane coupling agent", Aug. 2nd 1997, published by Nihon Unicar Co., Ltd., are usable as the silane coupling agent in the invention. Concrete examples of such the compound include β-(3,4-epoxycyclohexyl)ethyltrialkoxysilane, glycidyloxyethyltriethoxysilane, γ-acryloyloxy-n-propyl-tri-n-propyloxysilane, γ-methacryloyloxy-n-propyl-n-porpyloxysilane, di-(γ-acryloyloxy-n-propyl)-di-n-propyloxysilane, acryloyloxydimethoxyethylsilane, N-β-(aminoethyl)-γ-aminopropyltrimethoxysilane, N-β-(aminoethyl)-γ-aminopropylmethyldimethoxysilane, γ-aminopropyltriethoxysilane, N-phenyl-γ-aminopropyltrimethoxysilane and γ-mercaptopropyltrimethoxysilane.

The fine particle usable in the invention is preferably an inorganic fine particle such as silica, titania, zirconia and zinc oxide.

When the fluorescent substance is produced by the Sol-Gel method, a procedure may be applied in which a precursory solution of the fluorescent substance or a solution containing a primary particle of the fluorescent substance is patterned on a transparent substrate by a printing method or an ink-jet method and then the pattern is subjected to a crystallizing treatment such as a baking or reduction treatment or a treatment for making a high luminance emission ability.

The rare-earth metal complex fluorescent substance usable in the invention includes ones containing Ce, Pr, Nd, Pm, Sm, Eu, Gd, Tb, Dy, Ho, Er, Tm or Yb. The organic ligand composing the complex may be either an aromatic one or non aromatic one, and an aromatic organic ligand having a absorption in the region of not less than 250 nm is preferred. Compounds represented by the following Formula 1 or Formula R2 is more preferable.

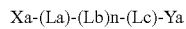

Xa-(La)-(Lb)n-(Lc)-Ya        Formula 1

In the above formula, La, Lb and Lc are each independently an atom having 2 or more bonds, n is 0 or 1, Xa is a substituent having an atom capable of coordinating at a position adjacent to La, and Ya is a substituent having an atom capable of coordinating at a position adjacent to Lc. An optional portion of Xa and La, or an optional portion of Ya and Lc, each may be bonded with together to form a ring. Moreover, at least one of an aromatic carbon hydride ring and an aromatic heterocyclic ring exists in the complex molecule, provided that the aromatic carbon hydride ring and the aromatic heterocyclic ring may be absent when Xa-(La)-(Lb)n-(Lc)-Ya represents β-diketone derivatives, β-ketoester derivatives, β-ketoamide deriavatives, crown ether in which an oxygen atom of the above-described ketone is replaced by an optional number of sulfur atoms or —N(R$_1$)— groups, an aza-crown ether, a thia-crown ether or a crown ether in which an oxygen atom is replaced by an optional number of sulfur atoms or —N(R$_1$)— groups.

In Formula 1, the atom capable of coordinating represented by Xa or Ya is preferably an oxygen atom, a nitrogen atom, a sulfur atom, a selenium atom or a tellurium atom, and an oxygen atom, a nitrogen atom and a sulfur atom are particularly preferred.

The atom having two or more bonding hand represented by La, Lb or Lc in Formula 1 are preferably a carbon atom, an oxygen atom, a nitrogen atom, a silicon atom and a titanium atom, although there is no limitation on such the atom. The carbon atom is preferred among them.

Concrete examples of the organic ligand represented by Formula 1 are shown below. However the organic ligand usable in the invention is not limited to the followings.

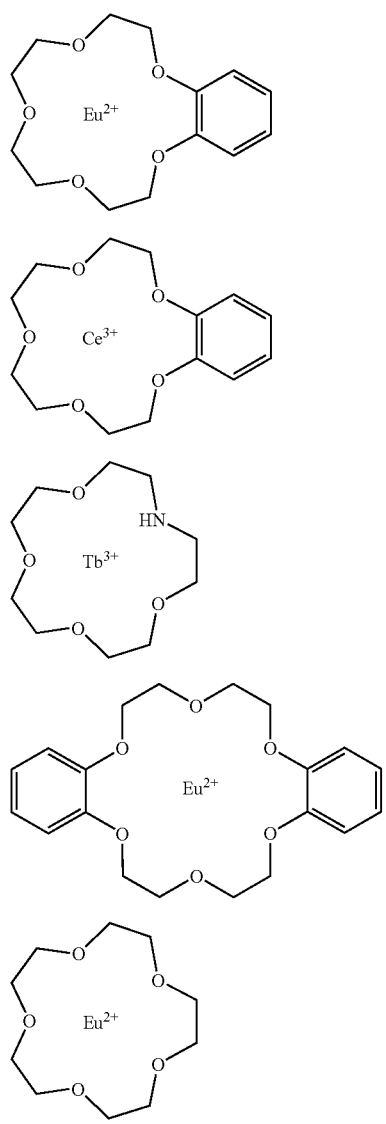

RE-1

RE-2

RE-3

RE-4

RE-5

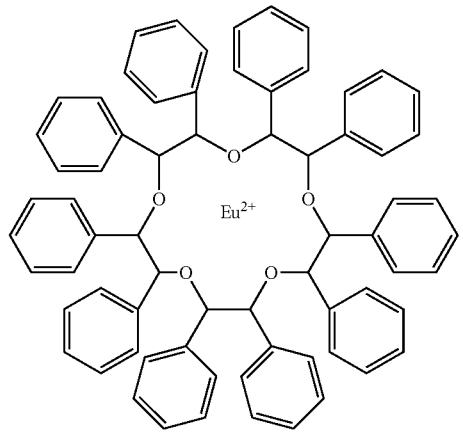

RE-6

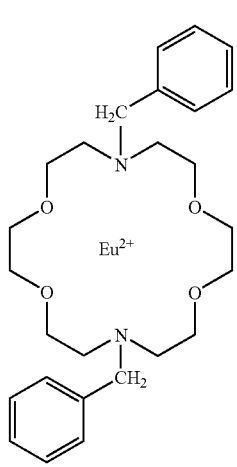

RE-7

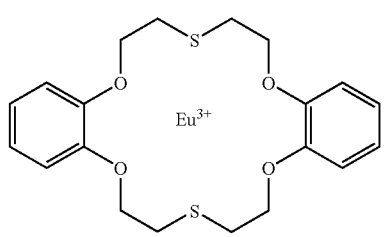

RE-8

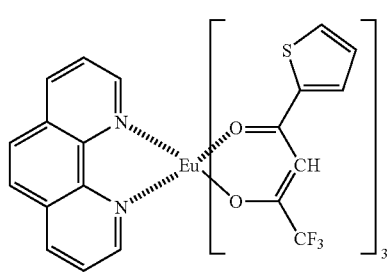

RE-9

-continued
RE-10
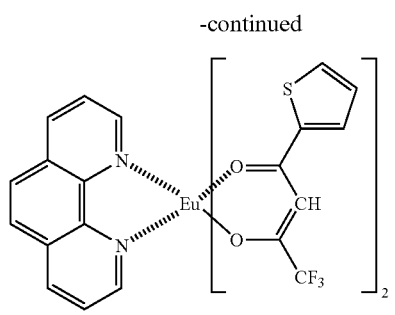
RE-11
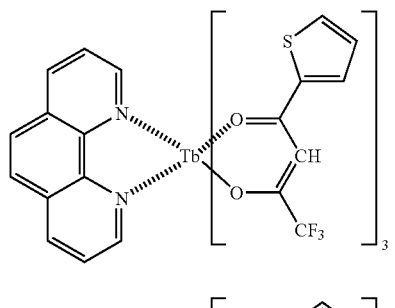
RE-12
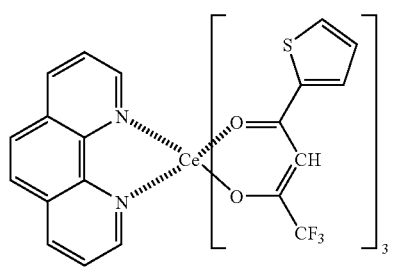
RE-13
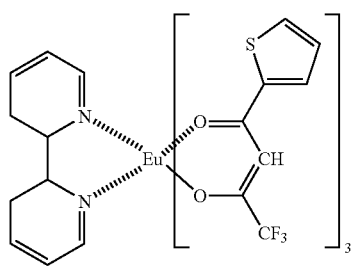
RE-14
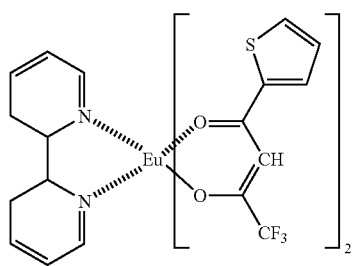
RE-15
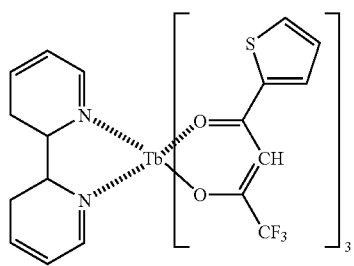
-continued
RE-16
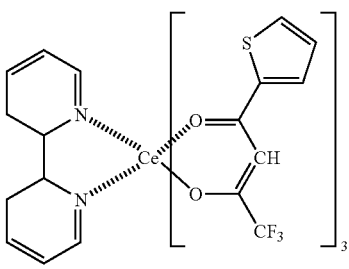
RE-17
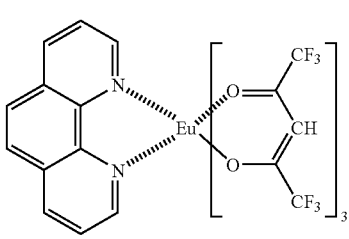
RE-18
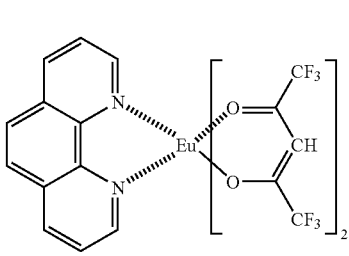
RE-19
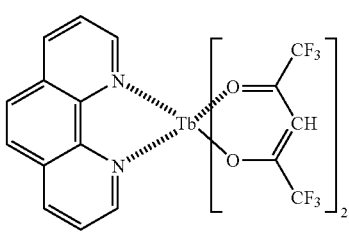
RE-20
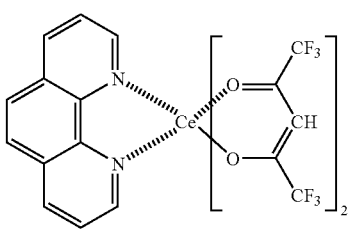
RE-21
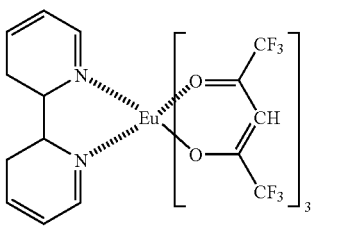

-continued
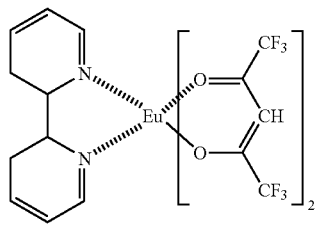
RE-22
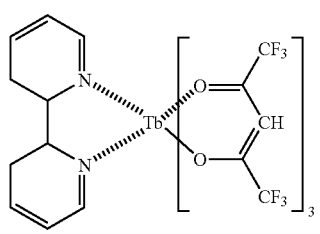
RE-23
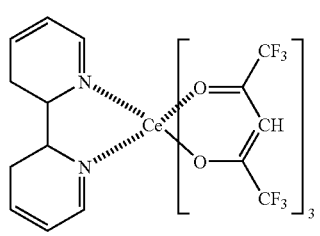
RE-24
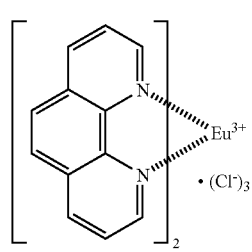
RE-25
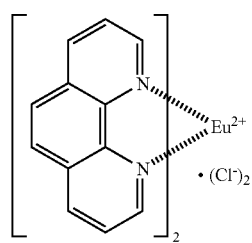
RE-26
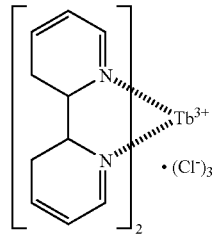
RE-27
-continued
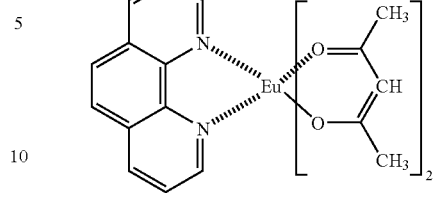
RE-28
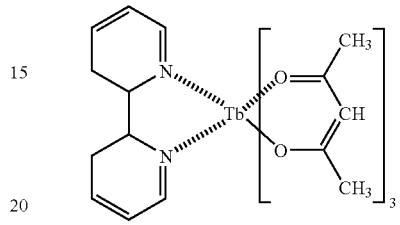
RE-29
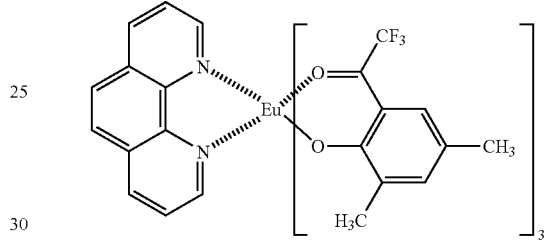
RF-1
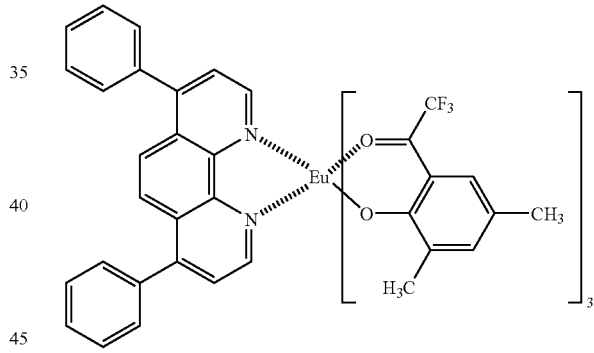
RF-2
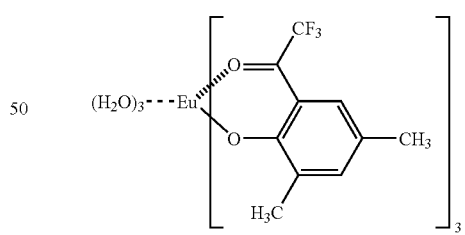
RF-3
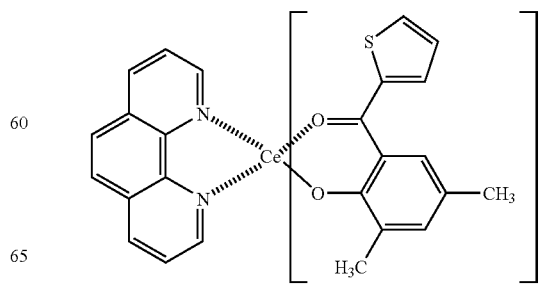
RF-4

-continued
RF-5
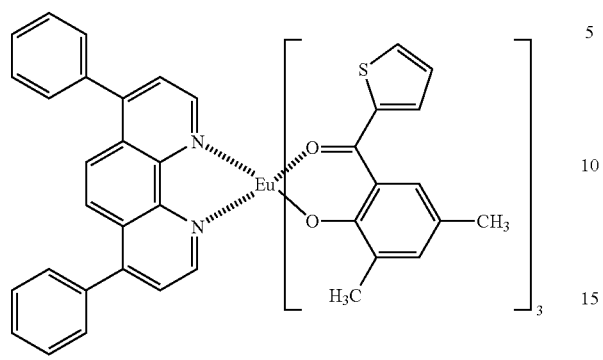
RF-6
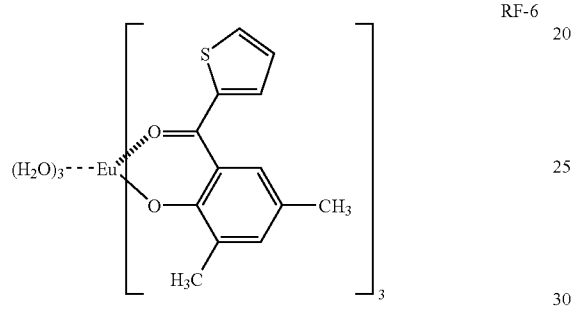
RF-7
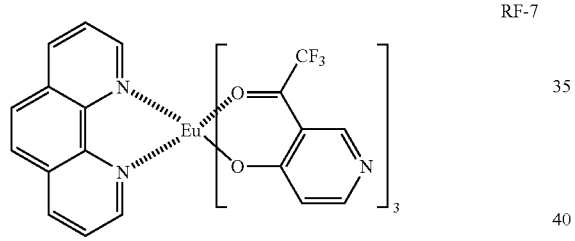
RF-8
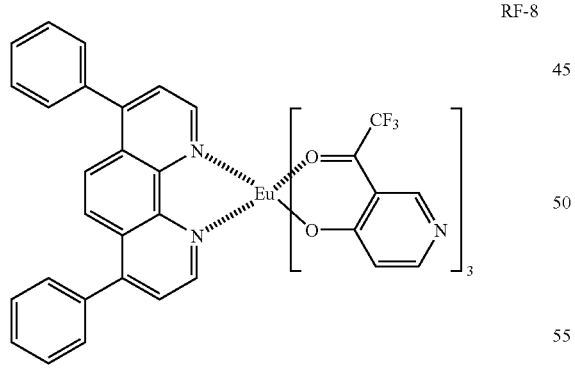
RF-9
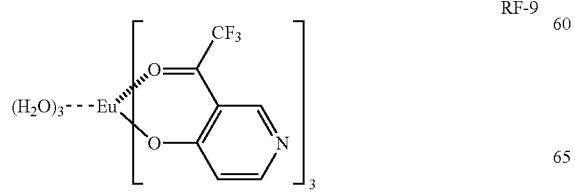
-continued
RF-10
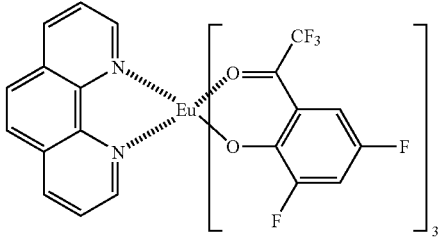
RF-11
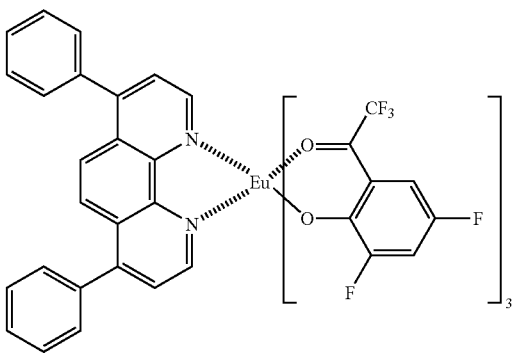
RF-12
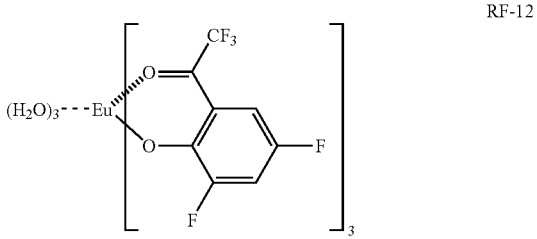
RF-13
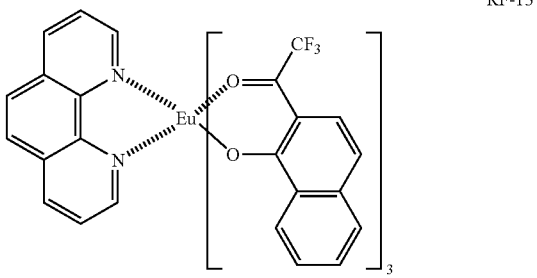
RF-14
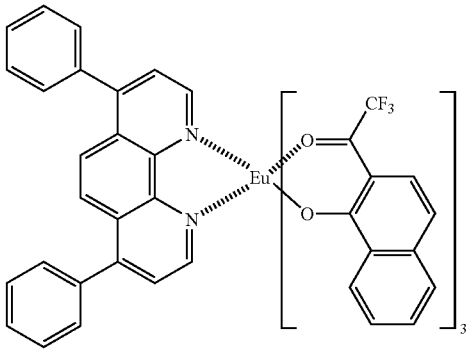

-continued

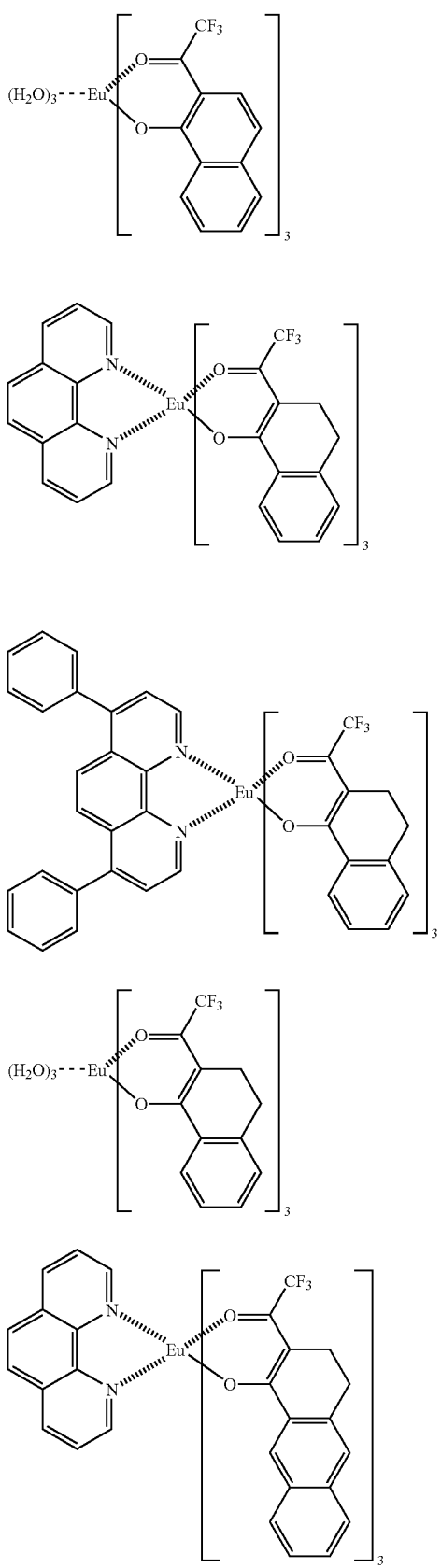

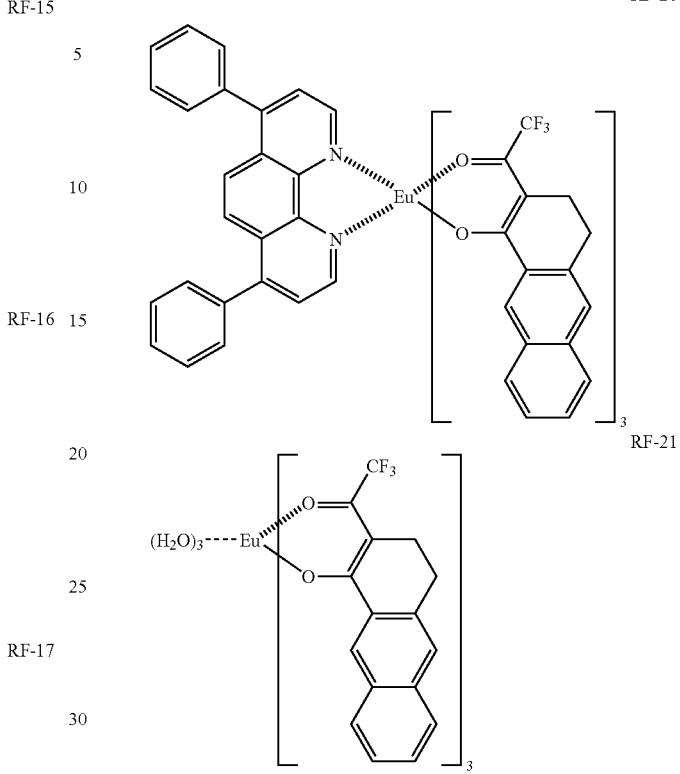

Among the group represented by $R_{101}$ in Formula R2, an alkyl group, a cycloalkyl group, an aryl group and a heterocyclic group are preferred, and an alkyl group substituted with a fluorine atom, a cycloalkyl group substituted with a fluorine atom, an aryl group and an aromatic heterocyclic group are particularly preferred.

Among the substituent represented by $Y_{101}$ in Formula R2, an oxygen atom is preferable.

In Formula R2, a benzene ring, a pyridine ring a thiophene ring and furan ring are preferable among the 4- to 8-member rings formed by $Z_{101}$ and the double bonded carbon atoms.

Although concrete examples of rare-earth metal complex fluorescent substance having an anion ligand are shown below, the invention is not limited thereto.

In the invention, the color conversion filter is a wavelength conversion element for changing the color of light emitted from a light source to a required color, which is basically a wavelength conversion element capable of converting the wavelength of the light from the light source to a wavelength longer 10 nm or more than that of the light of the light source. Such the color filter is practically used, for example, as a filter for color display (a color conversion filter capable of emitting blue, green and red light which is composed of strips of elements each converting blue light from the light source to green or red light) described in JP O.P.I. Nos. 3-152897, 9-245511 and 11-297477, a white light emission filter (a color conversion filter for emitting wide range visible light from 400 nm to 700 nm) for lighting or a back light of liquid crystal display, a filter for partially lighting of a neon sign or a meter of a car (a color conversion filter for displaying required color at a required portion).

EXAMPLES

The invention is described in detail below according to examples. However, the embodiment of the invention is not limited to the examples.

Example 1-1

Preparation Electroluminescent Element UV-1

A pattern was formed on a substrate composed of a glass plate on which a layer of 150 nm of ITO was formed (NA-45 manufactured by NH Technoglass Co. Ltd.) to prepare an anode. Thus prepared transparent substrate carrying the transparent ITO electrode was subjected to ultrasonic washing by isopropyl alcohol, and dried by dried nitrogen gas. Then the substrate was cleaned for 5 minutes by UV and ozone. Thus obtained transparent substrate was fixed on a substrate holder of an usual vacuum evaporation apparatus available on the market. Besides, 200 mg of N,N'-diphenyl-N,N'-bis(3-methylphenyl) [1,1'-biphenyl]-4,4'-diamine (TPD), 200 mg of p-quaterphenyl (PQP), and 200 mg of tris(8-hydroxyquinolinate)-aluminum (Alq$_3$) were each respectively put in different molybdenum resistive heating boats, and the boats were installed in the vacuum evaporation apparatus. Then the pressured in the vacuum tank was reduced by $4 \times 10^{-4}$ Pa. The heating boat carrying TPD was heated by 220° C. by applying an electric current to evaporate TDP on the transparent substrate with a evaporation rate of from 0.1 to 0.3 nm/sec. Thus a positive hole injection layer having a thickness of 60 nm was provided. Then, the heating boat carrying PQP was heated by 220° C. by applying an electric current to evaporate PQP on the positive hole injection layer with a evaporation rate of from 0.1 to 0.3 nm/sec. Thus a light emission layer having a thickness of 40 nm was prepared. Moreover, the heating boat carrying Alq$_3$ was heated by 250° C. by applying an electric current to evaporate Alq$_3$ on the light emission layer with a evaporation rate of 0.1 nm/sec. Thus an electron injection layer having a thickness of 20 nm was prepared. The temperature of the substrate at the evaporation was a room temperature. Then the vacuum tank was opened, a stainless steel mask having a rectangular hole was attached on the electron injection layer. On the other hand, 3 g of magnesium was put in a molybdenum heating boat and 0.5 g of silver was put in an evaporation basket made by tungsten, and they were installed in the evaporation apparatus. The pressure in the vacuum tank was reduced by $2 \times 10^{-4}$ Pa, and magnesium was evaporated in a rate of from 1.5 to 2.0 nm/sec by applying an electric current to the boat carrying magnesium. At the same time the basket carrying silver was heated so that the silver was evaporated in a rate of 0.1 nm/sec. Thus electroluminescent element UV-0.1 was prepared having a facing electrode composed of a mixture of magnesium and silver.

The element was set so that the ITO electrode was made as anode and the facing electrode was set as cathode, and applied a direct current of 10 V. Light having the maximum emission at a wavelength of 380 nm was emitted.

Example 1-2

Preparation of Comparative Electroluminescent Element B-1

Comparative electroluminescent element B-1 was prepared in the same manner as in electroluminescent element 1-1 except that the light emission compound p-quaterphenyl (PQP) was replaced by 4,4'-bis (2,2'-diphenylvinyl)biphenyl (DPVBi). The element was set so that the ITO electrode was made as anode and the facing electrode was set as cathode, and applied a direct current of 10 V. Blue light having the maximum emission at a wavelength of 475 nm was emitted.

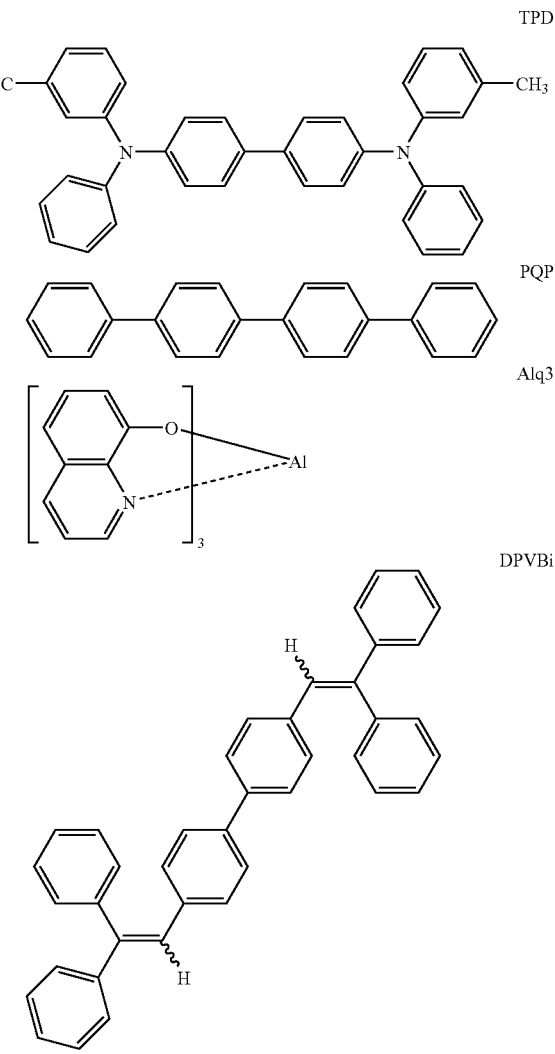

Example 2-1

Synthesis of Exemplified Compound GL-10, Ba$_2$SiO$_4$:Eu$^{2+}$

An alkaline solution was prepared by adding 150 ml of ethanol and 150 ml of water to an ammonia water containing 0.016 moles of ammonia. Then a solution composed of 150 ml of ethanol and, dissolver therein, 8.33 g of tetraethoxysilane (0.04 moles) and 0.079 g (0.2 mmoles) of europium (III) acetylacetonate complex dihydrate was dropped into the alkaline solution in a rate of 1 ml/min while stirring at a room temperature so as to form a sol liquid. Thus obtained sol liquid was concentrated about 15 times (about 30 ml) in an evaporator, and 295 ml of 0.3 moles/l barium nitrate aqueous solution was added for gelling the sol liquid.

Thus obtained swelled gel was ripened for one knight at 60° C. in a closed vessel. Then the gel was dispersed in about 300 ml of ethanol by stirring and separated by a vacuum filtration using a filter paper Advantec 5A. The separated matter was dried at a room temperature. The dried gel was subjected to a heating treatment for 2 hours at 1000° C. in an atmosphere of 5% $H_2$—$N_2$. Thus 2.7 g of inorganic fluorescent substance GL-10 ($Ba_2SiO_4:Eu^{2+}_{0.005}$) was obtained which emits pale green light under sun light.

The composition of GL-10 was analyzed by XRD spectrum. It was found that the main composition was $Ba_2SiO_4$, and the slightly contained sub-composition was $BaSiO_4$ and $Ba_3SiO_5$.

It was found that GL-10 was a green light emitting fluorescent substance having an average diameter of 10.5 μm and the maximum emission wavelength thereof was 500 nm when excited by light of 405 nm.

Red light emission fine particle inorganic fluorescent substance RL-5 (average diameter: approximately 0.85 pm) emitting light having the maximum emission at 610 nm (exciting light: 375 nm), and Blue light emission fine particle inorganic fluorescent substance BL-3 (average diameter: approximately 0.90 μm) emitting light having the maximum emission at 432 nm (exciting light: 375 nm) were prepared in a manner similar to that in GL-10.

Example 2-2

Improve of the Surface Property of the Fine Particle Inorganic Fluorescent Substance To 0.16 g of aerogel having an average diameter of 5 nm, 15 g of ethanol and 0.22 g of γ-glycidoxypropyltriethoxy-silane and the mixture was stirred for 1 hour in an open vessel at a room temperature. The mixture and 20 g of inorganic fluorescent substance BL-10 were put into a mortar and was sufficiently ground. The ground mixture was heated for 2 hours at 70° C. in an oven, and further heated at 120° C. for 2 hours in an oven. Thus GL-10 improved in the surface property.

The surface property of RL-5 and that of BL-3 were also improved in the similar manner.

Example 2-3

Improvement of the Surface Property of the Comparative Inorganic Fluorescent Substance The surface property of Comparative fluorescent substance KX-605 ($Zn_2SiO_4:Mn^{2+}$, manufactured by Kasei-Optonics Co., Ltd.) was improved in the same manner described in Example 2-2 except that inorganic fluorescent substance RL-5 was replace by KX-605. KX-605 was a fluorescent substance having an average particle size of 7 μm and emitting light having the maximum emission wavelength of 570 nm when excited by light of 343 nm.

Example 3-1

Preparation of Color Conversion Filter Using the Inorganic Fluorescent Substance.

To 10 g of the above-obtained red light emission inorganic fluorescent substance RL-5 improved in the surface property thereof, 30 g of a butyral resin BX-1 dissolved in 300 g of a mixture of toluene/methanol in a ratio of 1/1 was added and stirred, and the mixture was coated on a glass plate so as to form a layer having a wet thickness of 200 μm. The coated glass plate was heated for 4 hours at 100° C. in an oven for drying. Thus color conversion filter F-1 according to the invention was prepared.

Color Conversion Filters F-2 and F-3 each coated with green light emission inorganic fluorescent substance GL-10 and blue light emission inorganic substance BL-3, respectively, in a manner similar to that in color conversion filter F-1 were prepared.

Moreover, comparative color conversion filter F-4 coated with comparative inorganic fluorescent substance KX-605 was prepared in the same manner.

Color conversion filters F-1, F-2 and F-3 according to the invention were almost colorless and transparent. In contrast, comparative color conversion filter F-4 was whitely turbid and had almost no light transparency.

The visible light transparency of F-1, F-2, F-3 and F-4 were each 54%, 57%, 57% and 4%, respectively.

Example 3-2

Preparation of Color Conversion Filter Using a Rare-earth Metal Complex Fluorescent Substance In 30 g of butyral resin BX-1 dissolved in 300 g of a mixture of toluene/ethanol in a ratio of 1/1, 3 g of rare-earth metal complex fluorescent substance RE-17 according to the invention was dissolved. The solution was coated on a 80 pm polyethersulfon (PES) film in a wet thickness of 150 μm and dried to prepare red light emission color conversion filter F-5 according to the invention.

On the other hand, green light emission color conversion filter F-6 according to the invention was prepared in the same manner as in F-5 except that RE-23 was used in place of RE-17.

Furthermore, green light emission color conversion filter F-7 according to the invention was prepared in the same manner as in F-5 except that RE-1 was used in place of RE-17.

Example 3-3

Preparation of Color Conversion Filter Using a Fluorescent Dye

Comparative color conversion filter F-8 which emits green light when excited by blue light was prepared in the same manner as in Example 3-2 except that RE-17 was replaced by 2.0 g of Coumalin 6 and 0.5 g of fluorescent pigment Solvent Yellow 116.

Comparative color conversion filter F-9 which emits red light when excited by blue light was prepared in the same manner as in Example 3-2 except that RE-17 was replaced by 1.0 g of fluorescent pigment Solvent Yellow 116 and 0.5 g of Basic Violet 110 and 0.5 g of Rhodamine 6G.

Color conversion filter F-1 prepared in Example 3-3 was put on electroluminescent element UV-1 prepared in Example 1-1, and a direct current of 12 V was applied to the electroluminescent element in a atmosphere of dried nitrogen gas. Red light was emitted from the color conversion filter. The luminance of the light emitted from the color conversion filter was 26 cd/$m^2$ and the coordinate point in the CIE color coordinates of the light was x=0.64 and y=0.29.

Example 4-1

Evaluation of Light Emission Efficiency and Life Time of the Electroluminescent Element The above-mentioned color conversion filters of the invention and the comparative color conversion filter were each placed on electroluminescent element UV-1 or comparative electroluminescent element B-1 so that the surface of the fluorescent layer of the color conversion filter was faced to the light emission face of the electroluminescent element, and a direct current of 12 V was continuously applied to the element to continuously emit light in a dried nitrogen gas at 23° C. The light emission efficiency (1 m/W) at the start of the continuous emission and the time for 50% reduction of the luminance (i.e., half-life time thereof) were measured. The light emission efficiency was described in a relative valuebased on the efficiency of Sample No. 7 being 100, and the half-life time of luminance was described by a relative value, based on the half-life of Sample No. 7 being 100. Results of the experiments are shown in Table 1.

TABLE 1

| Sample No. | Organic electroluminescent element | Color conversion filter | Light emission efficiency (relative value) | Color of emitted light | Half-life Time of luminance (relative value) | Note |
| --- | --- | --- | --- | --- | --- | --- |
| 1 | UV-1 | F-1 | 71 | Red | 169 | Inv. |
| 2 | UV-1 | F-5 | 68 | Red | 156 | Inv. |
| 3 | B-1 | F-9 | 25 | Red | 103 | Comp. |
| 4 | UV-1 | F-2 | 168 | Green | 186 | Inv. |
| 5 | UV-1 | F-4 | 15 | Green | 161 | Comp. |
| 6 | UV-1 | F-6 | 155 | Green | 162 | Inv. |
| 7 | B-1 | F-8 | 100 | Green | 100 | Comp. |
| 8 | UV-1 | F-3 | 111 | Blue | 186 | Inv. |
| 9 | UV-1 | F-7 | 108 | Blue | 169 | Inv. |

It is found from the results in Table 1 that the electroluminescent elements having the color conversion filter of the invention, Samples No. 1 and No. 2, are higher in the light emission efficiency and longer in the life time compared with Comparative sample No. 3. The tone of light emitted from each of the samples according to the invention was better than that of light emitted from the comparative sample.

It is found that the electroluminescent elements having the color conversion filter of the invention emitting green light. Samples No. 4 and No. 6, are considerably higher in the light emission efficiency compared with comparative sample No. 5. Furthermore, it was found that the samples according to the invention were higher in the light emission efficiency and longer in the life time compared with comparative sample No. 7 composed of the blue light emitting electroluminescent element and the color conversion filter. The tone of light emitted from the samples according to the invention was better than that of light emitted from the comparative sample Moreover, it was confirmed that samples No. 8 and No. 9 according to the invention have the highest light emission efficiency and working stability.

Example 5-1

Evaluation of LED Element

Color conversion filter F-1 or F-5 according to the invention were each placed on an ultraviolet emission LED element (UV LED Lamp manufactured by Nichia Kagaku Co., Ltd.) so that the fluorescent substance layer was placed near the LED element, and an electric voltage was applied to emit light. Red light having a high luminance and good tone was emitted. Similarly, color conversion filter F-2 and F-6 according to the invention were each placed on the LED element and an electric voltage was applied. Green light having a high luminance and good tone was emitted. Color conversion filter F-3 and F-7 according to the invention were each placed on the LED element and an electric voltage was applied. Blue light having a high luminance and good tone was emitted.

Example 6-1

Preparation of Electroluminescent Element S—N7 Using Compound N-7 According to the Invention An electroluminescent element S—N7 was prepared in the same manner as in Example 1-1 except that the light emission substance p-quarterphenyl (PQP) was replaced by compound N-7 according to the invention.

The element was set so that the ITO electrode was an anode and the facing electrode composed of silver and magnesium was a cathode, and a direct current of 10 V was applied through the electrodes. Violet light was emitted.

Example 6-2

Preparation of Electroluminescent Element S-A3 Using Compound A-3 According to the Invention An electroluminescent element S-A3 was prepared in the same manner as in Example 1-1 except that the light emission substance p-quaterphenyl (PQP) was replaced by compound A-3 according to the invention. The element was set so that the ITO electrode was an anode and the facing electrode composed of silver and magnesium was a cathode, and a direct current of 10 V was applied through the electrodes. Pale violet light was emitted.

Example 6-3

Preparation of Electroluminescent Element S—B1 Using Compound B-1 According to the Invention A electroluminescent element S—B1 was prepared in the same manner as in Example 1-1 except that the light emission substance p-quaterphenyl (PQP) was replaced by compound B-1 according to the invention.

The element was set so that the ITO electrode was an anode and the facing electrode composed of silver and magnesium was a cathode, and a direct current of 10 V was applied through the electrodes. Violet light was emitted Example 6-4

Preparation of Electroluminescent Element S-D5 Using Compound D-3 According to the Invention An electroluminescent element S-D5 was prepared in the same manner as in Example 1-1 except that the light emission substance p-quaterphenyl (PQP) was replaced by compound D-5 according to the invention.

The element was set so that the ITO electrode was an anode and the facing electrode composed of silver and magnesium was a cathode, and a direct current of 10 V was applied through the electrodes. Violet light was emitted.

Example 6-5

Preparation of Electroluminescent Element S—F1 Using Compound F-1 According to the Invention An electroluminescent element S—F1 was prepared in the same manner as in Example 11-1 except that the light emission substance p-quaterphenyl (PQP) was replaced by compound F-1 according to the invention.

The element was set so that the ITO electrode was an anode and the facing electrode composed of silver and magnesium was a cathode, and a direct current of 10 V was applied through the electrodes. Violet light was emitted.

Example 7-1

Evaluation of the Near Ultraviolet or Violet Light Emission Compound

Color conversion filter F-2 according to the invention was placed on each of the near ultraviolet or violet light emission electroluminescent elements 6-1 to 6-5 and electroluminescent element UV-1 so as to face the fluorescent substance layer of the color conversion filter to the light emission surface of the electroluminescent element. The elements were each continuously lighted by applying a direct current of 15V at 23° C. in a dried nitrogen gas atmosphere.

The limunance (cd/m$^2$) at the start of light emission and the time for 50% reduction of the light were measured. The luminance of light was described in a relative value when that of Sample 701 was set at 100, and the time for 50% reduction of luminance was described by a relative value when the 50% reduction time of Sample No. 701 was set at 100. Results of the experiments are shown in Table 2.

TABLE 2

| Sample No. | Organic electroluminescent element | Color conversion filter | Luminance of emitted light (relative value) | Color of emitted light | Half-life time of luminance (relative value) | Note |
|---|---|---|---|---|---|---|
| 701 | UV-1 | F-2 | 100 | Green | 169 | Inv. |
| 702 | S-N7 | F-2 | 178 | Green | 156 | Inv. |
| 703 | S-A3 | F-2 | 456 | Green | 103 | Inv. |
| 704 | S-B1 | F-2 | 320 | Green | 186 | Inv. |
| 705 | S-D5 | F-2 | 540 | Green | 161 | Inv. |
| 706 | S-F1 | F-2 | 312 | Green | 169 | Inv. |

As is shown in Table 2, electroluminescent elements S—N7, S-A3, S—B1, S-D5 and S—F1 each using the compounds N-7, A-3, B-1, D-5 and F-1 according to the invention, respectively, each emit considerably higher luminance and have a improved life time compared with electroluminescent element using the usual light emission material UV-1 when the same color conversion filter is applied.

Preparation of electroluminescent element using the compound according to the invention emitting light within the visual region.

Example 8-1

Preparation of Electroluminescent Element S—C8 Using Compound C-8 According to the Invention An electroluminescent element S-A3 was prepared in the same manner as in Example 1-1 except that the light emission substance p-quaterphenyl (PQP) was replaced by compound C-8 according to the invention.

The element was set so that the ITO electrode was an anode and the facing electrode composed of silver and magnesium was a cathode, and a direct current of 10 V was applied through the electrodes. Blue-green light was emitted.

Example 8-2

Preparation of Electroluminescent Element S-E1 Using Compound E-1 According to the Invention An electroluminescent element S-E1 was prepared in the same manner as in Example 1-1 except that the light emission substance p-quaterphenyl (PQP) was replaced by compound E-1 according to the invention.

The element was set so that the ITO electrode was an anode and the facing electrode composed of silver and magnesium was a cathode, and a direct current of 10 V was applied through the electrodes. Green light was emitted.

Example 8-3

Preparation of Electroluminescent Element S—F7 Using Compound F-7 According to the Invention An electroluminescent element S—F7 was prepared in the same manner as in Example 1-1 except that the light emission substance p-guaterphenyl (PQP) was replaced by compound F-7 according to the invention.

The element was set so that the ITO electrode was an anode and the facing electrode composed of silver and magnesium was a cathode, and a direct current of 10 V was applied through the electrodes. Blue light was emitted.

(Comparison of Characteristics of the Compound According to the Invention with that of a Known Compound Similar Thereto)

Example 9-1

Preparation of Comparative Electroluminescent Element CF-1

An electroluminescent element having the structure shown in FIG. 101 was prepared in the same manner as in Example 1-1.

Comparative electroluminescent element CF-1 was prepared in the same manner as in electroluminescent element UV-1 except that a layer of NPB having a thickness of 70 nm was laminated at the first layer or a positive hole transport layer, a layer of Zn(BOX) having a thickness of 50 nm was laminated at the second layer or light emission layer and a layer of OXD-7 having a thickness of 30 nm was laminated at the third layer or electron transport layer.

The element was set so that the ITO electrode was an anode and the facing electrode composed of silver and magnesium was a cathode, and a direct current of 10 V was applied through the electrodes. Blue light was emitted.

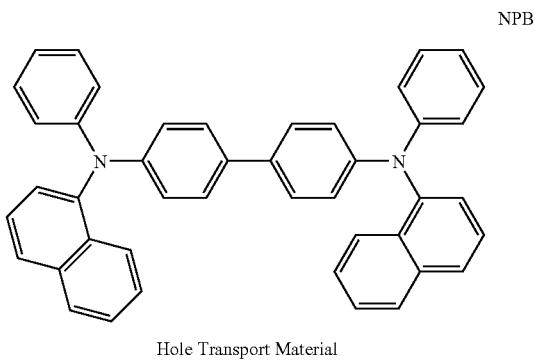

NPB

Hole Transport Material

-continued

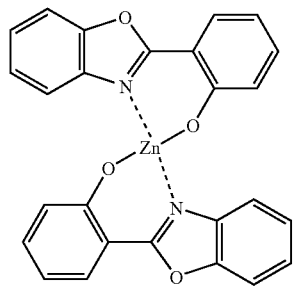

Emission Material

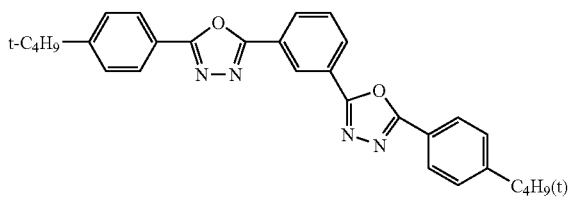

Electron Transport Material

Zn(BOX)₂

OXD-7

Example 9-2

Comparison of Characteristics of Triarylamine Type Compounds as the Positive Hole Transporting Material Electroluminescent elements 9201 to 9214 were prepared in the same manner as in electroluminescent element CF-1 prepared in Example 9-1 except that the positive hole transporting material in the first layer NPB was replaced by each of the compounds shown in Table 3.

The elements were each continuously lighted by applying a direct current of 15 V through the ITO electrode as the anode and the facing electrode composed of silver and magnesium as the cathode at 23° C. in a dried nitrogen gas atmosphere. The luminance ($cd/m^2$) at the start of light emission and the time for 50% reduction of the luminance of light were measured. The luminance of light was described in a relative value when that of Sample 9201 was set at 100, and the time for 50% reduction of luminance was described by a relative value when the 50% reduction time of Sample No. 9201 was set at 100. Results of the experiments are shown in Table 3.

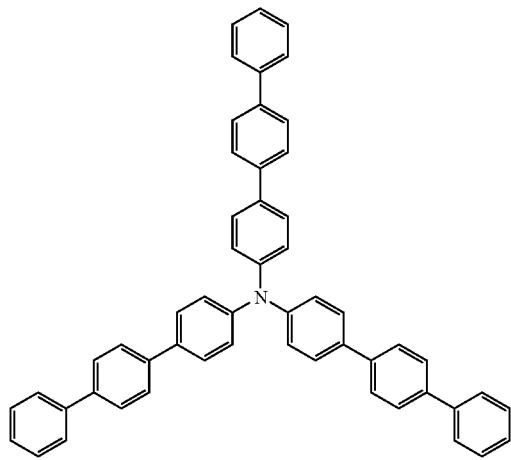

QA-1

Compound described in J. Mater. CHEM. 1992, 2(10), 1109-1110

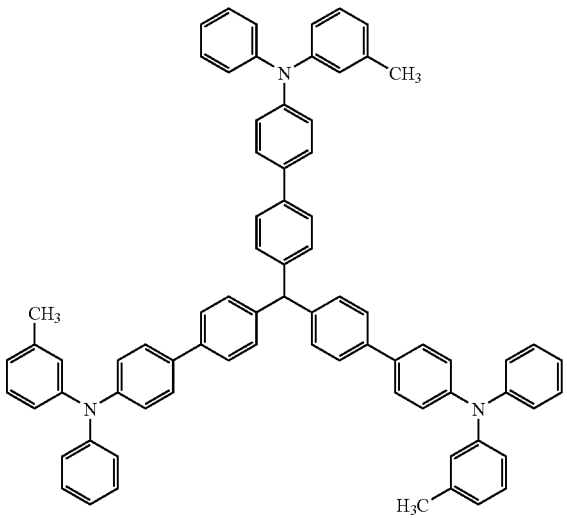

QA-2

Compound described in JP-A 10-312073

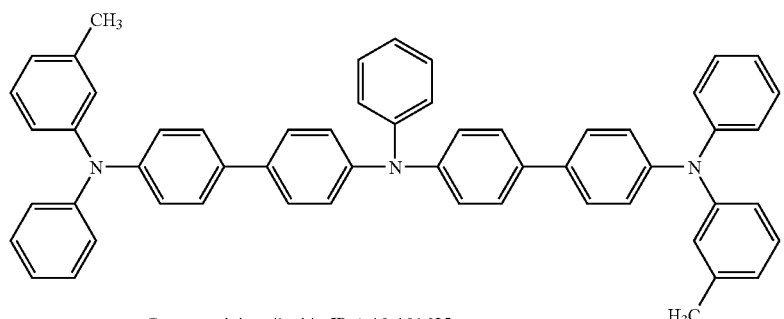

QA-3

Compound described in JP-A 10-101625

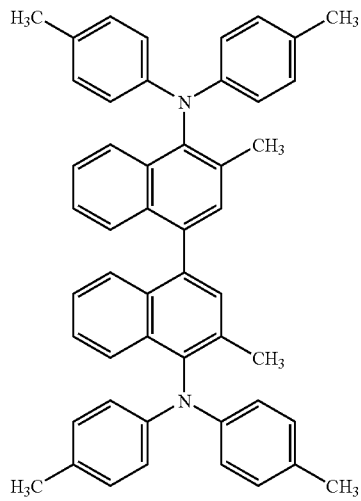

QA-4

Compound described in JP-A 11-152253

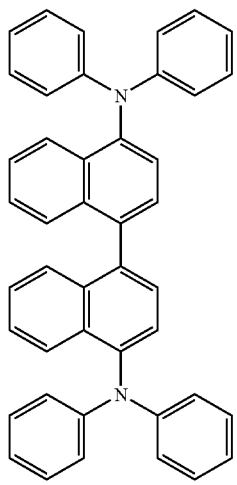

QA-5

Compound described in 11-152253

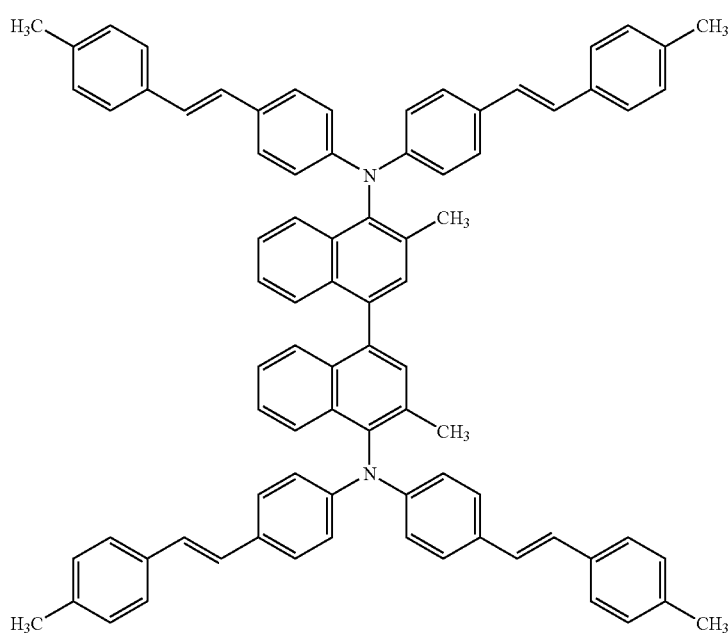

QA-6

Compound described in JP-A 11-152253

TABLE 3

| Sample No. | Positive hole transport material of 1st layer | Luminance of emitted light (relative value) | Color of emitted light | Half-life time of luminance (relative value) | Note |
|---|---|---|---|---|---|
| 9200 | NPB | 124 | Blue | 77 | Comp. |
| 9201 | QA-1 | 100 | Blue | 100 | Comp. |
| 9202 | QA-2 | 103 | Blue | 112 | Comp. |
| 9203 | QA-3 | 97 | Blue | 87 | Comp. |
| 9204 | QA-4 | 95 | Blue | 110 | Comp. |
| 9205 | QA-5 | 90 | Blue | 103 | Comp. |
| 9206 | QA-6 | 87 | Blue | 108 | Comp. |
| 9207 | A-3 | 185 | Blue | 217 | Inv. |
| 9208 | A-5 | 181 | Blue | 256 | Inv. |
| 9209 | A-13 | 216 | Blue | 188 | Inv. |
| 9210 | A-6 | 190 | Blue | 201 | Inv. |
| 9211 | A-18 | 211 | Blue | 175 | Inv. |
| 9212 | A-19 | 237 | Blue | 211 | Inv. |
| 9213 | F-1 | 222 | Blue | 215 | Inv. |
| 9214 | F-12 | 210 | Blue | 201 | Inv. |

As shown in Table 3, Samples Nos. 9207 to 9214 in each of which the triarylamine compounds according to the invention were used as the positive hole transport material are all have a high luminescent luminance and a long life time.

For example, it is found that the sample using compound A-3 according to the invention having three bonding axes shows two times higher in the luminance and two or more times longer in the life time compared with Sample No. 9201 using N,N,N-tri-p-terphenylamine.

Moreover, it is found that Sample No. 9209 using compound A-13 according to the invention which has three triamine moieties and three $C_2$ symmetry axes in the molecule thereof has a higher luminance and a longer life time compared with Samples Nos. 9202 and 9203 in which compounds QA-2 and QA-3 are used, respectively.

Similarly, the electroluminescent elements using compounds A-6, A-18, A-19 and F-1 according to the invention in the positive hole transport layer are each have both of a higher luminance and a longer light emission life time compared with comparative compounds QA-1 and QA-6 which are benzidine (naphthidine) derivative.

In another word, it is found that the electroluminescent elements in which the triarylamine compound of the invention having biaryl group containing two or more atrop bonding axes are used as the positive hole transport material, generally show a higher positive hole transport ability and a longer life time compared with the compound having no or only one biaryl group containing the atrop bonding axis.

Example 9-3

Comparison of Characteristics of Triarylamine Compounds as the Positive Hole Transport-light Emission Material Organic EL Nos. 9300 to 9312 having the first layer (positive hole transportation-light emission layer) and the third layer (electron transportation layer), as shown below were prepared in the same manner as in the electroluminescent elements in Examples 9-1 and 9-2 except that the second layer was omitted. The cross section thereof is as follows.

|   | Cathode (Ag/Mg) |
| --- | --- |
| 3rd layer | Electron transport layer |
| 2nd layer | Positive hole transport/light emission layer |
| 1st layer | Anode (ITO) |
|   | Glass substrate |

The elements were each continuously lighted by applying a direct current of 15 V through the ITO electrode as the anode and the facing electrode composed of silver and magnesium as the cathode at 23° C. in a dried nitrogen gas atmosphere. The luminance ($cd/m^2$) at the start of light emission and the time for 50% reduction of the light were measured. The luminance of emitted light was described in a relative value when that of Sample 9301 was set at 100, and the time for 50% reduction of luminance was described by a relative value when the 50% reduction time of Sample No. 9301 was set at 100. Results of the evaluation are shown in Table 4.

TABLE 4

| Sample No. | Positive hole transport/ light emission material in 1st layer | Luminance of emitted light (relative value) | Color of emitted light | Half-life time of luminance (relative value) | Note |
| --- | --- | --- | --- | --- | --- |
| 9300 | NPB | 63 | Blue | 82 | Comp. |
| 9301 | QA-1 | 100 | Blue | 100 | Comp. |
| 9302 | QA-2 | 15 | Blue | 95 | Comp. |
| 9303 | QA-3 | 56 | Blue | 82 | Comp. |
| 9304 | QA-4 | 89 | Blue | 108 | Comp. |
| 9305 | QA-5 | 72 | Blue | 93 | Comp. |
| 9306 | QA-6 | 211 | Blue | 90 | Comp. |
| 9307 | A-3 | 312 | Blue | 191 | Inv. |
| 9308 | A-5 | 256 | Blue | 209 | Inv. |
| 9309 | A-13 | 271 | Blue | 181 | Inv. |
| 9310 | A-6 | 288 | Blue | 200 | Inv. |
| 9311 | A-18 | 270 | Blue | 182 | Inv. |
| 9312 | A-19 | 279 | Blue | 218 | Inv. |
| 9313 | F-1 | 277 | Blue | 210 | Inv. |
| 9314 | F-12 | 245 | Blue | 232 | Inv. |

As is shown in Table 4, it is understood that the comparative triarylamine compounds, NPB and QA-1 to QA-7, are all usable as the positive hole transport material and light emission material. However, all the elements using them have a low luminance and a short life time.

Contrary, both of a high luminance and a long life time can be obtained by the electroluminescent elements using the compound having two or more biaryl group containing the antrope bonding axis according to the invention.

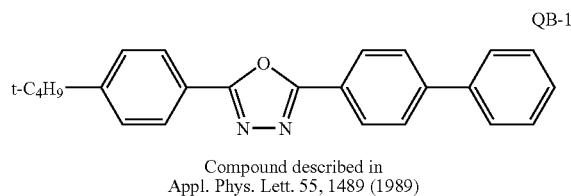

Compound described in
Appl. Phys. Lett. 55, 1489 (1989)

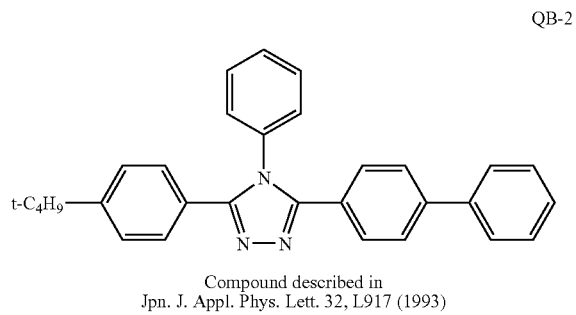

Compound described in
Jpn. J. Appl. Phys. Lett. 32, L917 (1993)

-continued

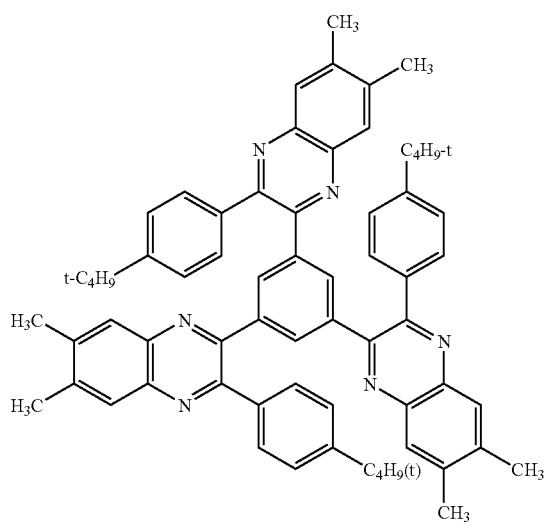

Compound described in
Maclomolecules 31, 6434 (1989)

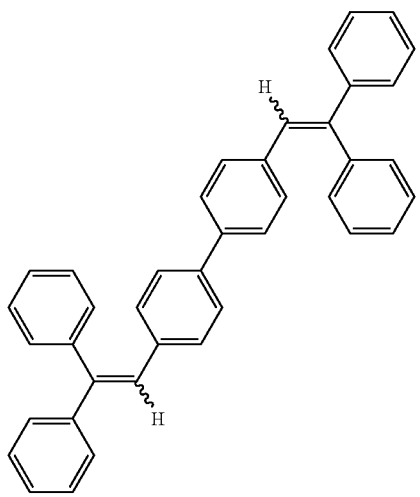

Compound described in
Appl. Phys. Lett. 67, 3853 (1995)

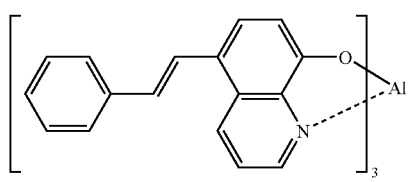

Compound described in JP-A 9-255686

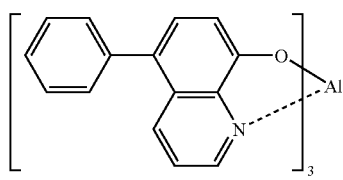

Compound described in JP-A 10-261489

Example 9-4

Comparison of Characteristics of 5-Member Heterocyclic Compound as the Electron Transportation Material Electroluminescent elements Nos. 9401 to 9411 were prepared in the same manner as in electroluminescent element CF-1 except that the electron transportation material in the third layer OXD-7 was only replaced by the compounds shown in Table 5.

The elements were each continuously lighted by applying a direct current of 15 V through the ITO electrode as the anode and the facing electrode composed of silver and magnesium as the cathode at 23° C. in a dried nitrogen gas atmosphere. The luminance ($cd/m^2$) at the start of light emission and the time for 0.50% reduction of the light were measured. The luminance of light was described in a relative value when that of Sample 9401 was set at 100, and the time for 50% reduction of luminance was described by a relative value when the 50% reduction time of Sample No. 9401 was set at 100. Results of the experiments are shown in Table 5.

TABLE 5

| Sample No. | Electron Transport material of 3rd layer | Luminance of emitted light (relative value) | Color of emitted light | Half-life time of luminance (relative value) | Note |
|---|---|---|---|---|---|
| 9200 | OXD-7 | 121 | Blue | 128 | Comp. (CF-1) |
| 9401 | QB-1 | 100 | Blue | 100 | Comp. |
| 9402 | QB-2 | 103 | Blue | 131 | Comp. |
| 9403 | B-3 | 144 | Blue | 417 | Inv. |
| 9404 | B-1 | 133 | Blue | 325 | Inv. |
| 9405 | B-7 | 149 | Blue | 401 | Inv. |
| 9406 | B-9 | 153 | Blue | 377 | Inv. |
| 9407 | B-2 | 134 | Blue | 445 | Inv. |
| 9408 | B-8 | 149 | Blue | 468 | Inv. |
| 9409 | B-6 | 138 | Blue | 481 | Inv. |
| 9410 | B-10 | 144 | Blue | 381 | Inv. |
| 9411 | F-3 | 133 | Blue | 447 | Inv. |

As shown in Table 5, it is found that the luminance is raised in Sample Nos. 9403 to 9411 in each of which the 5-member heterocyclic compounds were used as the electors transportation material of the electroluminescent element compared with Sample Nos. 9200, 9401 and 9402 in which the usual electron transportation material. Moreover, the life time of the elements is considerably improved. Such the effect are sufficiently realized by the 5-member heterocyclic compounds B-1, B-3, B-7, B-9 and B-10 according to the invention each having one biaryl group containing an atrop bonding axis. However, it is observed that such the effects are further enhanced when the 5-member heterocyclic compounds B-2, B-8, B-6 and F-3 according to the invention, which have a biaryl group containing two atrop bonding axes.

Example 9-5

Comparison of Characteristics of 5-member Heterocyclic Compound as the Electron Transportation-light Emission Material Organic EL Nos. 9500 to 9511 having the first layer (positive hole transportation layer) and the third layer (electron transportation-light emission layer),as shown below were prepared in the same manner as in the electroluminescent elements in Example 9-4 except that the second layer was omitted.

|  | Cathode (Ag/Mg) |
| --- | --- |
| 3rd layer | Electron transportation-light emission layer |
| 2nd layer | Positive hole transportation layer |
| 1st layer | Anode (ITO) |
|  | Glass substrate |

The elements were each continuously lighted by applying a direct current of 15 V through the ITO electrode as the anode and the facing electrode composed of silver and magnesium as the cathode at 23° C. in a dried nitrogen gas atmosphere. The luminance (cd/m$^2$) at the start of light emission and the time for 50% reduction of the light were measured. The luminance of light was described in a relative value when that of Sample 9501 was set at 100, and the time for 50% reduction of luminance was described by a relative value when the 50% reduction time of Sample No. 9501 was set at 100. Results of the experiments are shown in Table 6.

TABLE 6

| Sample No. | Electron Transport/ light emission material of 3rd layer | Luminance of emitted light (relative value) | Color of emitted light | Half-life time of luminance (relative value) | Note |
| --- | --- | --- | --- | --- | --- |
| 9500 | OXD-7 | 135 | Blue | 122 | Comp. |
| 9501 | QB-1 | 100 | Blue | 100 | Comp. |
| 9502 | QB-2 | 142 | Blue | 128 | Comp. |
| 9503 | B-3 | 312 | Blue | 388 | Inv. |
| 9504 | B-1 | 252 | Blue | 376 | Inv. |
| 9505 | B-7 | 388 | Blue | 321 | Inv. |
| 9506 | B-9 | 400 | Blue | 381 | Inv. |
| 9507 | B-2 | 501 | Blue | 401 | Inv. |
| 9508 | B-8 | 522 | Blue | 443 | Inv. |
| 9509 | B-6 | 477 | Blue | 450 | Inv. |
| 9510 | B-10 | 344 | Blue | 312 | Inv. |
| 9511 | F-3 | 479 | Blue | 405 | Inv. |

As is shown in Table 6, it is found that the luminance is considerably raised Sample Nos. 9503 to 9511 in each of which the 5-member heterocyclic compounds according to the invention are used as the electron transportation-light emission material of the electroluminescent elements compared with Sample Nos. 9500, 9501 and 9502 in which the usual electron transportation material. Moreover, the life time of the elements is considerably improved. Such the effects, particularly on the life time of the element are sufficiently realized by the 5-member heterocyclic compounds B-1, B-3, B-7, B-9 and B-10 according to the invention each having one biaryl group containing an atrop bonding axis. However, it is observed that such the effects are further enhanced when the 5-member heterocyclic compounds B-2, B-8, B-6 and F-3 according to the invention, which have a biaryl group containing two atrop bonding axes.

Example 9-8

Example of Another Use of 6-Member Heterocyclic Compounds

It was found that a high luminance and a long life time can be attained when compound C-9 according to the invention was used as a fluorescent dopant together with a light emission substance such as Alq$_3$ compared with usually used quinacridone or N,N'-dimethylquinacridone.

It was found that compound C-6 according to the invention was usable as a yellow green light emission substance.

Example 9-9

Comparison of Characteristics of Stilbene Compounds as the Light Emission Substance Electroluminescent elements Nos. 9901 to 9908 were prepared in the same manner as in electroluminescent element CF-1 prepared in Example 9-1 except that the light emission substance Zn(BOX) in the second layer was only replaced by the compounds shown in Table 9.

The elements were each continuously lighted by applying a direct current of 15 V through the ITO electrode as the anode and the facing electrode composed of silver and magnesium as the cathode at 23° C. in a dried nitrogen gas atmosphere. The luminance (cd/m$^2$) at the start of light emission and the time for 50% reduction of the light were measured. The luminance of light was described in a relative value when that of Sample 9901 was set at 100, and the time for 50% reduction of luminance was described by a relative value when the 50% reduction time of Sample No. 9901 was set at 100. Results of the experiments are shown in Table 9.

TABLE 9

| Sample No. | Light emission material in 2nd layer | Luminance of emitted light (relative value) | Color of emitted light | Half-life time of luminance (relative value) | Note |
| --- | --- | --- | --- | --- | --- |
| 9901 | QD-1 | 100 | Blue | 100 | Comp. |
| 9902 | D-1 | 122 | Blue | 140 | Inv. |
| 9903 | D-5 | 125 | Blue | 134 | Inv. |
| 9904 | D-8 | 131 | Blue | 142 | Inv. |
| 9905 | D-12 | 140 | Blue | 125 | Inv. |
| 9906 | D-11 | 158 | Blue | 155 | Inv. |
| 9907 | D-2 | 205 | Blue | 212 | Inv. |
| 9908 | D-4 | 212 | Blue | 209 | Inv. |

As is shown in Table 9, it is observed that the luminance is considerably raised in each of Sample Nos. 9902 to 9908 in each of which the 5-member stilbene compound according to the invention is used as the electron transportation and light emission material of the electroluminescent element compared with Sample 9701 using the usual electron transportation material. Moreover is understood that the emission life time of the element of the invention is considerably improved. Such the effects are sufficiently realized by the stilbene compounds D-1, D-5, D- and 8, D-11 and D-12 according to the invention each having one biaryl group containing an atrop bonding axis. However, it is observed that such the effects are further enhanced when the stilbene compounds D-2 and D-4 according to the invention, which have a biaryl group containing two atrop bonding axes.

Example 9-10

Comparison of Characteristics of Metal Complex Compounds as the Electron Transportation-light Emission Material Electroluminescent elements Nos. 91001 to 91008 having the positive hole transportation layer or the first layer and the electron transport-light emission layer or the second layer were prepared in the same manner as in electroluminescent element CF-1 except that the light emission substance Zn(BOX)$_2$ was replaced by the compound shown in Table 10 and the electron transportation layer or the third layer was removed.

The elements were each continuously lighted by applying a direct current of 15 V through the ITO electrode as the anode and the facing electrode composed of silver and magnesium as the cathode at 23° C. in a dried nitrogen gas atmosphere. The luminance (cd/m$^2$) at the start of light emission and the time for 50% reduction of the light were measured. The luminance of light was described in a relative value when that of Sample 91001 was set at 100, and the time for 50% reduction of luminance was described by a relative value when the 50% reduction time of Sample No. 91001 was set at 100. Results of the experiments are shown in Table 10.

TABLE 10

| Sample No. | Electron transport/ light emission material in 2nd layer | Luminescent efficiency (relative value) | Color of emitted light | Half-life time of luminance (relative value) | Note |
| --- | --- | --- | --- | --- | --- |
| 91001 | QE-1 | 100 | Orange | 100 | Comp. |
| 91002 | QE-2 | 140 | Yellow | 140 | Comp. |
| 91003 | E-1 | 312 | Yellow-green | 134 | Inv. |
| 91004 | E-6 | 421 | Yellow-green | 142 | Inv. |
| 91005 | E-7 | 235 | yellow | 125 | Inv. |
| 91006 | E-10 | 329 | Yellow-green | 155 | Inv. |
| 91007 | E-11 | 544 | Green | 212 | Inv. |
| 91008 | F-5 | 551 | Yellow-green | 209 | Inv. |

As is shown in Table 10, it is observed that the luminescent efficiency is considerably raised in each of Sample Nos. 91003 to 91007 in each of which the metal complex compound according to the invention is used as the electron transportation-light emission material of the electroluminescent element compared with Samples 91001 and 91002 each using the usual material. Moreover is understood that the emission life time of the element of the invention is considerably improved. Such the effects are sufficiently realized by the stilbene compounds D-1, D-5, D-8, D-11 and D-12 according to the invention each having one biaryl group containing an atrop bonding axis. However it is observed

Example 9-11

It was shown in high performance liquid chromatography (HPLC) that material C-2 was comprised of plural components differing in retention time. Of these components, relatively easily separable two peak components were prepared and denoted as MC-1 and MC-2. The thus prepared components were not to be enantiomers in light of the fact that the HPLC was non-optically-active column (ODS). Further, the components MC-1 and MC-2 each were subjected to mass spectrometry and exhibiting an identical molecular ion peak and an identical fraction pattern. In view of the foregoing, it was proved that these two peak components corresponded to diastereomers (diastereoisomers). Thus, compound C-2 was proved to be a mixture of diastereomers.

A pattern was formed on a substrate composed of a 150 nm thick ITO layer on a glass plate. NA-45 manufactured by NH Technoglass Co. Ltd.) to prepare an anode. Thus prepared transparent substrate having the transparent ITO electrode was subjected to ultrasonic washing by isopropyl alcohol, and dried by dried nitrogen gas. Then the substrate was cleaned for 5 minutes by UV and ozone. Thus obtained transparent substrate was fixed on a substrate holder of a commercially available vacuum evaporation apparatus. Then, the electroluminescence material of the invention C-2 (mixture of diastereomers), copper phthalocyanine and Alq3 were each placed in different tantalum resistive heating boats, and the boats were set in the first evacuation vessel in the vacuum evaporation apparatus. Further, magnesium and silver were placed in a molybdenum resistive heating boat and a tungsten evaporation basket, respectively, and were set in the second evacuation vessel in the vacuum evaporation apparatus.

Subsequently, the first evacuation vessel was evacuated to 4×10-4 Pa. The heating boat having copper phthalocyanine was heated by applying an electric current to evaporate copper phthalocyanine on the transparent substrate having the transparent ITO electrode at an evaporation rate of from 0.1 to 0.3 nm/sec. A 15 nm thick, positive hole injection layer was thus provided. Then, the heating boat having material C-2 was heated by applying an electric current to evaporate material C-2 onto the positive hole injection layer at an evaporation rate of from 0.1 to 0.3 nm/sec to form a 50 nm thick light emission layer. Furthermore, the heating boat having Alq3 was heated by applying an electric current to evaporate Alq3 onto the light emission layer at an evaporation rate of from 0.1 to 0.3 nm/sec to form a 20 nm thick electron injection layer.

Subsequently, an element having formed the electron injection layer was moved to the second evaporation vessel with maintaining evacuation. Then, a perforated rectangular stainless steel mask was set onto the electron injection layer by remote control.

The second evacuation vessel was evacuated to 3×10$^{-4}$ Pa and the boat having magnesium was heated by applying an electric current to evaporate magnesium. Concurrently, the basket having silver was heated so that the silver was evaporated at a rate of 0.1 nm/sec to prepare a counter electrode composed of a mixture of magnesium and silver. Further, a second perforated stainless steel mask was set by remote control and silver was evaporated thereto to form an extension line (conductive line) in contact with the counter electrode. An organic electroluminescence element was prepared.

The organic electroluminescence element was moved, without being in contact with the atmosphere, to a glove box (substituted by highly pure nitrogen gas exhibiting a purity of 99.999%), and a glass sealing can was adhered to the electroluminescence element were adhered to be sealed. A UV curable adhesive was used to perform adhesion of the glass sealing can to the organic electroluminescence element. Thus, exposure to a UV lamp allowed both to be adhered to prepare a sealed organic electroluminescence element, OLED-1.

Organic electroluminescence element OLED-2 for comparison was prepared similarly to the foregoing OLED-1, except that material C-2 was replaced by MC-1.

Organic electroluminescence element OLED-3 for comparison was prepared similarly to the foregoing OLED-1, except that material C-2 was replaced by MC-2.

The thus prepared electroluminescence elements OLED-1, OLED-2 and OLED-3 were aged at 60° C. and 20% RH for 14 days. Thereafter, each of them was allowed to emit by applying a direct current of 10 V through an ITO electrode as an anode and an counter electrode composed of magnesium and silver as a cathode. Results are shown in Table 11. Luminance was represented by a relative value, based on the luminance of OLED-2 being 100.

TABLE 11

| Element No. | Material of Emission Layer | Luminance |
|---|---|---|
| OLED-1 | C-2 | 213 |
| OLED-2 | MC-1 | 100 |
| OLED-3 | MC-2 | 98 |

As can be seen from Table 11, it was proved that the organic electroluminescence element OLED-1 using electroluminescence material C-2 which was a mixture comprised of two diastereomers exhibited enhanced emission and superior storage stability under high temperature and high humidity, compared to electroluminescence elements OLED-2 and OLED-3 using electroluminescence material MC-1 and MC-2, respectively, which were each a single diastereomers.

Such results are assumed to be due to the fact that material C-1 is a mixture of diastereoisomers and since these isomers are close in physical properties, crystallization in the layer of the element was considerably inhibited, resulting in enhanced emission and superior storage stability.

Exemplary Synthesis Method of the Compound According to the Invention 2-arylphenylpridine derivative represented by Formula N1 can be synthesized by the method described in Shuichi Oi, Susumu Fukita and Yoshio Inoue, Chem. Comumn., 1998, 1439-2440.

Various compounds each having a binaphthyl group according to the invention can be typically synthesized by the course shown in Scheme 2 to Scheme 5.

Synthesizing triarylamine A-18 according to the invention by the course of Scheme 4 is shown below as an example of synthesis.

Scheme 1

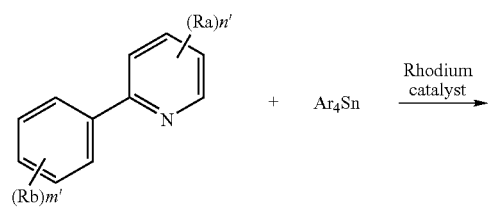

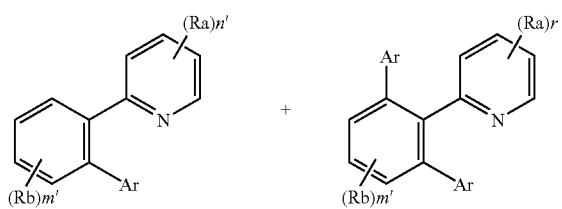

Scheme 2

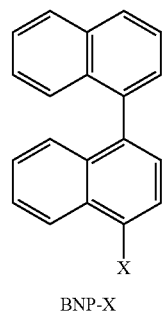

BNP-X

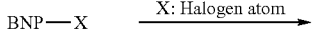

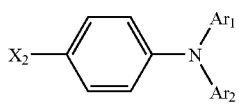

Scheme 3

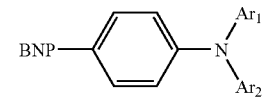

Scheme 4

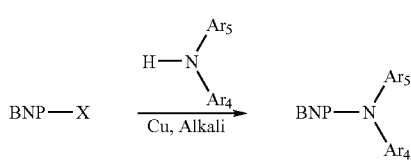

Scheme 5

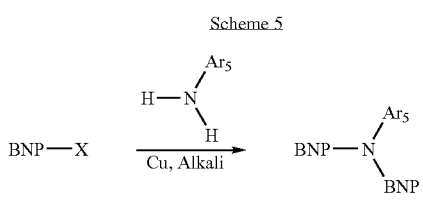

Synthesis Example 1

Synthesis of 4-bromo-1,1'-binaphthyl (compound XX)

In a 2000 ml flask having four mouths, 50 g (197 mmoles) was dissolved in 600 ml of methylene chloride. In an ice bath, a solution of 3.4 ml of bromine (65.6 moles, ⅓ equivalents) diluted 10 times with methylene chloride was dropped to the solution. After addition of the bromine solution, ⅓ equivalents of bromine solution was respectively further added in two times while sampling the solution to confirm the reaction rate by a high speed liquid chromatography. The solution was stirred for a whole day and night and then the solvent was removed by distillation under a reduced pressure. The raw product thus obtained was recrystallized using acetonitrile and subjected to 2 times of suspension washing. Thus 43.9 g (67.0%) of 4-bromo-1,1'-binaphthyl was obtained.

Synthesis Example 2

In a 500 ml flask having three mouths, 10 g (30.0 mmole) of 4-bromo-1,1'-binaphthyl, 5.05 g (15.0 mmoles) of N,N'-diphenylbenzene, 0.48 g (7.50 mmoles) of copper powder, 4.73 g (34.2 mmoles) of potassium carbonate and 25 ml of nitrobenzene were put and stirred at 200° C. for 30 hours. After the reaction, the solution was filtered to remove inorganic substances. The filterate was washed by water and dried by magnesium sulfate. The solvent was removed by distillation from the dried solution. Then the product was purified and separated by a silica gel chromatography using a toluene-hexane mixture solvent. Thus 5.40 g (65.0 mmoles, 43%) was obtained.

Effect of the Invention

The first effect of the invention is to obtain a color conversion filter using a fine particle of inorganic fluorescent substance or a rare-earth metal complex coordinated with an organic ligand according to the invention. The second effect of the invention is to confirm that the wavelength of light can be converted into visible wavelength by the use of a combination of a color conversion filter according to the invention and a known near-ultraviolet light emission organic electroluminescent element. The third effect of the invention is to confirm that suitable light is emitted by a combination of a color conversion filter of the invention and an organic electroluminescent element using a compound of the invention and that the light emission from such the combination has a long life time. The fourth effect of the invention is to confirm that both of a high luminance and a long life time by the organic electroluminescent element using a compound of the invention having a biaryl group in which a bonding axis capable of giving an internal rotation isomerism.

What is claimed is:

1. An electroluminescent material represented by the following Formula C1:

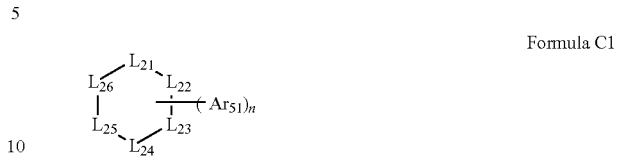

Formula C1 wherein $Ar_{51}$ is an aryl group or an aromatic heterocyclic group; n is an integer of from 0 to 6; $L_{21}, L_{22}, L_{23}, L_{24}, L_{25}$ and $L_{26}$ are an atom or a group of atoms necessary to form a 6-membered nitrogen-containing aromatic heterocyclic group, provided that at least one of $L_{21}, L_{22}, L_{23}, L_{24}, L_{25}$ and $L_{26}$ is =N— or —N($R_{51}$)—; $R_{51}$ is a hydrogen atom or a substituent, provided that adjacent substituent groups existing in the molecule represented by formula C1 may be condensed with each other to form a ring and $Ar_{51}$ may be attached directly to the 6-membered nitrogen-containing ring or may be indirectly attached via one or more substituents on the 6-membered ring; wherein the electroluminescence material is a mixture comprising at least two diastereomers represented by Formula C1, provided that in Formula C1, at least two of $Ar_{51}$ and $R_{51}$ are a biaryl group having a bond capable of giving an internal rotational isomerism or a group comprising the biaryl group.

2. An electroluminescent element comprising an electroluminescent material and an inorganic fluorescent substance capable of emitting light having a wavelength of a maximum emission different from that of light emitted from the electroluminescent material upon absorption of the light emitted from the electroluminescent material, and the electroluminescent material is a compound represented by the following Formula C1:

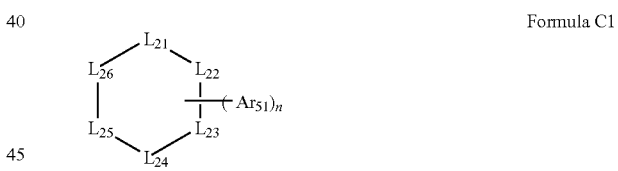

Formula C1 wherein $Ar_{51}$ is an aryl group or an aromatic heterocyclic group; n is an integer of from 0 to 6; $L_{21}, L_{22}, L_{23}, L_{24} L_{25}$ and $L_{26}$ are an atom or a group of atoms necessary to form a 6-membered nitrogen-containing aromatic heterocyclic group, provided that at least one of $L_{21}, L_{22}, L_n, L_{24}, L_{25}$ and $L_{26}$ is =N— or —N($R_{51}$)—; $R_{51}$ is a hydrogen atom or a substituent, provided that adjacent substituent groups existing in the molecule represented by formula $C_1$ may be condensed with each other to form a ring and $Ar_{51}$ may be attached directly to the 6-membered nitrogen-containing ring or may be indirectly attached via one or more substituents on the 6-membered ring; and wherein the electroluminescence material is a mixture comprising at least two diastereomers represented by Formula C1, provided that in Formula C1, at least two of $Ar_{51}$ and $R_{51}$ are a biaryl group having a bond capable of giving an internal rotational isomerism or a group comprising the biaryl group.

3. The electroluminescent element of claim 2, wherein said inorganic fluorescent substance is an inorganic fluorescent substance prepared by a Sol-Gel method.

4. The electroluminescent element of claim 2, wherein the wavelength of a maximum emission of the light emitted from said inorganic fluorescent substance is within a range of from 400 nm to 700 nm.

5. The electroluminescent element of claim 2, wherein the wavelength of a maximum emission of the light emitted from said inorganic fluorescent substance is within a range of from 600 nm to 700 nm.

6. The electroluminescent element of claim 2, wherein the wavelength of a maximum emission of the light emitted from the electroluminescent material is not more than 430 nm.

7. The electroluminescent element of claim 2, wherein the wavelength of a maximum emission of light emitted from the electroluminescent material is within a range of from 400 to 430 nm.

8. An electroluminescent element which comprises an electroluminescent material and a rare earth metal complex capable of emitting light having a wavelength of maximum emission different from that of light emitted from the electroluminescent material upon absorption of the light emitted from the electroluminescent material and the electroluminescent material is a compound represented by the following Formula C1:

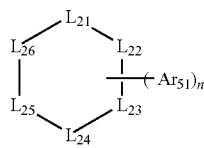

Formula C1 wherein $Ar_{51}$ is an aryl group or an aromatic heterocyclic group; n is an integer of from 0 to 6; $L_{21}, L_{22}, L_{23}, L_{24}, L_{25}$ and $L_{26}$ are an atom or a group of atoms necessary to form a 6-membered nitrogen-containing aromatic heterocyclic group, provided that at least one of $L_{21}, L_{22}, L_{23}, L_{24}, L_{25}$ and $L_{26}$ is =N— or —N($R_{51}$)—; $R_{51}$ is a hydrogen atom or a substituent, provided that adjacent substituent groups existing in the molecule represented by formula C1 may be condensed with each other to form a ring and $Ar_{51}$ may be attached directly to the 6-membered nitrogen-containing ring or may be indirectly attached via one or more substituents on the 6-membered ring; and wherein the electroluminescence material is a mixture comprising at least two diastereomers represented by Formula C1, provided that in Formula C1, at least two of $Ar_{51}$ and $R_{51}$ are a biaryl group having a bond capable of giving an internal rotational isomerism or a group comprising the biaryl group.

9. The electroluminescent element of claim 8, wherein the wavelength of a maximum emission of the light emitted from the rare earth metal complex is within a range of from 400 nm to 700 nm.

10. The electroluminescent element of claim 8, wherein the wavelength of a maximum emission of the light emitted from the rare earth metal complex is within a range of from 600 nm to 700 nm.

11. The electroluminescent element of claim 8, wherein the wavelength of a maximum emission of the light emitted from the electroluminescent material is not more than 430 nm.

12. The electroluminescent element of claim 8, wherein the wavelength of a maximum emission of light emitted from the electroluminescent material is within a range of from 400 nm to 430 nm.

13. An electroluminescent element comprising an anode and a cathode and a compound represented by the following Formula C1:

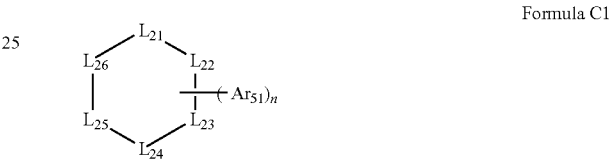

Formula C1 wherein $Ar_{51}$ is an aryl group or an aromatic heterocyclic group; n is an integer of from 0 to 6; $L_{21}, L_{22}, L_{23}, L_{24}, L_{25}$ and $L_{26}$ are an atom or a group of atoms necessary to form a 6-membered nitrogen-containing aromatic heterocyclic group, provided that at least one of $L_{21}, L_{22}, L_{23}, L_{24}, L_{25}$ and $L_{26}$ is =N— or —N($R_{51}$)—; $R_{51}$ is a hydrogen atom or a substituent, provided that adjacent substituent groups existing in the molecule represented by formula C1 may be condensed with each other to form a ring and $Ar_{51}$ may be attached directly to the 6-membered nitrogen-containing ring or may be indirectly attached via one or more substituents on the 6-membered ring; and wherein the electroluminescence material is a mixture comprising at least two diastereomers represented by Formula C1, provided that in Formula C1 at least two of $Ar_{51}$ and $R_{51}$ are a biaryl group having a bond capable of giving an internal rotational isomerism or a group comprising the biaryl group.

* * * * *